(12) United States Patent
Horiguchi et al.

(10) Patent No.: US 7,771,536 B2
(45) Date of Patent: Aug. 10, 2010

(54) SUBSTRATE PROCESSING APPARATUS

(75) Inventors: Takahiro Horiguchi, Kanagawa (JP); Ryo Kuwajima, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 230 days.

(21) Appl. No.: 10/529,191

(22) PCT Filed: Sep. 22, 2003

(86) PCT No.: PCT/JP03/12084

§ 371 (c)(1),
(2), (4) Date: Mar. 24, 2005

(87) PCT Pub. No.: WO2004/030064

PCT Pub. Date: Apr. 8, 2004

(65) Prior Publication Data
US 2006/0048710 A1 Mar. 9, 2006

(30) Foreign Application Priority Data
Sep. 24, 2002 (JP) ............................. 2002-278198

(51) Int. Cl.
*C23C 16/00* (2006.01)
*C23F 1/00* (2006.01)
*H01L 21/306* (2006.01)

(52) U.S. Cl. .................... 118/725; 118/715; 118/724; 156/345.51; 156/345.52; 156/345.53; 156/345.54; 156/345.55

(58) Field of Classification Search ................ 118/725, 118/715; 156/345.52
See application file for complete search history.

(56) References Cited

U.S. PATENT DOCUMENTS

| 5,164,012 A | * | 11/1992 | Hattori ..................... 118/725 |
| 5,462,603 A | * | 10/1995 | Murakami ................. 118/719 |
| 5,868,850 A | * | 2/1999 | Ichishima et al. .......... 118/725 |
| 5,884,009 A | * | 3/1999 | Okase ....................... 392/418 |

(Continued)

FOREIGN PATENT DOCUMENTS

JP 03-038029 * 2/1991

(Continued)

OTHER PUBLICATIONS

Z. H. Lu: "SiO2 film thickness metrology by x-ray photoelectron spectroscopy", Appl. Phys. Lett., vol. 71, No. 19, Nov. 10, 1997.

*Primary Examiner*—Parviz Hassanzadeh
*Assistant Examiner*—Rakesh Dhingra
(74) *Attorney, Agent, or Firm*—Oblon, Spivak, McClelland, Maier & Neustadt, L.L.P.

(57) ABSTRACT

The substrate processing apparatus according to the present invention is aimed to stably and efficiently perform a deposition process on a substrate W. The substrate processing apparatus supports the substrate W in a position facing a heater portion and thus rotates a holding member holding the substrate W. Furthermore, the heating portion houses a SiC heater and a heat reflecting member in an internal portion of a quartz bell jar made of transparent quartz, and depressurizes an internal space of a processing vessel and an internal space of the quartz bell jar at the same time; thereby allowing the thickness of the quartz bell jar to be thinner, and thus improving thermal conductivity of heat from the SiC heater and preventing contamination by the SiC heater.

14 Claims, 65 Drawing Sheets

U.S. PATENT DOCUMENTS

| | | | |
|---|---|---|---|
| 5,903,711 A | 5/1999 | Okase | |
| 5,904,872 A | 5/1999 | Arami et al. | |
| 6,113,984 A * | 9/2000 | MacLeish et al. | 427/255.32 |
| 6,315,833 B1 * | 11/2001 | Callaghan et al. | 118/729 |
| 6,331,697 B2 * | 12/2001 | Savas | 219/390 |
| 6,372,048 B1 * | 4/2002 | Futamura et al. | 118/729 |
| 6,902,623 B2 * | 6/2005 | Gurary et al. | 118/719 |
| 2001/0000098 A1 * | 4/2001 | Fayfield et al. | 156/345 |
| 2002/0011478 A1 * | 1/2002 | Ratliff et al. | 219/390 |

FOREIGN PATENT DOCUMENTS

| | | |
|---|---|---|
| JP | 3-77315 | 4/1991 |
| JP | 05-047687 | 2/1993 |
| JP | 09-30893 | 2/1997 |
| JP | 10-270436 | 10/1998 |

* cited by examiner

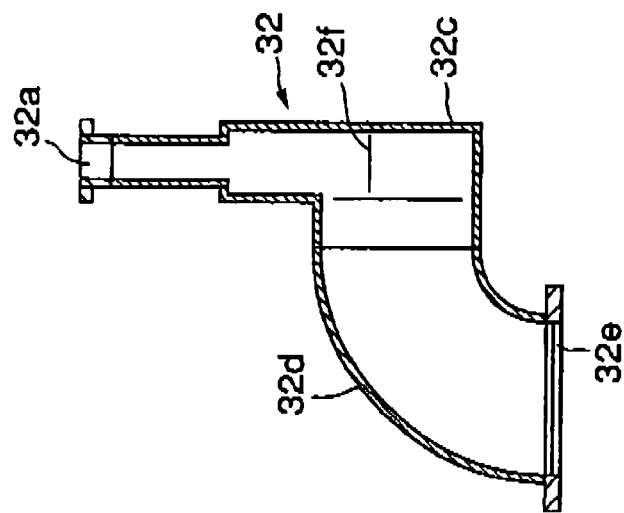
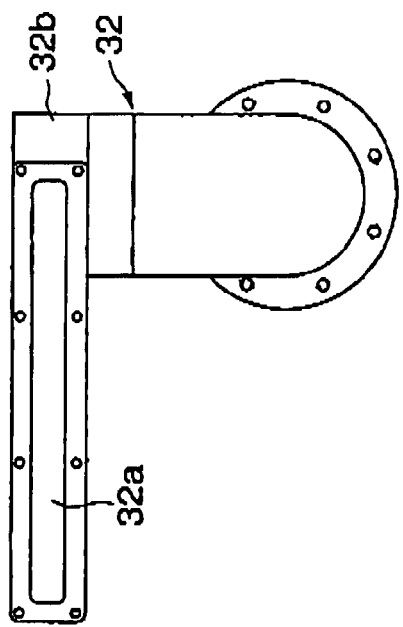
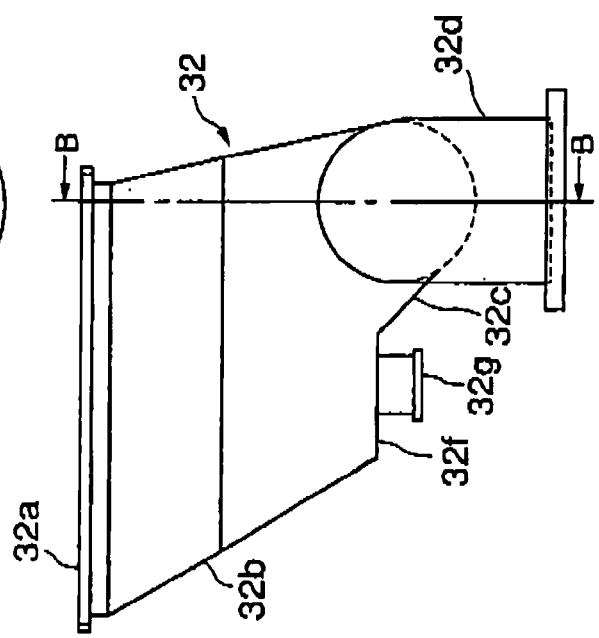

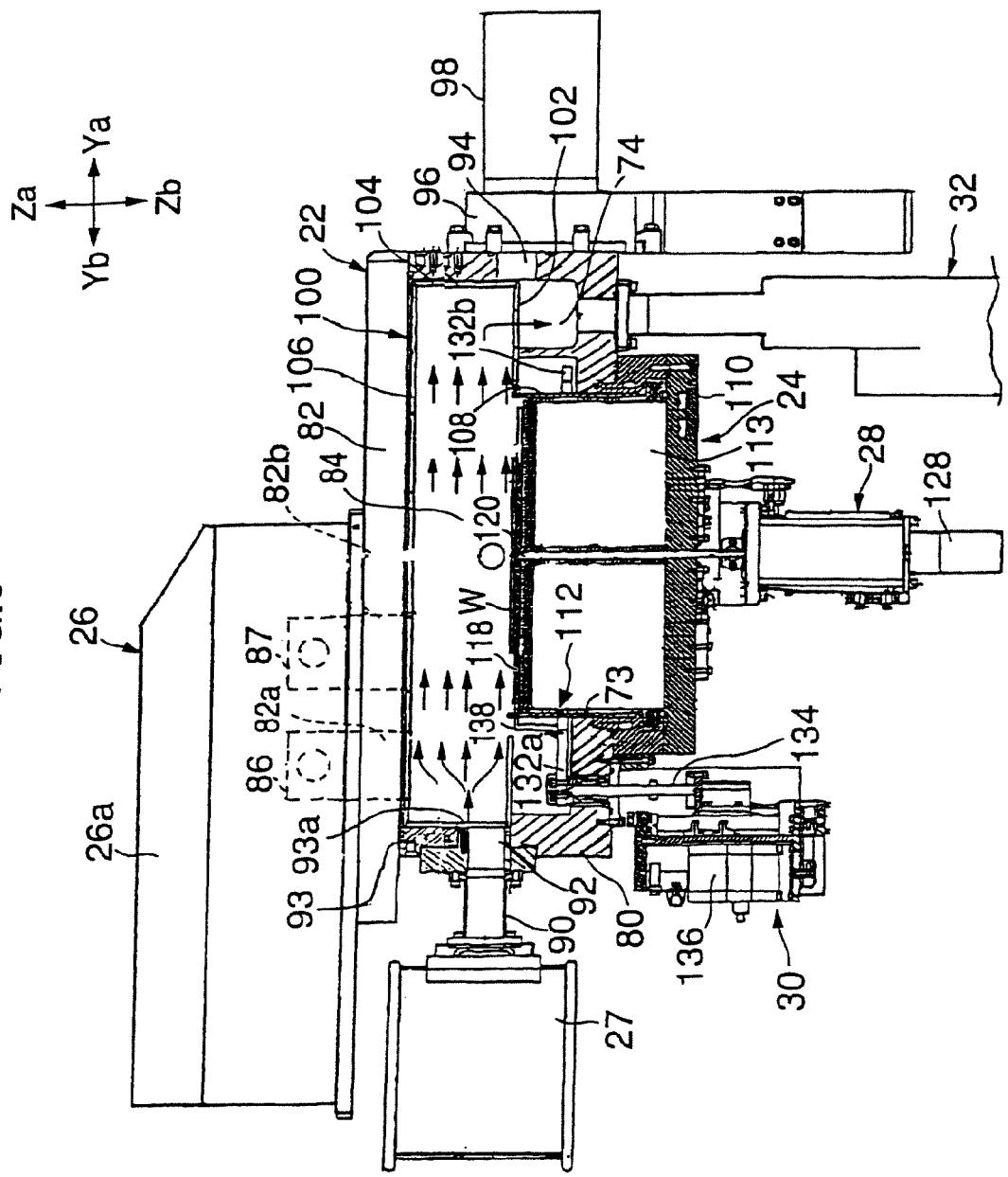

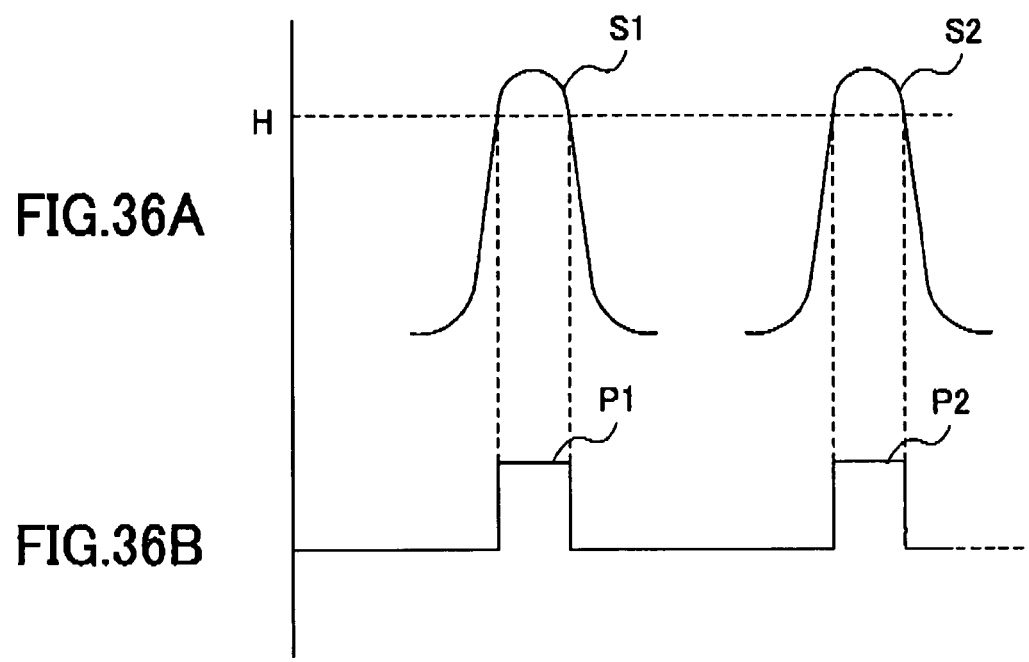

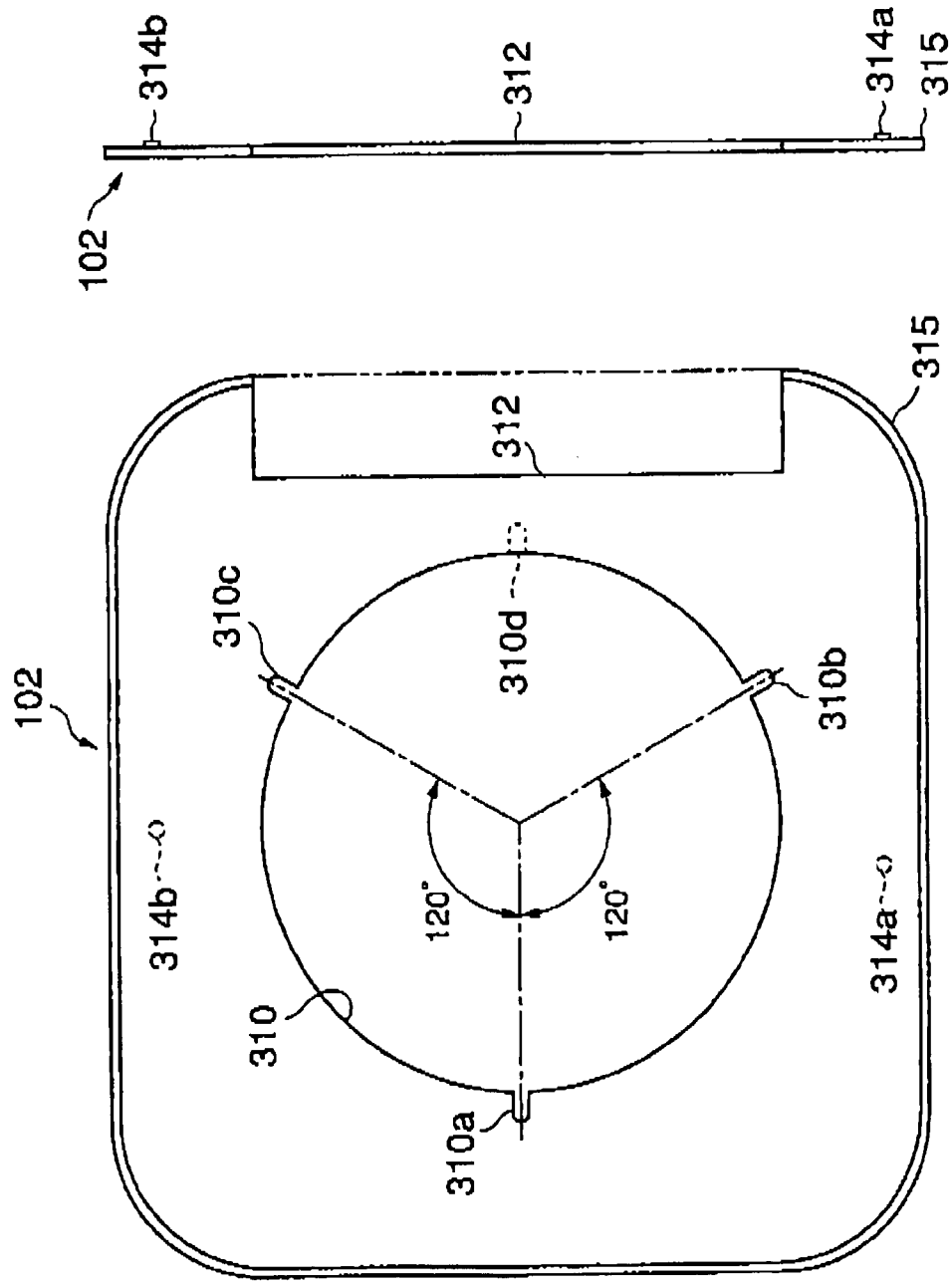

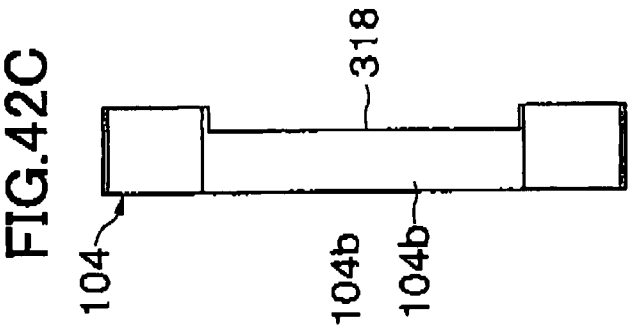
FIG.42C
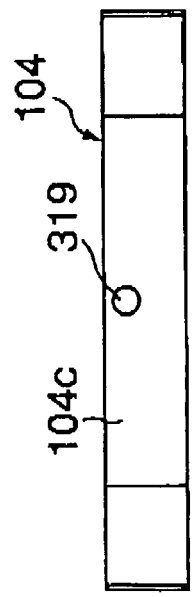
FIG.42D
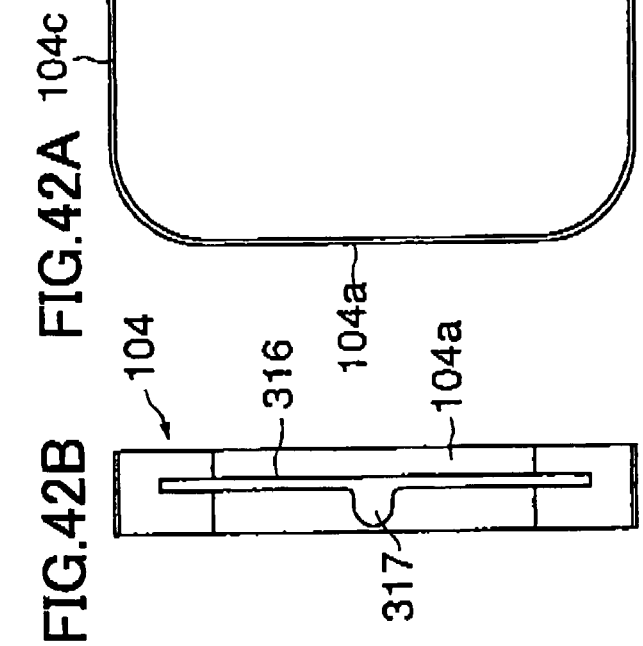
FIG.42A
FIG.42B
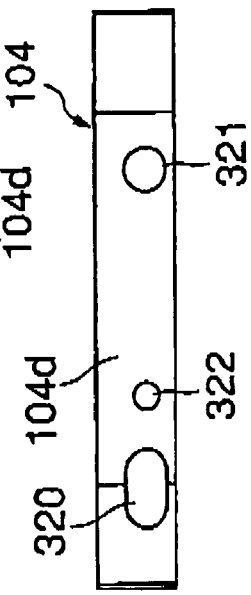
FIG.42E

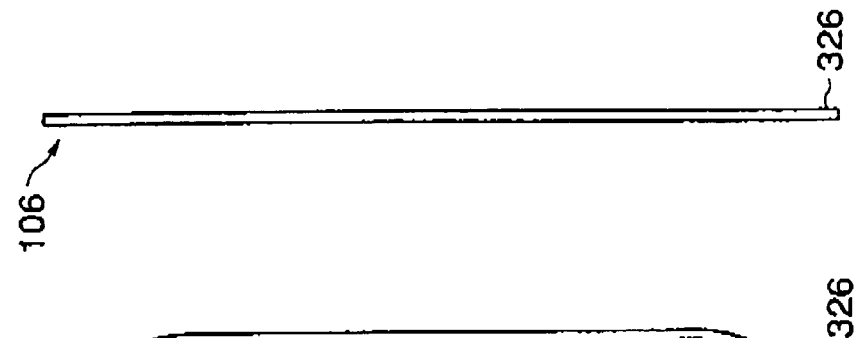
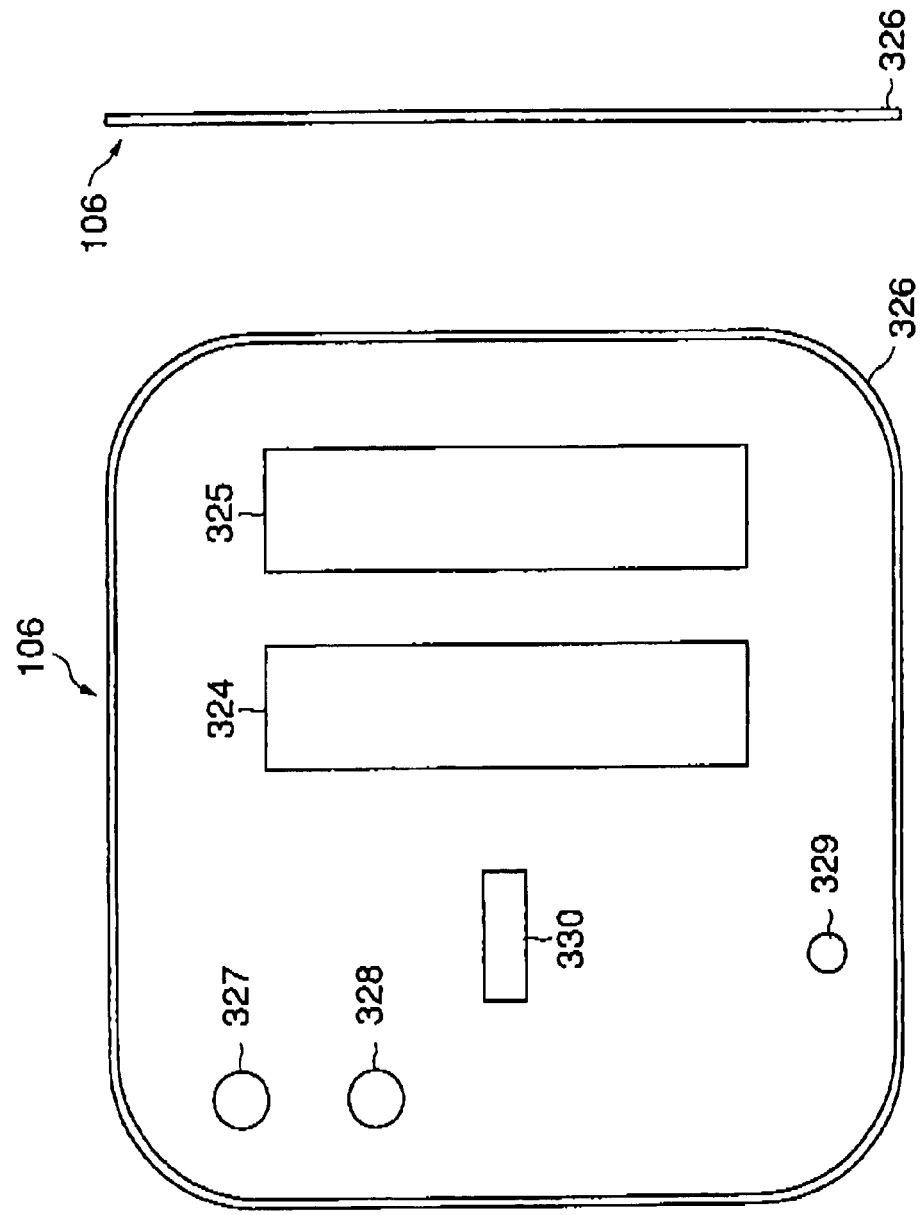

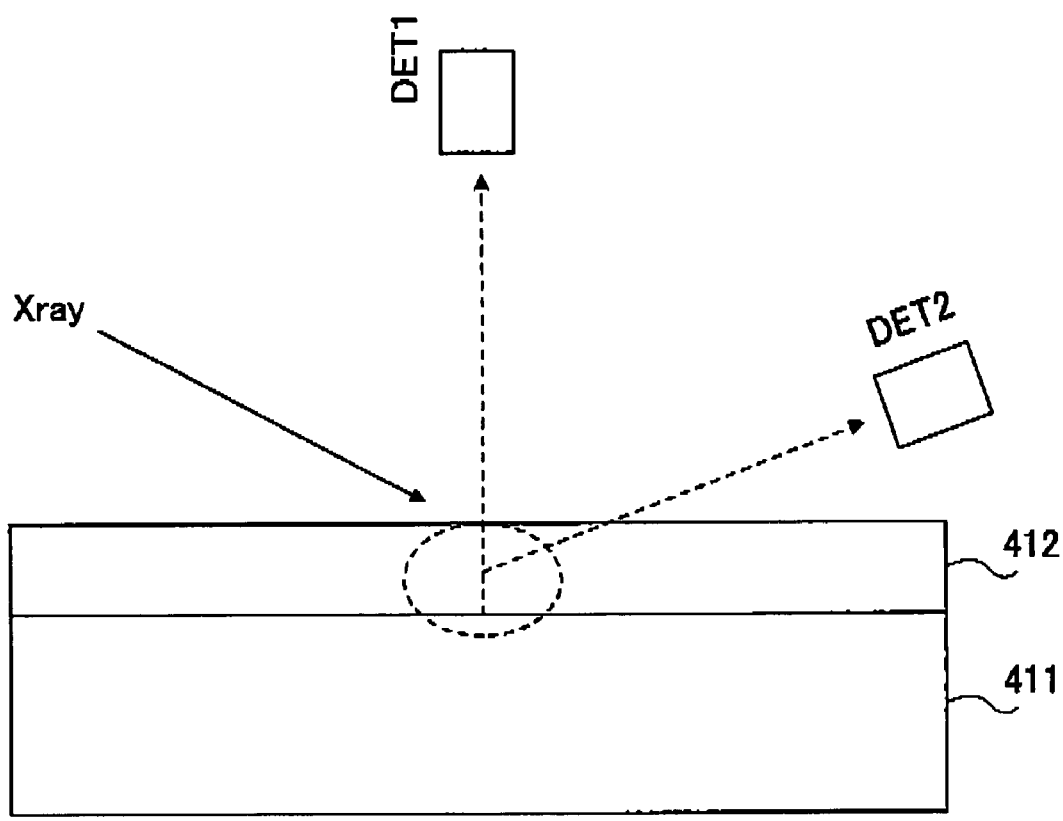

SUBSTRATE PROCESSING APPARATUS

TECHNICAL FIELD

The present invention relates to a substrate processing apparatus and more particularly to a substrate processing apparatus that conducts processes such as a film forming process on a substrate.

BACKGROUND ART

In the technology of recent advanced high-speed semiconductor devices, use of the gate length of 0.1 μm or less is becoming possible with the progress in the art of ultrafine semiconductor fabrication processes. Generally, operational speed of a semiconductor device is improved with device miniaturization, while there is a need, in such extremely miniaturized semiconductor devices, to reduce the thickness of the gate insulation film thereof with the decrease of the gate length achieved as a result of the device miniaturization.

When the gate length has been reduced to 0.1 μm or less, on the other hand, the thickness of the gate insulation film has to be reduced to 1-2 nm or less when a conventional thermal oxide film is used for the gate insulation film. In such an extremely thin gate insulation film, however, there inevitably arises a problem of increased tunneling current, while such an increased tunneling current causes the problem of large gate leakage current.

In view of the situation noted above, there has been a proposal of using a high-dielectric material having a much larger specific dielectric constant as compared with a thermal oxide film and thus capable of achieving a small $SiO_2$-equivalent thickness while maintaining a large physical thickness, for the gate insulation film. Such a high-K material includes $Ta_2O_5$, $Al_2O_3$, $ZrO_2$, $HfO_2$, $ZrSiO_4$, $HfSiO_4$, and the like. By using such a high-K dielectric material, it becomes possible to use the physical thickness of about 10 nm in ultra high-speed semiconductor devices having a gate length of 0.1 μm or less. Thereby, the gate leakage current caused by tunneling effect is successfully suppressed.

For example, a $Ta_2O_5$ film has been formed by a CVD process while using $Ta(OC_2H_5)_5$ and $O_2$ as gaseous sources. In a typical example, the CVD process is conducted under a reduced pressure at a temperature of about 480° C. or more. The $Ta_2O_5$ film thus formed is then subjected to a thermal annealing process in an oxidizing ambient and the oxygen defects in the film are compensated. Further, the film undergoes crystallization. The $Ta_2O_5$ film thus crystallized shows a large specific dielectric constant.

From the viewpoint of increasing carrier mobility in the channel region, it is preferable to provide an extremely thin base oxide film having a thickness of 1 nm or less, preferably 0.8 nm or less, between the high-K dielectric gate oxide film and the silicon substrate. This base oxide film has to be extremely thin. Otherwise, the effect of using the high-K dielectric film for the gate insulation film is cancelled out. On the other hand, such an extremely thin base oxide film is required also to cover the silicon substrate surface uniformly, without forming defects such as surface states.

Conventionally, rapid thermal oxidation (RTO) process of a silicon substrate (See, for example, Patent Document No. 1) has been used when forming a thin gate oxide film. When such an RTO process is used for forming a thermal oxide film with the desired thickness of 1 nm or less, there is a need of decreasing the processing temperature at the time of the film formation. However, such a thermal oxide film formed at low temperature tends to contain a large amount of surface states and is not suitable for the base oxide film of a high-K dielectric gate oxide film.

FIG. 1 shows the schematic construction of a high-speed semiconductor device 100 having a high-K dielectric gate insulation film.

Referring to FIG. 1, the semiconductor device 10 is constructed on a silicon substrate 11 and includes a high-K dielectric gate insulation film such as $Ta_2O_5$, $Al_2O_3$, $ZrO_2$, $HfO_2$, $ZrSiO_4$, $HfSiO_4$, and the like, formed on the silicon substrate 11 via a thin base oxide film 12. Further, a gate electrode 14 is formed on the high-K dielectric gate insulation film 13.

In the semiconductor device 10 of FIG. 1, there is conducted nitrogen (N) doping on the surface part of the base oxide film 12 within the extent that a flat interface is maintained between the silicon substrate 11 and the base oxide film 12. As a result of the nitrogen doping, the base oxide film 12 includes an oxynitride film 12A. In view of the large specific dielectric constant of such a silicon oxynitride film larger than that of a silicon oxide, it becomes possible to reduce the oxide-equivalent thickness of the base oxide film 12 further, by forming the oxynitride film 12A in the base oxide film 12.

As explained before, it is preferable that the base oxide film 12 has as small thickness as possible in such a high-speed semiconductor device 10.

However, it has been extremely difficult to form the base oxide film 12 with the thickness of 1 nm or less, such as 0.8 nm or less, or even approximately 0.4 nm corresponding to a thickness of 2-3 atomic layers, while simultaneously maintaining uniformity and reproducibility.

In order that the high-K dielectric gate insulation film 13 formed on the base oxide film 12 performs as a high-K dielectric film, it is necessary to crystallize the deposited high-K dielectric film 13 by a thermal annealing process and conduct compensation process of oxygen vacancy defects. However, such a thermal annealing process applied to the high-K dielectric gate insulation film 13 causes an increase of thickness in the base oxide film 12, and the desired decrease of the effective thickness of the gate insulation film, achieved by the use of the high-K dielectric gate insulation film 13, is more or less cancelled out.

Such an increase of thickness of the base oxide film 12 associated with the thermal annealing process suggests the possibility of mutual diffusion of oxygen atoms and silicon atoms and associated formation of a silicate transition layer, or the possibility of growth of the base oxide film 12 caused by the penetration of oxygen into the silicon substrate. Such a problem of increase of the base oxide film 12 with thermal annealing process becomes a particularly serious problem in the case the thickness of the base oxide film 12 is reduced to several atomic layers or less.

Patent Document No. 1: Japanese Laid-Open Patent Application No. 5-47687

DISCLOSURE OF THE INVENTION

Accordingly, it is a general object of the present invention to provide a novel and useful substrate processing apparatus wherein the foregoing problems are eliminated.

Another and more specific object of the present invention is to provide substrate processing apparatus capable of forming an extremely thin oxide film, typically having a thickness of 2-3 atomic layers or less, on a surface of a silicon substrate with reliability and further capable of forming an oxynitride film by causing nitridation in the oxide film thus formed.

Furthermore, another and more specific object of the present invention is to provide a cluster-type substrate processing system including a substrate processing apparatus capable of forming an extremely thin oxide film typically having a thickness of 2-3 nm or less, on the surface of a silicon substrate with reliability and further capable of nitriding the oxide film thus formed with reliability.

Another object of the present invention is to provide a substrate processing apparatus configured to improve uniformity and throughput of the oxide film and to prevent contamination.

In order to achieve the foregoing objects, the present invention is provided with the features below.

According to the present invention, a heater portion for heating a substrate introduced in a processing space is configured having a heating element contained inside a transparent case formed of quartz; thereby preventing contamination by employing the heating element, maintaining a uniform temperature distribution for the substrate, suppressing warping of the substrate, and enabling reliable and efficient deposition of the substrate. Accordingly productivity can be improved.

Furthermore, according to the present invention, an internal space of the processing vessel and an internal space of the transparent case are depressurized at the same time; thereby suppressing internal/external pressure of the transparent case and improving thermal conductivity of heat from the heating element by allowing the thickness of the transparent case to be thinner to the extent of the amount of reduced pressure upon the transparent case.

Furthermore, according to the present invention, a heating plate of SiC for being heated by the heating element is provided on the upper face of the transparent case such that the upper face of the heating plate is in the vicinity of and opposite to the bottom face of the substrate held by a holding member; thereby enabling improvement of thermal conductivity, heating of the substrate to a temperature of 700° C., and preventing cracking of the heating element by reducing difference of temperature of the heating element.

Furthermore, according to the present invention, the heating element, which includes a first SiC heating part or second and third SiC heating parts, is able to reliably perform heating without warping the peripheral part of the substrate by selectively switching the supply of power to the first SiC heating part, to either one of the second and third SiC heating parts, or to both.

Furthermore, according to the present invention, the entire face of the substrate can be efficiently and uniformly heated by providing a heat reflecting member below the heating element.

BRIEF DESCRIPTION OF THE DRAWINGS

FIG. 8A is a plan view of an evacuation path 32;

FIG. 8B is a front elevation view of the evacuation path 32;

FIG. 8C is a cross-sectional view of the evacuation path 32 of FIG. 8B across line B-B;

FIG. 9 is an enlarged cross-sectional view of the processing vessel 22 and its surrounding;

FIG. 36A is a diagram showing a waveform of an output signal S of an optical receiver 268 of the rotating position detection mechanism 232;

FIG. 36B is a diagram showing a waveform of a pulse signal P output from a rotating position determination circuit 270;

FIG. 41A is a plan view of a bottom portion case 102;

FIG. 41B is side view of the bottom portion case 102;

FIG. 42A is a plan view of a side portion case 104;

FIG. 42B is an elevation view of the side portion case 104;

FIG. 42C is a rear view of the side portion case 104;

FIG. 42D is a left side view of the side portion case 104;

FIG. 42E is a right side view of the side portion case 104;

FIG. 43A is a bottom view of a top portion case 106;

FIG. 43B is a side view of the top portion case 106;

FIG. 61 is a diagram schematically showing the XPS analysis used in the present invention;

BEST MODE FOR CARRYING OUT THE INVENTION

Figure 2:
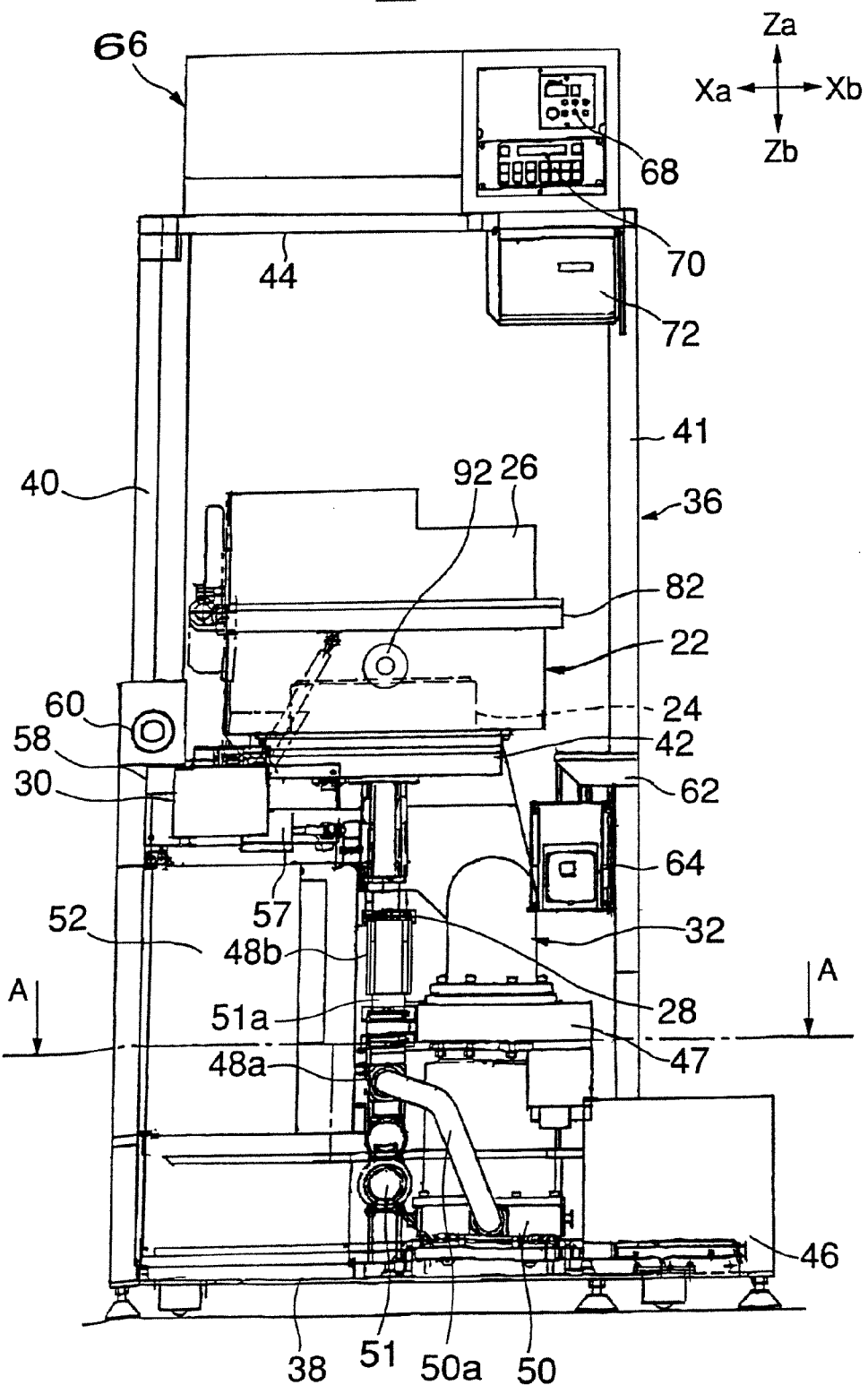
FIG. 2 is a front elevation view of a substrate processing apparatus according to an embodiment of the present invention.
Figure 3:
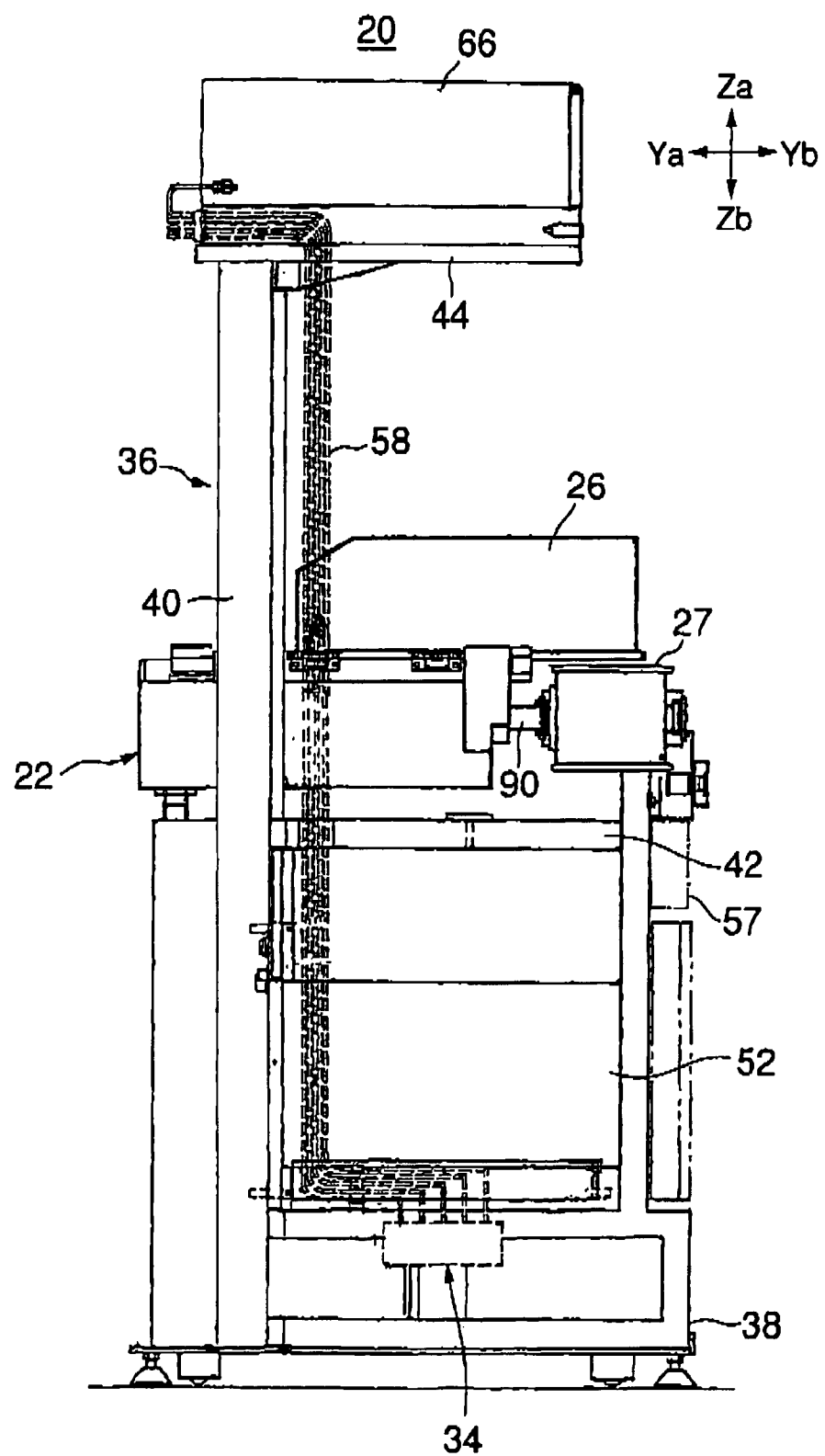
FIG. 3 is a side view of the substrate processing apparatus according to the present embodiment.
Figure 4:
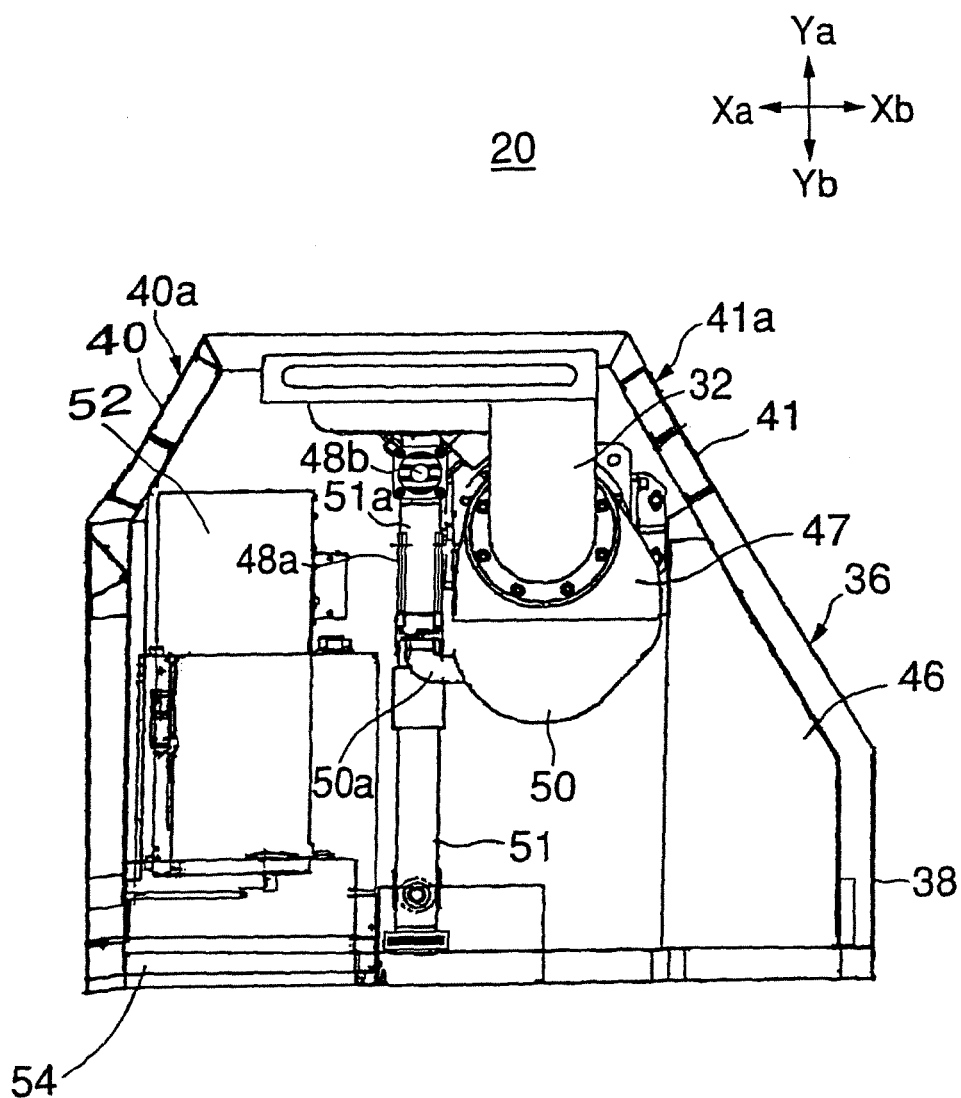
FIG. 4 is a cross-sectional view of the substrate processing apparatus of FIG. 2 across line A-A.

In the following, preferred embodiments of the present invention are described with reference to the accompanying drawings, FIG. 2 is a front elevation view of a substrate processing apparatus according to an embodiment of the present invention. FIG. 3 is a side view of the substrate processing apparatus according to the present embodiment. FIG. 4 is a cross-sectional view of the substrate processing apparatus of FIG. 2 across line A-A.

The substrate processing apparatus 20 shown in FIGS. 2~4 is configured to successively conduct a radical oxidation process using ultraviolet light on a silicon substrate and a radical nitridation process using a high frequency remote plasma of the oxide film formed by the radical oxidation process using ultraviolet light.

The substrate processing apparatus 20 includes a processing vessel 22 that defines a processing space, a heater portion 24 that is configured to heat a substrate (silicon substrate) introduced inside the processing vessel 22 to a predetermined temperature, an ultraviolet light irradiating unit 26 that is mounted on top of the processing vessel 22, a remote plasma unit 27 that is configured to supply nitrogen radicals, a rotational drive unit 28 for rotating the substrate, a lifter mechanism 30 that is configured to raise or lower the substrate introduced into the processing space, an evacuation path 32 for depressurizing the internal space of the processing vessel 22, and a gas supplying unit 34 that is configured to supply gas (i.e., processing gas such as nitrogen gas and oxygen gas) to the processing vessel 22.

Also, the substrate processing apparatus 20 includes a frame 36 for supporting the components described above. The frame 36 may be formed by steel frame members that are assembled into a supporting structure. The frame 36 includes a trapezoid bottom frame 38 that is placed on the floor surface, perpendicular frames 40 and 41 that are arranged upright in a perpendicular direction from a rear portion of the bottom frame 38, an intermediate frame 42 that extends in a horizontal direction from a middle portion of the perpendicular frame 40, and a top frame 44 arranged to extend horizontally over and across the top end portions of the perpendicular frames 40 and 41.

On the bottom frame 38, a coolant supplying unit 46, evacuation valve 48a and 48b realized by electromagnetic valves, a turbo molecule pump 50, a vacuum line 51, a power source unit 52 of the ultraviolet light irradiating unit 26, a lifter mechanism 30 of a drive unit 136, and a gas supplying unit 34, for example, may be mounted.

In the perpendicular frame 40, a cable duct 40a is formed through which various cables are inserted. Also, in the perpendicular frame 41, an evacuation duct 41a is formed. Further, a bracket 58 is fixed to the middle portion of the perpendicular frame 40, and an emergency off switch 60 is attached to the bracket 58. A bracket 62 is fixed to the S middle portion of the perpendicular frame 41, and a temperature adjuster 64 for adjusting the temperature of the coolant is attached to the bracket 62.

The intermediate frame 42 is arranged to support the processing vessel 22, the ultraviolet light irradiating unit 26, the remote plasma unit 27, the rotational drive unit 28, the lifter mechanism 30, and a UV lamp controller 57. Also, on the top frame 44, a gas box that is connected to plural gas lines 58 extending from the gas supplying unit 34, an ion gauge controller 68, an APC controller 70 that conducts pressure control, and a TMP controller 72 for controlling the turbo molecule pump 50, for example, may be mounted.

Figure 5:
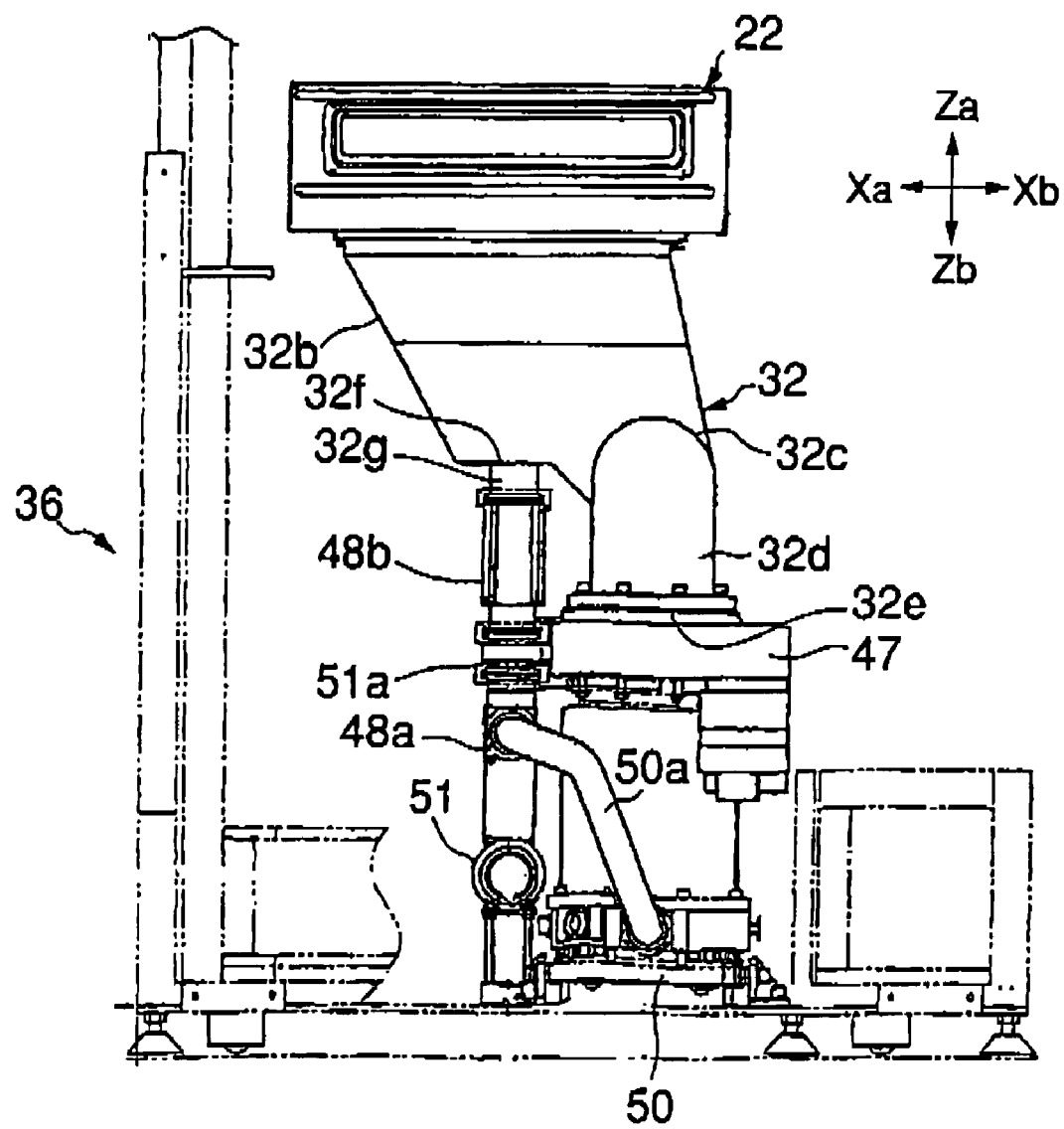
FIG. 5 is a front elevation view of an equipment positioned below a processing vessel 22.
Figure 6:
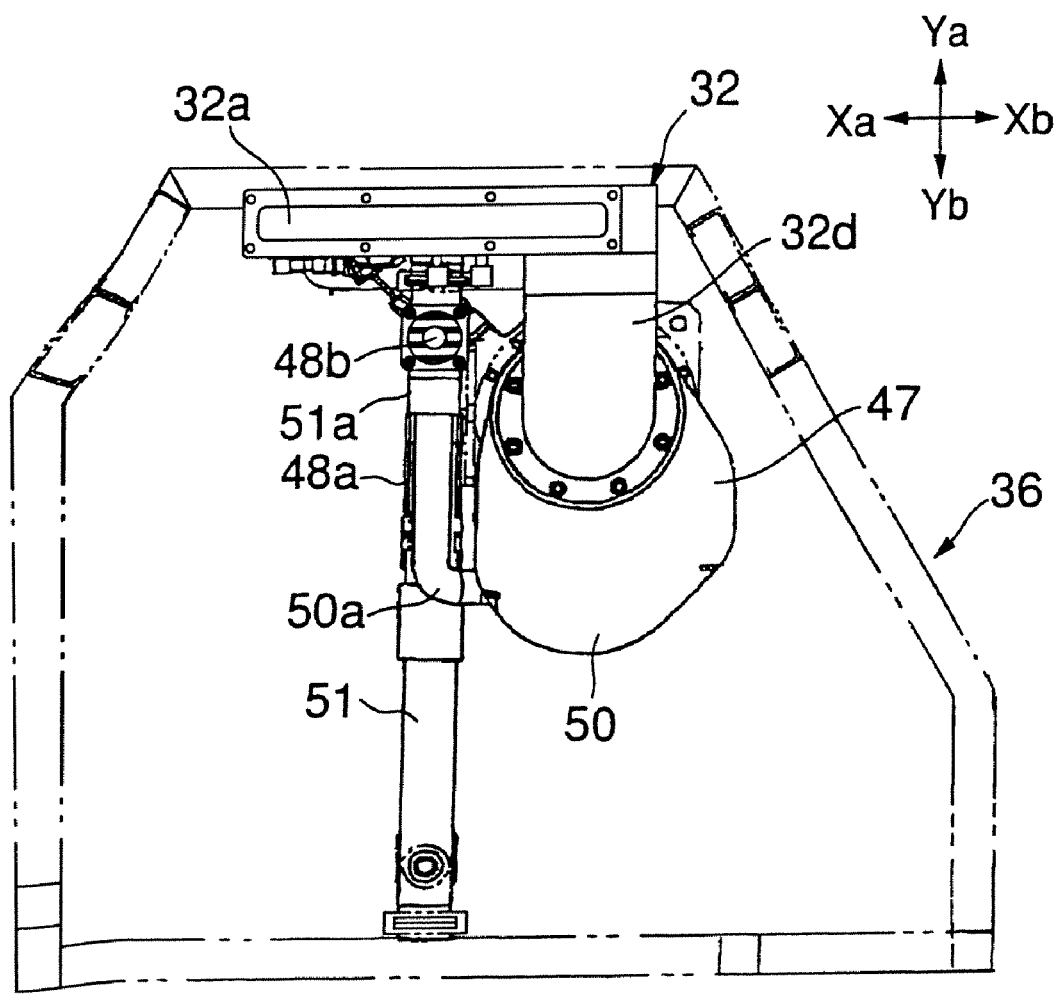
FIG. 6 is a plan view of the equipment positioned below the processing vessel 22.
Figure 7:
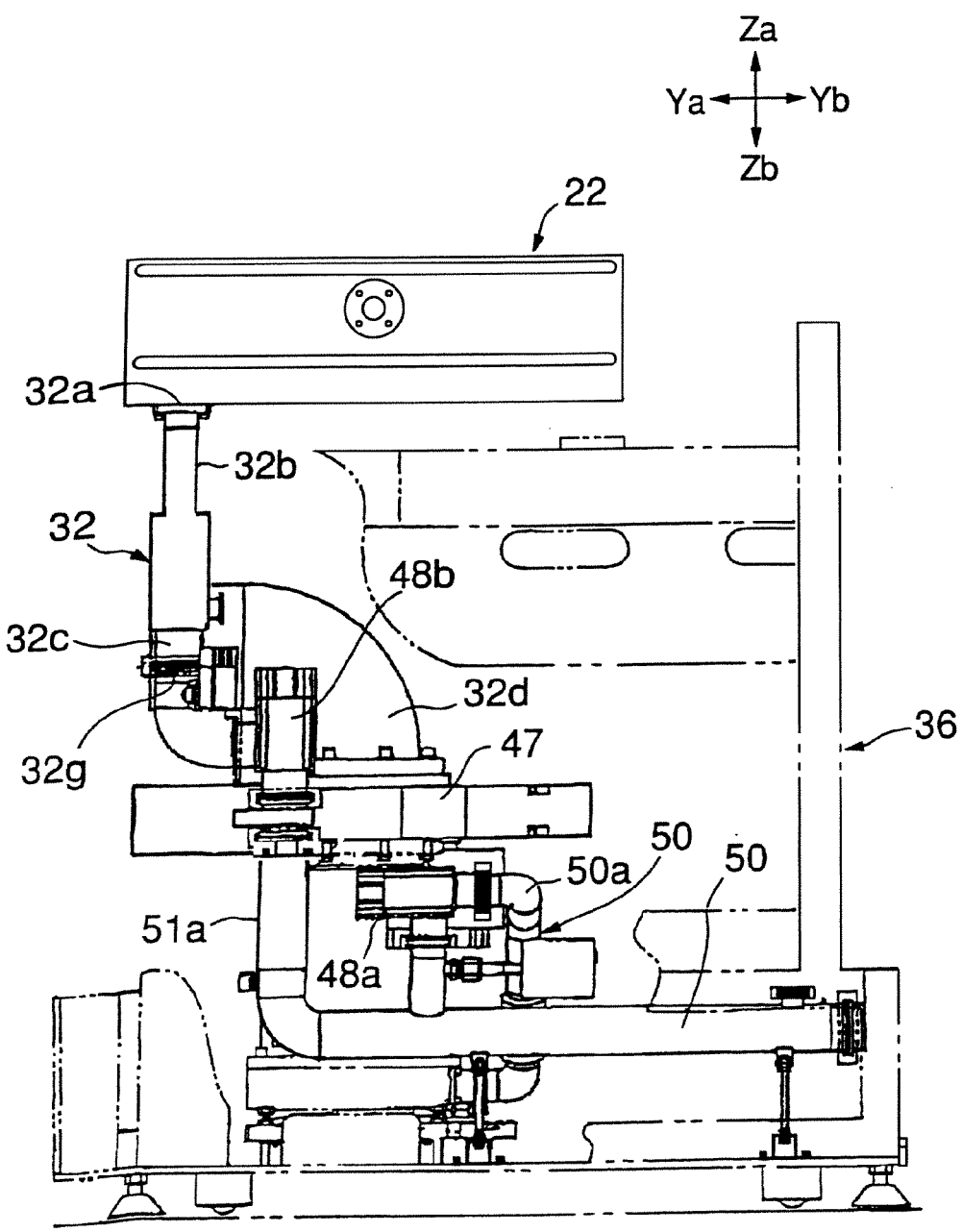
FIG. 7 is a side view of the equipment positioned below the processing vessel 22.

FIG. 5 is a front elevation view of an equipment structure arranged at the bottom of the processing vessel 22. FIG. 6 is a plan view of the equipment structure arranged at the bottom of the processing vessel 22. FIG. 7 is a side view of the equipment structure arranged at the bottom of the processing vessel 22. FIG. 8A is a plan view of an evacuation path 32. FIG. 8B is a front elevation view of the evacuation path 32. FIG. 8C is a cross-sectional view of the evacuation path 32 of FIG. 8B across line B-B.

As is shown in FIGS. 5~7, an evacuation path 32 for evacuating gas contained in the processing vessel 22 is provided at the bottom rear side of the processing vessel 22. The evacuation path 32 is arranged to be connected to a rectangular evacuation opening 74 having a width that is substantially equal to the width of the processing space formed within the processing vessel 22.

By arranging the evacuation opening 74 to have a width corresponding to the width of the internal space of the processing vessel 22, the gas supplied to the internal space of the processing vessel 22 from its front portion 22a may flow toward the rear portion of the processing vessel 22 to be efficiently evacuated to the evacuation path 32 at a constant flow rate.

As is shown in FIGS. 8A~8C, the evacuation path 32 includes a rectangular opening portion 32a, a tapered portion 32b that tapers in a downward direction from the left and right side surfaces of the opening portion 32a, a bottom portion 32c at the bottom of the tapered portion 32b at which the path area is narrowed, an L-shaped main evacuation pipe line 32d that protrudes from the front side of the bottom portion 32c, a vent 32e that is formed at the bottom end of the main evacuation pipe line 32d, and a bypass vent 32g that is formed at a bottom portion 32f of the tapered portion 32b. The vent 32e is connected to a suction opening of the turbo molecule pump 50. The bypass vent 32g is connected to a bypass line 51a.

As is shown in FIGS. 5~7, gas that is evacuated from the evacuation opening of the processing vessel 22 is flows into the rectangular opening portion 32a owing to the suction power of the turbo molecule pump 50 which then passes through the tapered portion 32b to reach the bottom portion 32c to be guided toward the turbo molecule pump 50 via the main evacuation pipe line 32d and the vent 32e.

The turbo molecule pump 50 has a discharge line 50a that is connected to the vacuum line 51 via a valve 48a. Thereby, when the valve 48a is opened, the gas supplied into the processing vessel 22 is evacuated to the vacuum line 51 via the turbo molecule pump 50. Also, the bypass vent 32g of the evacuation path 32 is connected to a bypass line 51a, and this bypass line 51a may be connected to the vacuum line 51 when the valve 48b is opened.

In the following, the processing vessel 22 and its surrounding structure are described.

(Structure of Processing Vessel 22)

Figure 10:
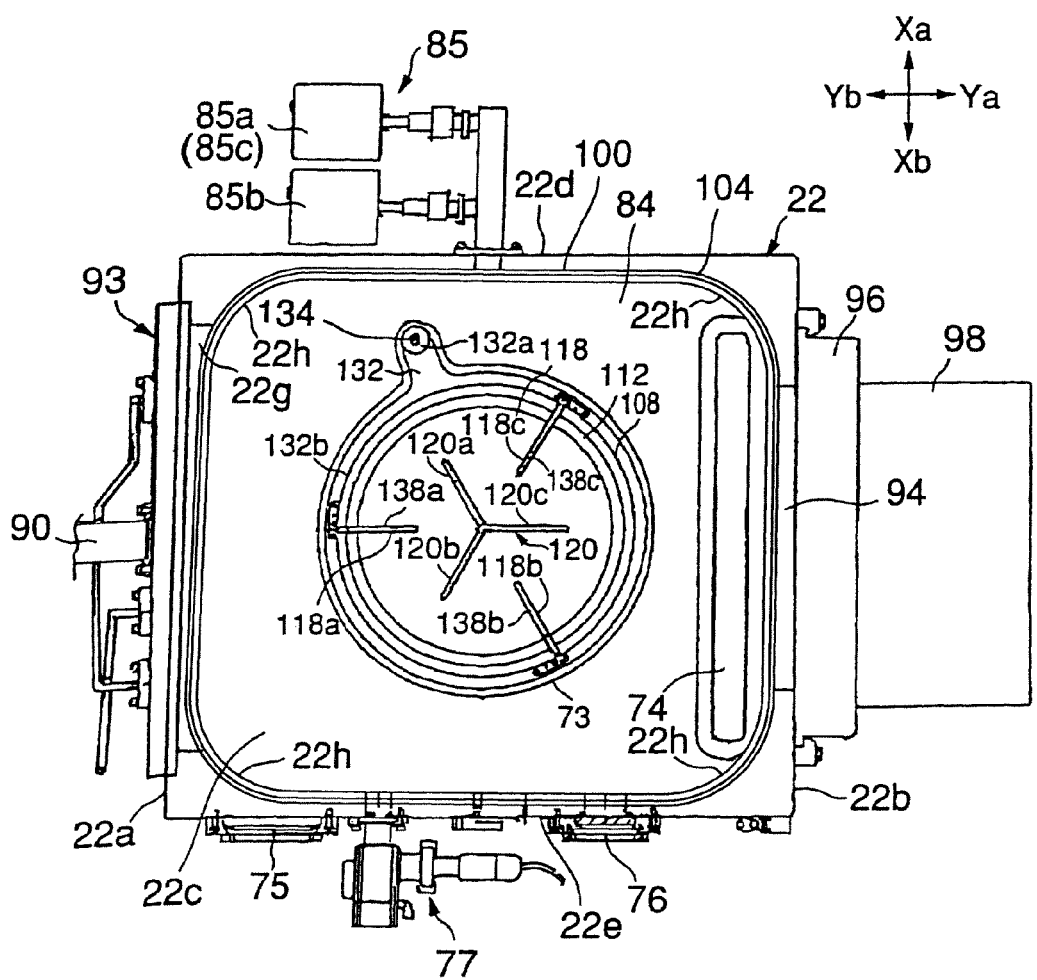
FIG. 10 is a plan view of the interior of the processing vessel 22.

FIG. 9 is an enlarged cross-sectional view of the processing vessel 22 and its surrounding structure. FIG. 10 is a plan view of the interior of the processing vessel 22 that may be observed from the upper side upon removing a lid member 82.

As is shown in FIGS. 9 and 10, the processing vessel 22 is realized by a chamber 80 having an upper opening portion that is closed by a lid member 82 to form a processing space 84.

The processing vessel 22 includes a front portion 22a at which a supply opening 22g is formed for supplying gas to the processing vessel 22. Also, the processing vessel 22 includes a rear portion 22b at which a carrier opening 94 is formed. As is described below, the gas injection nozzle unit 93 is arranged at the supply opening 22g, and the carrier opening is connected to a gate valve 96.

Figure 11:
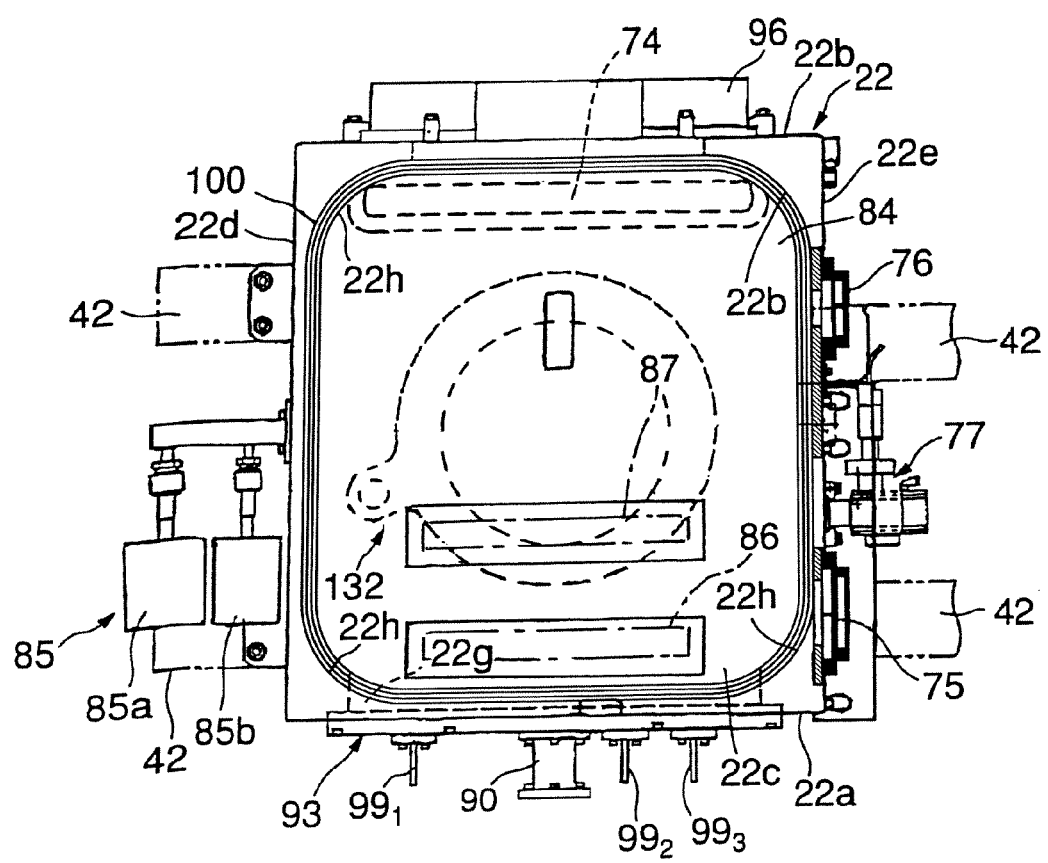
FIG. 11 is a plan view of the processing vessel 22.
Figure 12:
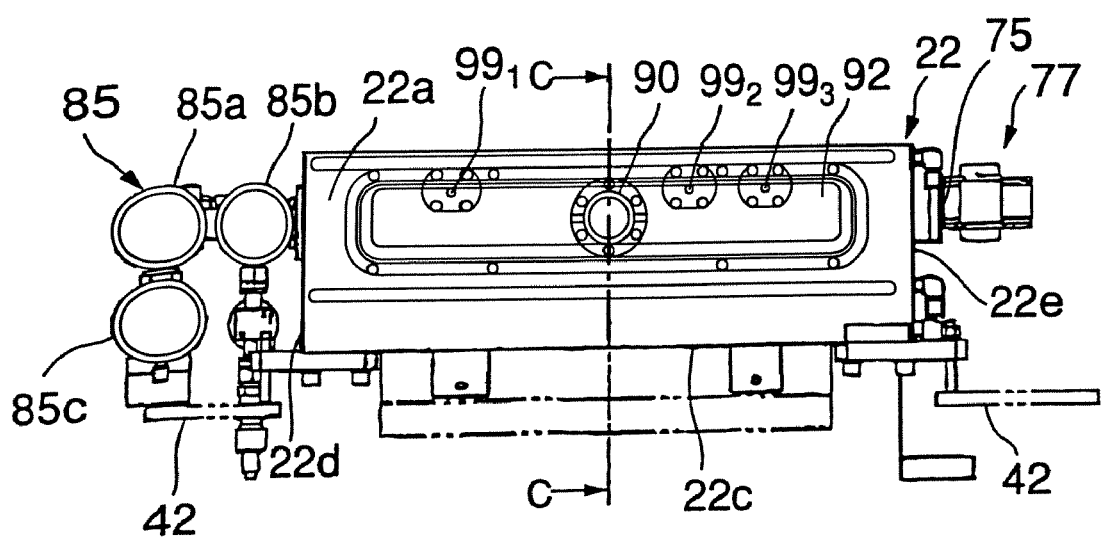
FIG. 12 is a front elevation view of the processing vessel 22.
Figure 13:
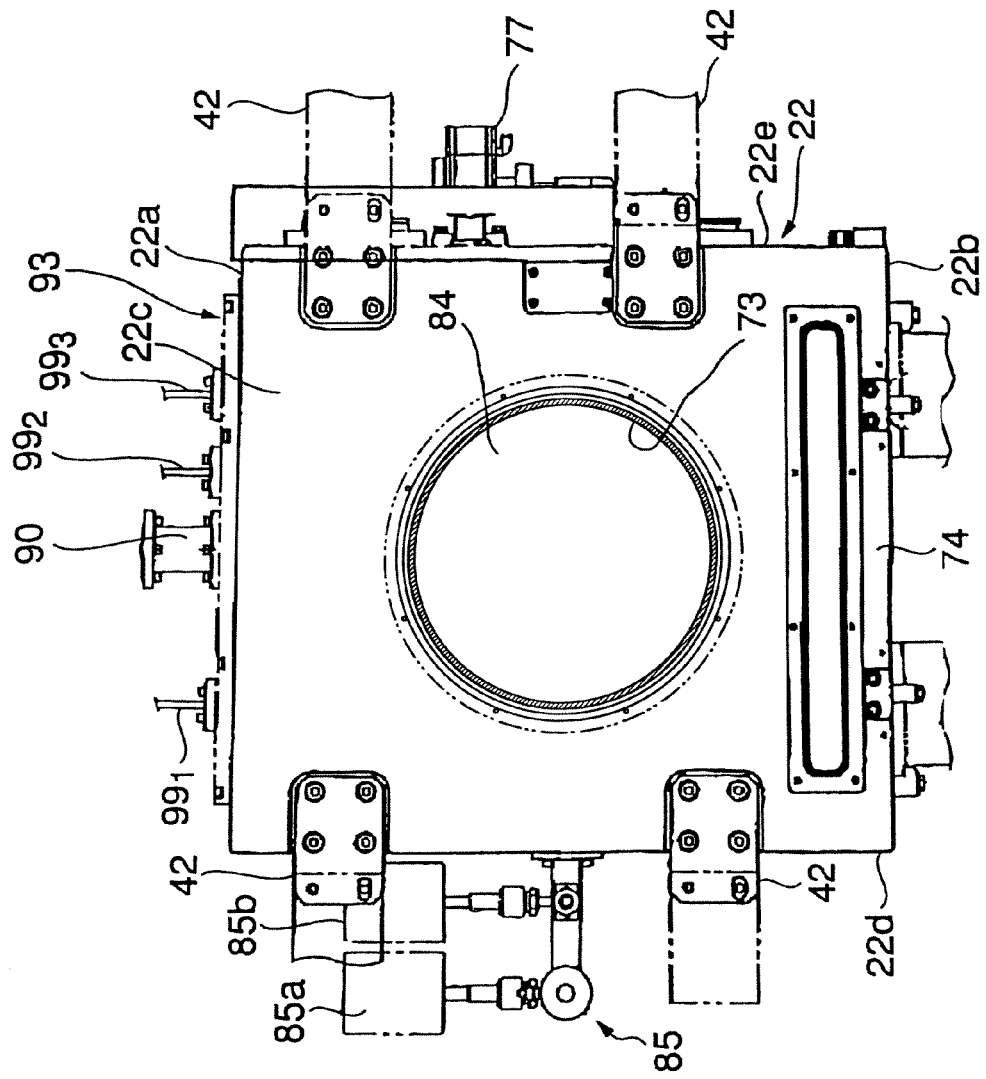
FIG. 13 is a bottom view of the processing vessel 22.
Figure 14:
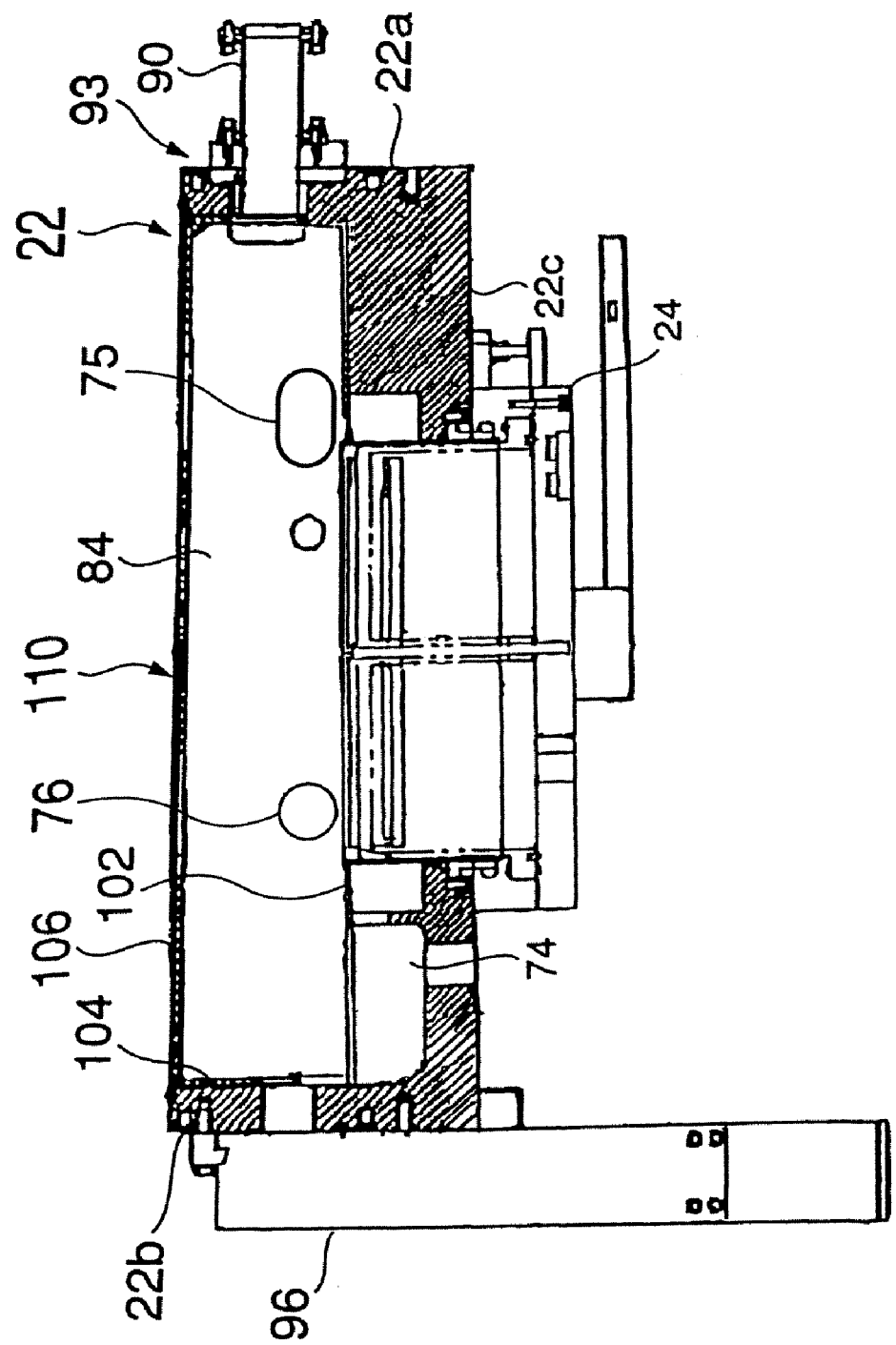
FIG. 14 is a cross-sectional view of the processing vessel of FIG. 12 across line C-C.
Figure 15:
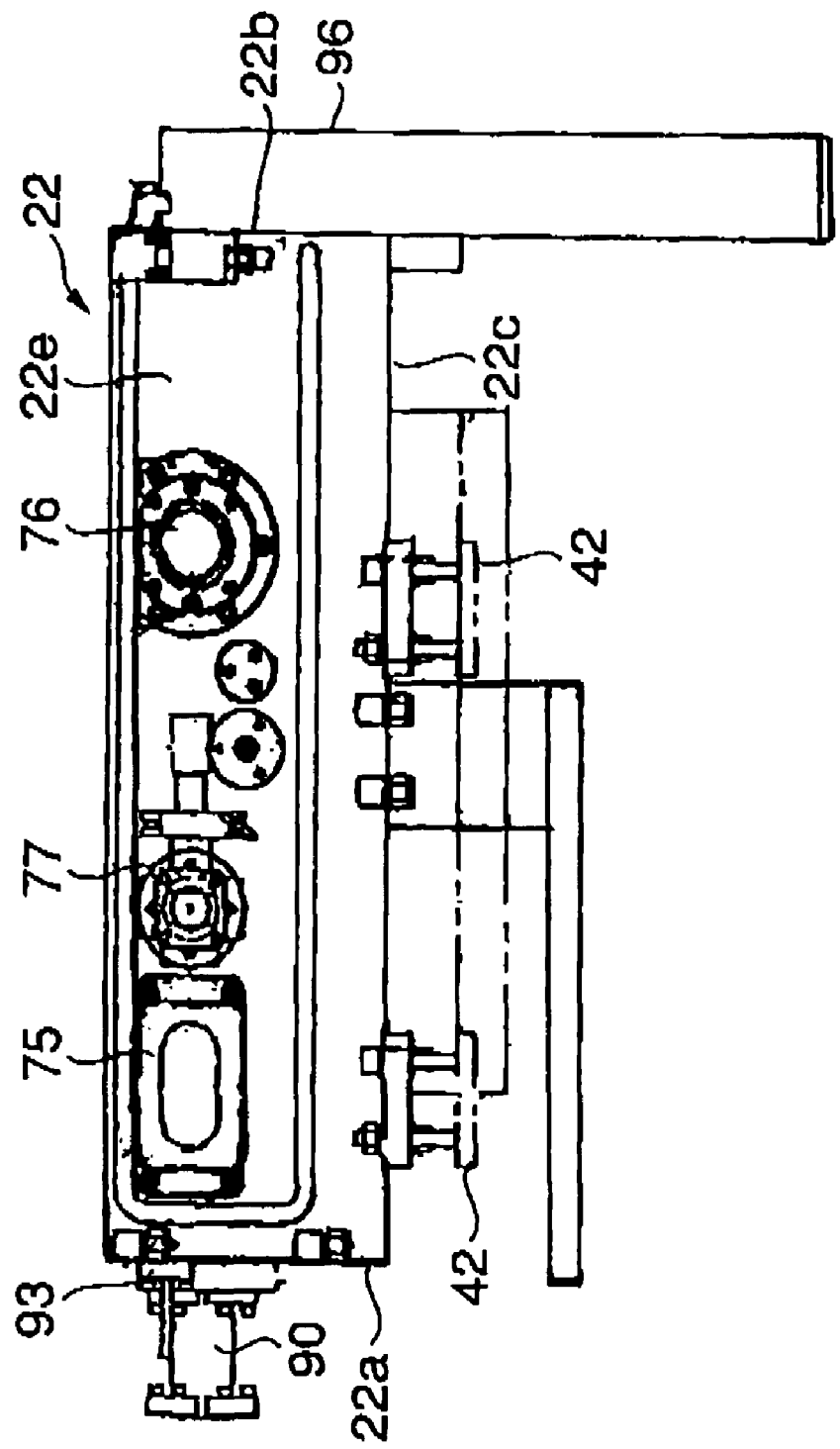
FIG. 15 is a right side view of the processing vessel 22.
Figure 16:
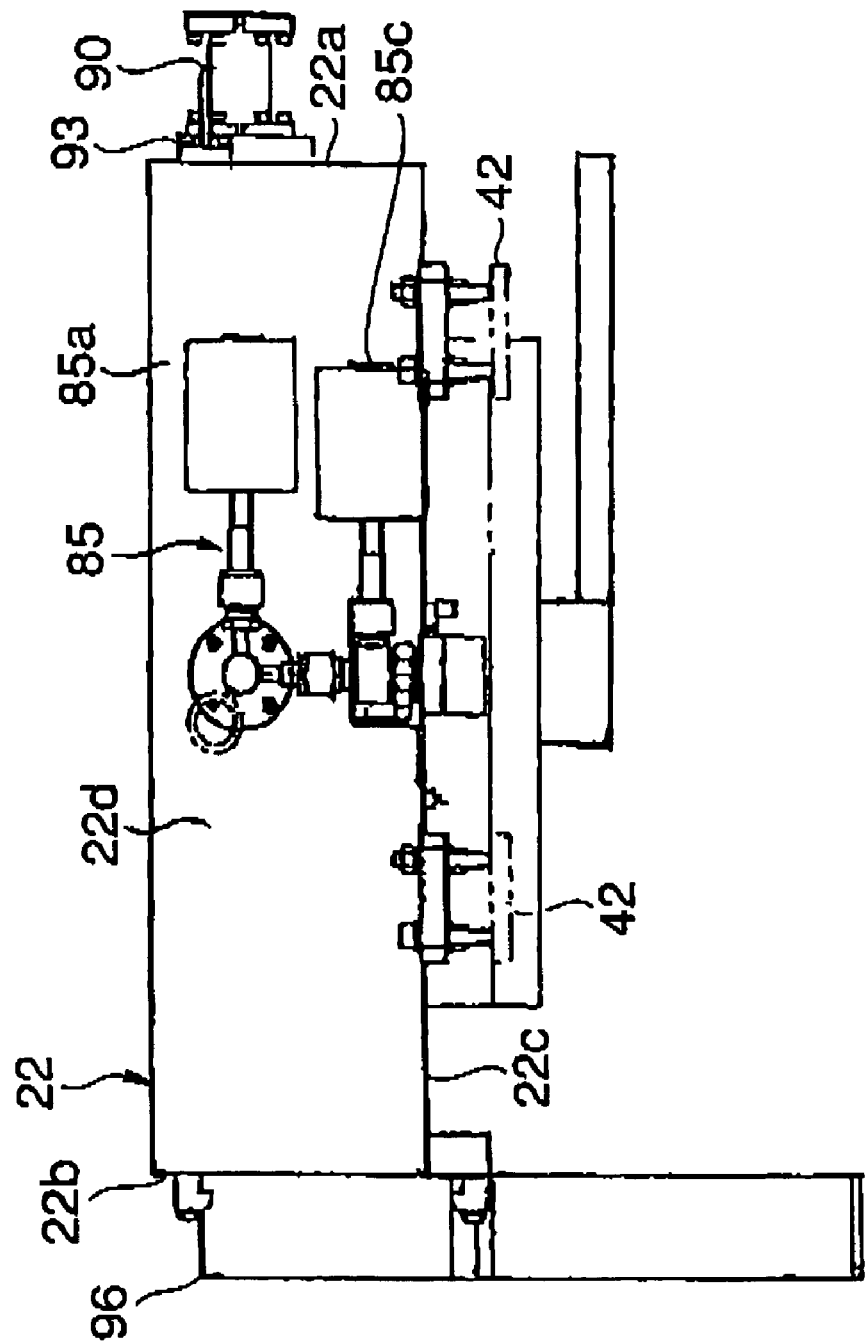
FIG. 16 is a left side view of the processing vessel 22.

FIG. 11 is a plan view of the processing vessel 22. FIG. 12 is a front elevation view of the processing vessel 22. FIG. 13 is a bottom view of the processing vessel 22. FIG. 14 is a cross-sectional view of the processing vessel of FIG. 12 across line C-C. FIG. 15 is a right side view of the processing vessel 22. FIG. 16 is a left side view of the processing vessel 22.

As is shown in FIGS. 11~16, at a bottom portion 22c of the processing vessel 22, an opening 73 is formed into which the heater portion 24 is inserted, and the rectangular evacuation opening 74 is formed. As is described above, the evacuation opening 74 is connected to the evacuation path 32. The chamber 80 and the lid member 82 may be made of aluminum alloy that is shaped into the structure as is described above through cutting, for example.

At the right side 22e of the processing vessel 22, first and second windows 75 and 76 are formed to enable observation of the interior of the processing space 84 from the outside, and a sensor unit 77 for measuring the temperature inside the processing space 84.

In the present embodiment, an oval-shaped first window 75 is formed on the right side 22e of the processing vessel 22 at a position shifted leftward from the center, and a circular second window 76 is formed at the right side 22e of the processing vessel 22 at a position shifted rightward from the center. In this way, it is possible to directly view the state of the substrate W held at the processing space 84 from both directions so that the film formation process on the substrate W may be observed in a suitable manner.

It is noted that the windows 75 and 76 are arranged to be removable from the processing vessel 22 in the case of inserting a temperature measuring device such as a heating element thermometer into the processing vessel, for example.

On the left side 22*d* of the processing vessel 22, a sensor unit 85 for measuring the pressure within the processing space 84 is mounted. The sensor unit 85 includes three barometers 85*a*~85*c* having different measuring ranges, and in this way, the pressure change within the processing space 84 may be accurately detected.

At the four corners of the inner wall of the processing vessel 22, R-shaped curved portions 22*h* are formed. The curved portions 22*h* are provided in order to prevent stress concentration and to stabilize the flow of gas injected from the gas injection nozzle unit 93.

(Structure of Ultraviolet Light Irradiating Unit 26)

As is shown in FIGS. 8~11, the ultraviolet light irradiating unit 26 is mounted on the top surface of the lid member 82. The ultraviolet light irradiating unit 26 includes a box structure 26*a*, and two cylinder-shaped ultraviolet light sources (UV lamps) 86 and 87 positioned in a parallel arrangement and spaced apart by a predetermined distance within the box structure 26*a*.

The ultraviolet light sources 86 and 87 are arranged to emit ultraviolet light with a wavelength of 172 nm, and are arranged to face against the upper surface of the substrate W held inside the processing space 84 via horizontally extending rectangular openings 82*a* and 82*b*, respectively, that are formed on the lid member 82. That is, the ultraviolet light sources 86 and 87 are arranged in position to irradiate ultraviolet light to a region corresponding to the front half portion (left half portion in FIG. 8) of the processing space 84.

It is noted that the intensity of the ultraviolet light irradiated from the ultraviolet light sources 86 and 87 to extent in a linear direction to the substrate W is not evenly distributed. That is, the intensity of the ultraviolet light irradiated onto the substrate W varies depending on the radial position of the substrate W. The intensity of the ultraviolet light from one of the ultraviolet light sources 86 and 87 decreases as the irradiating position on the substrate W moves toward the outer radius side, and the intensity of the other one of the ultraviolet light sources 86 and 87 decreases at the irradiating position moves toward the inner radius side. As is described above, the ultraviolet light sources 86 and 87 each realize a proportional change in the ultraviolet light intensity distribution on the substrate W; however, the directions of change of the ultraviolet light intensity distribution on the substrate W realized by the ultraviolet light sources 86 and 87 are arranged to be opposite with respect to one another.

Thus, by optimizing the drive power of the ultraviolet light sources 86 and 87 through control operations of the UV lamp controller 57, an even intensity distribution of the ultraviolet light may be realized on the substrate W.

It is noted that the optimal value of the drive power may be obtained through testing by changing the drive output to the ultraviolet light sources 86 and 87 and evaluating the film formation result.

The distance between the substrate W and the center axes of the cylinder shaped ultraviolet light sources 86 and 87 may be set within a range of 50~300 mm, for example, and preferably within a range of 100~200 mm.

Figure 17:
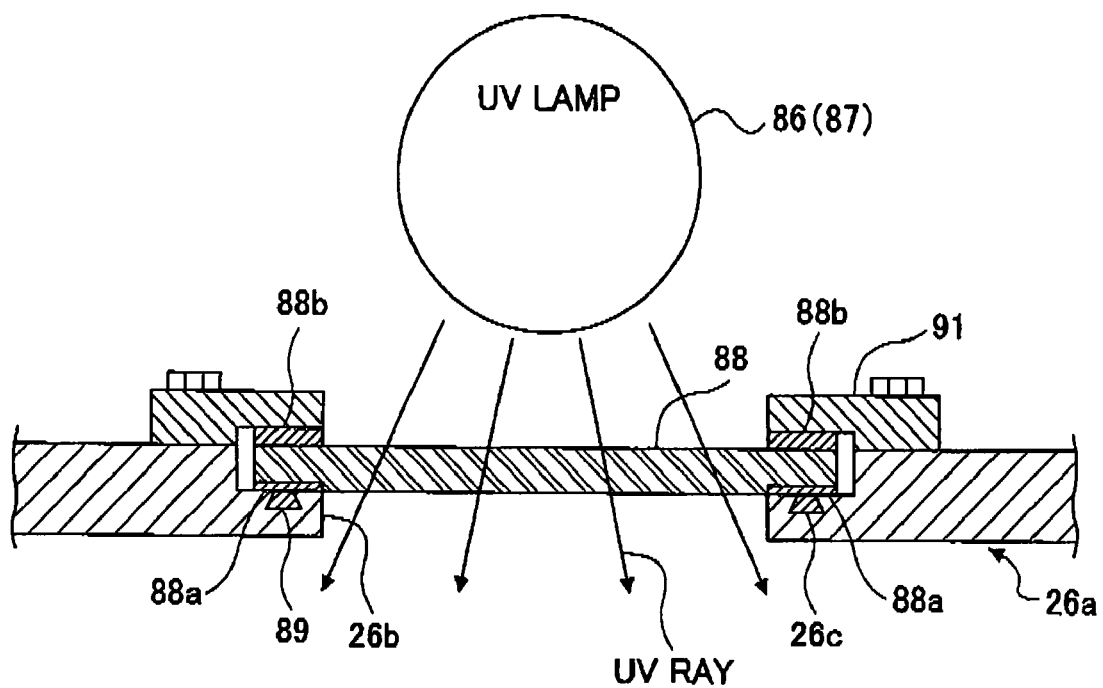
FIG. 17 is an enlarged cross-sectional view of a mounting structure of ultraviolet light sources 86 and 87.

FIG. 17 is an enlarged cross-sectional view of a mounting structure of ultraviolet light sources 86 and 87.

As is shown in FIG. 17, the ultraviolet light sources 86 and 87 are arranged in position to face against a bottom opening portion 26*b* of the box structure 26*a* of the ultraviolet light irradiation unit 26. The bottom portion opening 26*b* is positioned to face against the upper surface of the substrate W held at the processing space 84, and is formed into a rectangular opening having a width that is greater than the overall lengths of the ultraviolet light sources 86 and 87.

A transparent window 88 that is made of transparent quartz is mounted to a rim portion 26*c* of the bottom portion opening 26*b* the transparent window 88 is arranged to pass the ultraviolet light irradiated from the ultraviolet light sources 86 and 87 into the processing space 84, and is provided with sufficient rigidity to bear the pressure difference when the processing space 84 is depressurized.

On a bottom surface periphery portion of the transparent window 88, a seal surface 88*a* is formed that comes into contact with a seal member (O-ring) 89 that is arranged within a trench formed around a periphery portion 26*c* of the bottom portion opening 26*b*. The seal surface 88*a* may be made of coating or black quartz for protecting the seal member 89. In this way, the material of the seal member 89 is prevented from decomposing and being degraded so that an effective sealing property may be secured. Also, the material of the seal member 89 may be prevented from infiltrating into the processing space 84.

On an upper surface peripheral portion of the transparent window 88, a stainless steel cover 88*b* is mounted to enhance the strength (rigidity) of the transparent window 88 to thereby prevent the transparent window 88 from being damaged by the pressure applied thereto by a fastening member 91 that holds the transparent window 88 from both sides to fasten the transparent window 88.

It is noted that in the present embodiment, the ultraviolet light sources 86 and 87 and the transparent window 88 are arranged to extend in a perpendicular direction with respect to the flowing direction of gas being injected from the gas injection nozzle unit 93. However, the present invention is not limited to the present embodiment, and for example, the ultraviolet light sources 86 and 87 and the transparent window 88 may also arranged to extend in a parallel direction with respect to the flowing direction of the injected gas.

(Structure of Gas injection nozzle unit 93)

As is shown in FIGS. 9 and 10, the gas injection nozzle unit 93 is arranged at the supply opening 22*g* formed at the front portion 22*a* of the processing vessel 22. The gas injection nozzle may be arranged to supply nitrogen gas or oxygen gas, for example, to the processing space 84. As is described below, the gas injection nozzle unit 93 includes plural injection openings 93*a* that are aligned into one row along a horizontal width direction of the processing space 84, and the gas injected from the plural injection openings 93*a* is arranged to flow past the surface of the substrate W in a layer state to thereby realize a stable flow of the gas within the processing space 84.

It is noted that the distance between the bottom surface of the lid member 82 closing the processing space 84 and the substrate W may be set within a range of 5~100 mm, for example, and preferably within a range of 25~85 mm.

(Structure of Heater Portion 24)

As is shown in FIGS. 9 and 10, the heater portion 24 includes an aluminum alloy base 110, a transparent quartz bell jar 112 stationed at the base 110, a SiC heater 114 accommodated within an internal space 113 of the bell jar 112, a reflector (heat reflecting member) 116 made of opaque quartz, a SiC susceptor (heated member) 118 mounted on the upper surface of the quartz bell jar 112 that is heated by the SiC heater 114.

The SiC heater 114 and the reflector 116 are accommodated within the internal space of the quartz bell jar 112 so as to be isolated from the other components. In this way, contamination of the processing space 84 maybe prevented. Also, in a cleansing process, only the SiC suceptor 118 that is exposed within the processing space 84 needs to be cleaned, whereas the process of cleaning the SiC heater 114 and the reflector 16 may be omitted.

The substrate W is held by the holding member 120 to be positioned above and facing against the SiC susceptor 118. The SiC heater 114 is mounted on the upper surface of the reflector 116. Thus, the heat generated at the SiC heater 114 as well as the heat reflected by the reflector 116 are emitted to the SiC susceptor 118. It is noted that in the present embodiment, the SiC heater 114 is spaced apart from the SiC suceptor 118 by a small distance and is heated to a temperature of approximately 700° C.

The SiC suscpetor 118 has good heat transmitting characteristics, and is thereby capable of efficiently transmitting heat from the SiC heater 114 to the substrate W so that the temperature difference at the substrate W between the center portion and the periphery portion may be quickly eliminated and warping of the substrate due to the temperature difference at the substrate W may be effectively prevented.

(Structure of Rotational Drive Unit 28)

As is shown in FIGS. 9 and 10, the rotational drive unit 28 includes a holding member 120 positioned above the SiC susceptor 118 that is arranged to hold the substrate W, a casing 122 that is stationed at the lower surface of the base 110, a motor 128 that rotates a ceramic axis 126 that is connected to an axis 120d of the holding member 120 within an internal space 124 defined by the casing 122, and a magnet coupling 130 for transmitting the rotation of the motor 128.

In the rotational drive unit 28, the axis 120d of the holding member 120 is inserted through the quartz bell jar 112 and is connected to the ceramic axis 126. A drive power is arranged to be transmitted between the ceramic axis 126 and the rotational axis of the motor 128 via the magnet coupling 130. In this away, a rotational drive system with a compact structure may be realized so that the overall apparatus size may be reduced.

The holding member 120 includes arm portions 120a~120c that extend in horizontal radial directions from the top end of the axis 120d (the arm portions 120a~120c branching out from the axis 120d to form 120 degree angles with respect to each other). The substrate W is placed on the arm portions 120a~120c of the holding member 120. The substrate W held by the holding member 120 in such a manner is rotated by the motor 128 along with the holding member at a predetermined rotation speed, and in this way, the temperature distribution upon heat emission of the SiC heater 114 maybe averaged out and the intensity distribution of the ultraviolet light irradiated from the ultraviolet light sources 86 and 87 may be evened out so that a film may be evenly formed on the surface of the substrate W.

(Structure of Lifter Mechanism 30)

As is shown in FIGS. 9 and 10, the lifter mechanism 30 is positioned under the chamber 80 and at the side of the quartz bell jar 112. The lifter mechanism 30 includes a lifting arm 132 that is introduced inside the chamber 80, a lifting axis 134 that is connected to the lifting arm 132, and a drive unit 136 that lifts and lowers the lifting axis 134. The lifting arm 132 may be made of a ceramic material or quartz, for example, and includes a connection portion 132a connected to the upper end of the lifting axis 134 and a ring-shaped portion 132b surrounding the outer periphery of the SiC susceptor 118 as is shown in FIG. 10. The lifting arm 132 also has three contact pins 138a~138c extending from the inner periphery of the ring-shaped portion 132b to the center thereof, the contact pins 138a~138c being arranged to form 120 degree angles with respect to each other.

The contact pins 138a~138c are arranged to be engaged to trenches 118a~118c, respectively, that extend from the outer periphery of the SiC susceptor 118 to the center thereof, and when the lifting arm 132 is lifted, the SiC susceptor 118 is arranged to move upward. Also, the contact pins 138a~138c are positioned such that interference can be avoided with the arm portions 120a~120c of the holding member 120 extending from the center of the SiC susceptor 118 to the outer periphery thereof.

The lifting arm 132 is configured to lift the substrate W from the arm portions 120a~120c of the holding member 120 and arrange the contact pins 138a~138c to come into contact with the bottom surface of the substrate W right before a robot hand of a carrier robot 98 removes the substrate W from the processing space 84. In this way, the robot hand of the carrier robot 98 may move to a position below the substrate W, and when the lifting arm 132 is olowered, the robot hand may hold the substrate W and carry this substrate W.

(Structure of Quartz Liner 100)

As is shown in FIGS. 9 and 10, a quartz liner 100 made of white-colored opaque quartz, for example, is formed on the inner wall of the processing vessel 22 in order to block ultraviolet light. As is described below, the quartz liner 100 includes a bottom portion case 102, a side portion case 104, a top portion case 106, and a cylinder case 108 covering the outer periphery of the quartz bell jar 112.

The quartz liner 100 covers the inner walls of the processing vessel 22 and the lid member 82 that form the processing space 84. In this way, a heat insulating effect may be realized so as to prevent thermal expansion of the processing vessel 22 and the lid member 82, oxidation of the processing vessel 22 and the lid member 82 by the ultraviolet light may be prevented, and metal contamination of the processing space 84 may be prevented.

(Structure of Remote Plasma Unit 27)

As is shown in FIGS. 9 and 10, the remote plasma unit 27 for supplying nitrogen radicals to the processing space 84 is mounted to the front portion 22a of the processing vessel 22, and is connected to a supply opening 92 of the processing vessel 22 via a supply line 90.

An inactive gas such as Ar is supplied along with nitrogen gas to the remote plasma unit 27 where the supplied gas is activated by plasma to generate nitrogen radicals. The nitrogen radicals generated in this manner is then arranged to flow along the surface of the substrate W to induce nitridation of the substrate surface.

It is noted that the present invention is not limited to conducting a nitridation process, and other radical processes such as oxidation or oxynitridation using $O_2$, NO, $N_2O$, $NO_2$, or $NH_3$ gas, for example, may be conducted.

(Structure of Gate Valve 96)

As is shown in FIGS. 9 and 10, the carrier opening 94 for carrying the substrate W is provided at the rear portion of the processing vessel 22. The carrier opening 94 is closed by a gate valve 96, and is opened by an opening operation of the gate valve when carrying the substrate W.

The carrier robot 98 is provided at behind the gate valve 96, and the robot hand of the carrier robot 98 is arranged to enter the processing space 84 from the carrier opening 94 to conduct an exchanging operation of the substrate W in accordance with the opening operation of the gate valve 96.

(Detailed Descriptions of the Components)

(1) In the Following, a Detailed Description of the Gas Injection Nozzle Unit 93 ius Given.

Figure 18:
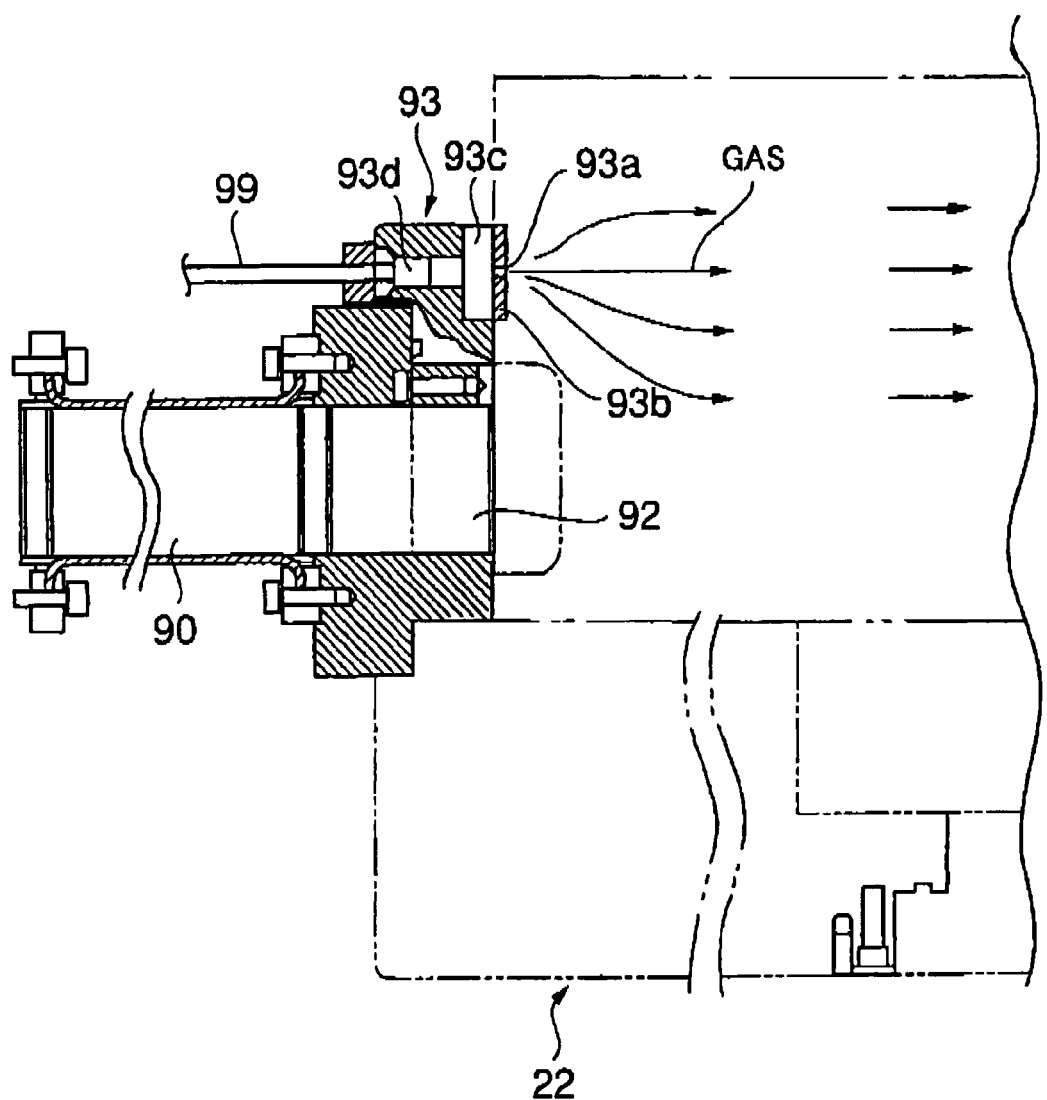
FIG. 18 is an enlarged vertical cross-sectional view of a gas injection nozzle unit 93.
Figure 19:
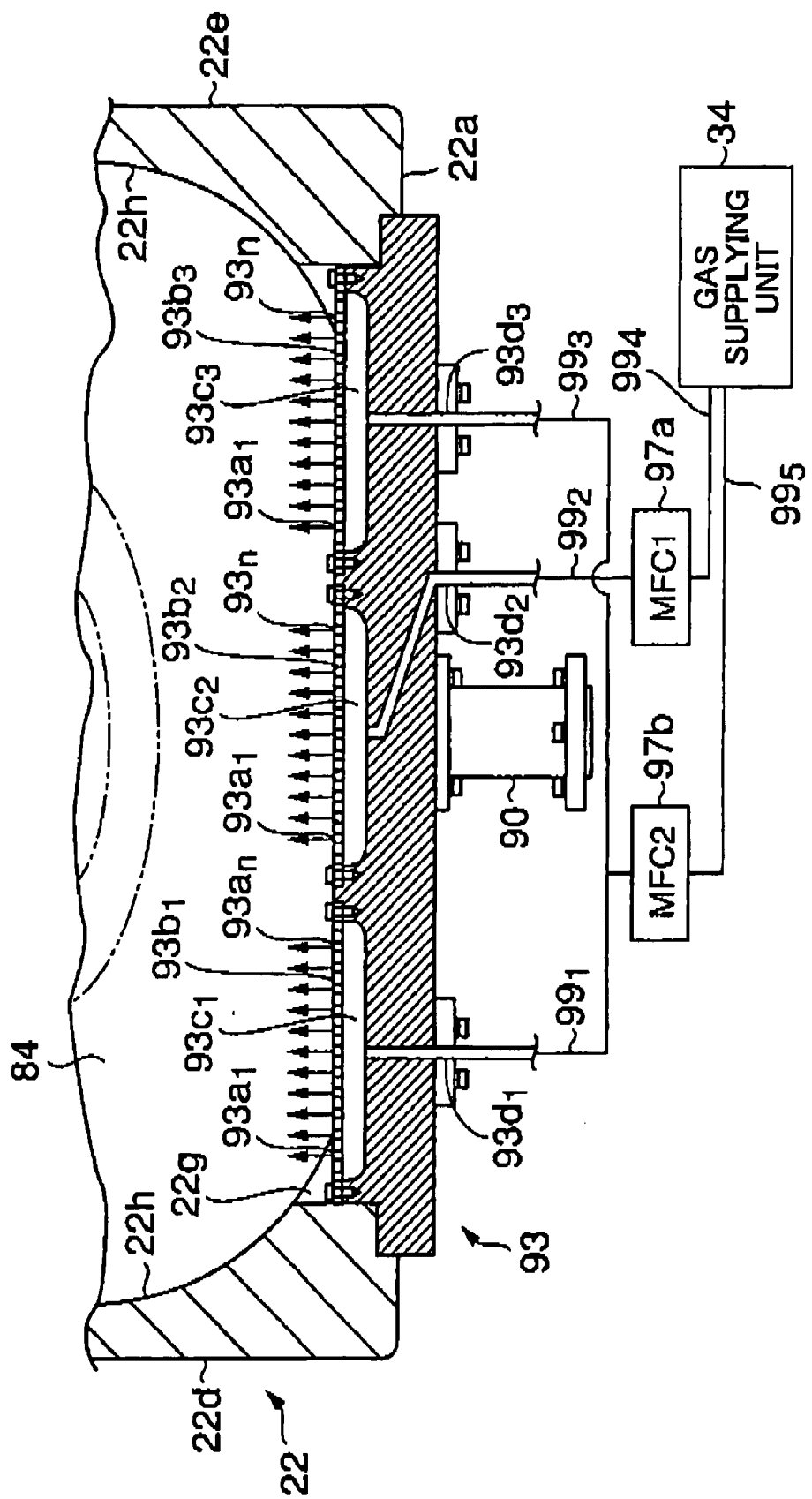
FIG. 19 is an enlarged horizontal cross-sectional view of the gas injection nozzle unit 93.
Figure 20:
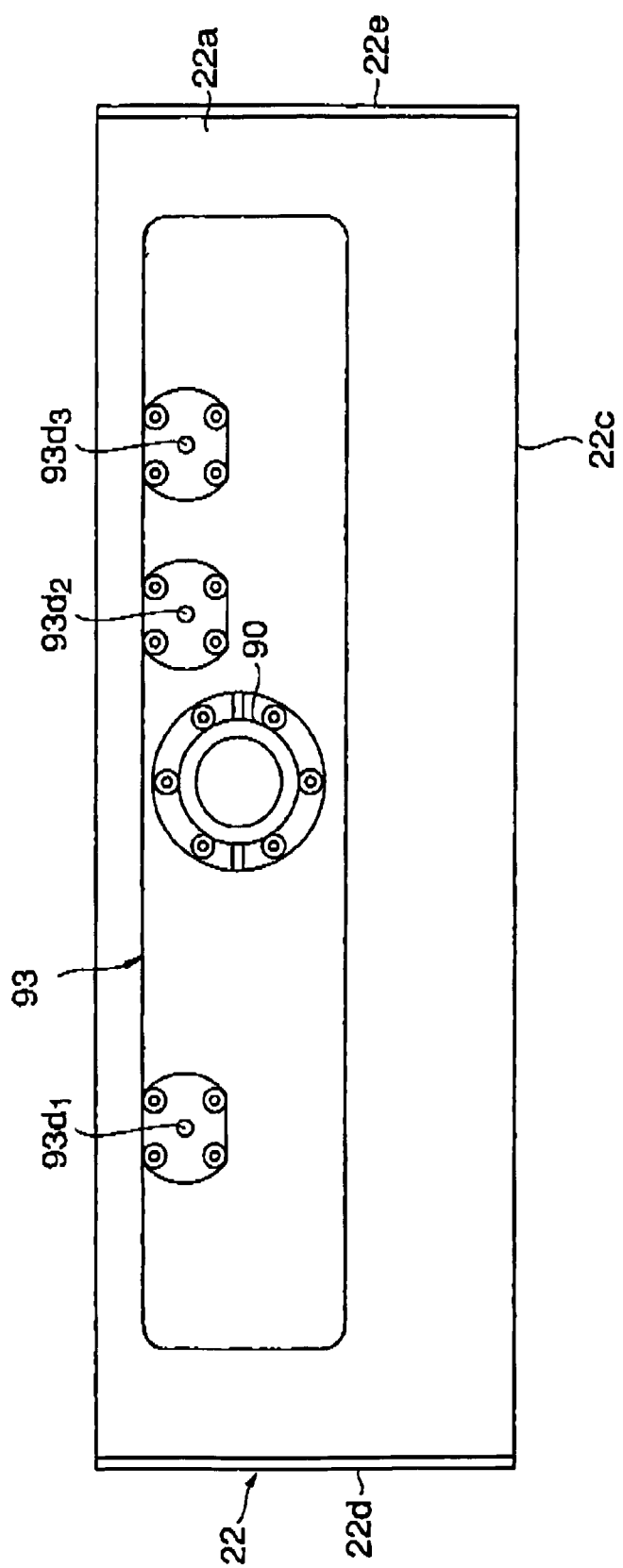
FIG. 20 is an enlarged elevation view of the gas injection nozzle unit 93.

FIG. 18 is an enlarged vertical cross-sectional view of the gas injection nozzle unit 93. FIG. 19 is an enlarged horizontal cross-sectional view of the gas injection nozzle unit 93. FIG. 20 is an enlarged elevation view of the gas injection nozzle unit 93.

As is shown in FIGS. 18~20, the gas injection nozzle unit 93 includes a connection hole 92 that is connected to a supply line 90 of the remote plasma unit 27, and nozzle plates $93b_1$~$93b_3$ on each of which plural injection holes $93a_1$~$93a_n$ are arranged into one row in a horizontal direction. The injection holes $93a_1$~$93a_n$ correspond to small holes having a diameter of 1 mm that are spaced apart from one another by a distance of 10 mm, for example.

It is noted that in the present embodiment, injection holes $93a_1$~$93a_n$ corresponding to small holes are provided. However, the present invention is not limited to such an embodiment, and for example, thin slits may be provided as injection holes.

The nozzle plates $93b_1$~$93b_3$ are attached to a wall of the gas injection nozzle unit 93. Thereby, gas injected from the injection holes $93a_1$~$93a_n$ may flow forward from the wall of the gas injection nozzle unit 93.

For example, in a case where the injection holes $93a_1$~$93a_n$ are connected to nozzle pipe lines, a portion of the gas injected from the injection holes $93a_1$~$93a_n$ may flow backward against the main flow so that gas may be accumulated in the processing space 84 to destabilize the gas flow around the substrate W.

However, in the present embodiment, the injection holes $93a_1$~$93a_n$ are formed at the wall of the gas injection nozzle unit 93 so that gas may not flow backward as in the example described above so that a stable layer flow of the gas around the substrate W may be maintained. In this way, a film may be evenly formed on the substrate W.

Also, it is noted that recessed portions $93c_1$~$93c_3$ functioning as gas pools are formed at the inner wall facing against the nozzle plates $93b_1$~$93b_3$. The recessed portions $93c_1$~$93c_3$ are positioned upstream with respect to the injection holes $93a_1$~$93a_n$, and thereby, the respective flow rates of gas injected from the injection holes $93a_1$~$93a_n$ may be averaged out. Accordingly, the overall flow rate of gas flowing within the processing space 84 may be averaged out.

Further, the recessed portions $93c_1$~$93c_3$ are connected to supply holes $93d_1$~$93d_3$, respectively, that penetrate through the gas injection nozzle unit 93. The gas supply hole $93d_2$ at the center is deviated horizontally into a crank-shaped structure so as to avoid intersection with the connection hole 92.

It is noted that gas that is flow-controlled by a first mass flow controller 97a is supplied to the gas supply hole $93d_2$ at the center via a gas supply line $99_2$. Also, gas that is flow-controlled by a second mass flow controller 97b is supplied to the gas supply holes $93d_1$ and $93d_3$ positioned at the left and right hand sides of the gas supply hole $93d_2$ via gas supply lines $99_1$, and $99_3$, respectively.

The first mass flow controller 97a and the second mass flow controller 97b are connected to the gas supply unit 34 via gas supply lines $99_4$ and $99_5$, respectively, and are configured to control the flow rate of gas supplied from the gas supply unit 34 to a predetermined amount.

The gas supplied from the first mass flow controller 97a and the gas supplied from the second mass flow controller 97b flow past the gas supply holes $93d_1$~$93d_3$ via the gas supply lines $99_1$~$99_3$, and are filled into the recessed portions $93b_1$~$93b_3$ to then be injected into the processing space 84 from the injection holes $93a_1$~$93a_n$.

According to the present embodiment, upon injecting gas into the processing space 84, the nozzle holes $93a_1$~$93a_n$ of the nozzle plates $93b_1$~$93b_3$ extending along the horizontal width directions of the front portion 22a of the processing vessel 22 are arranged to direct the gas injection throughout the entire width of the processing space 84. Thereby, the gas injected into the processing space 84 may flow toward the rear portion 22b of the processing vessel 22 at a constant flow rate (layer flow) throughout the entire processing space 84.

At the rear portion 22b of the processing vessel 22, a rectangular vent 74 extending along the horizontal width directions of the rear portion 22b is formed. Accordingly, gas within the processing space 84 flows toward the rear side portion 22b at a constant flow rate (layer flow) and is evacuated to the evacuation path 32.

It is noted that in the present embodiment, two series of gas flow control operations may be realized. Thereby, for example, differing gas flow control operations may be conducted at the first and second mass flow controllers 97a and 97b, respectively.

In this way, the flow rate of gas supplied from the first mass flow controller 97a and the flow rate of gas supplied from the second mass flow controller 97b may be arranged to differ so that a variation may be created in the concentration of gas within the processing space 84. In another example, different types of gas may be supplied from the first and second mass flow controllers 97a and 97b, respectively. For example, the first mass flow controller 97a may be arranged to conduct flow control of nitrogen gas, and the second mass flow controller 97b may be arranged to conduct flow control of oxygen gas. It is noted that gases such as oxygen-bearing gas, nitrogen-bearing gas, and noble gas may be used in the present embodiment.

(2) In the Following, a Detailed Description of the Heater Portion 24 is Given.

Figure 21:
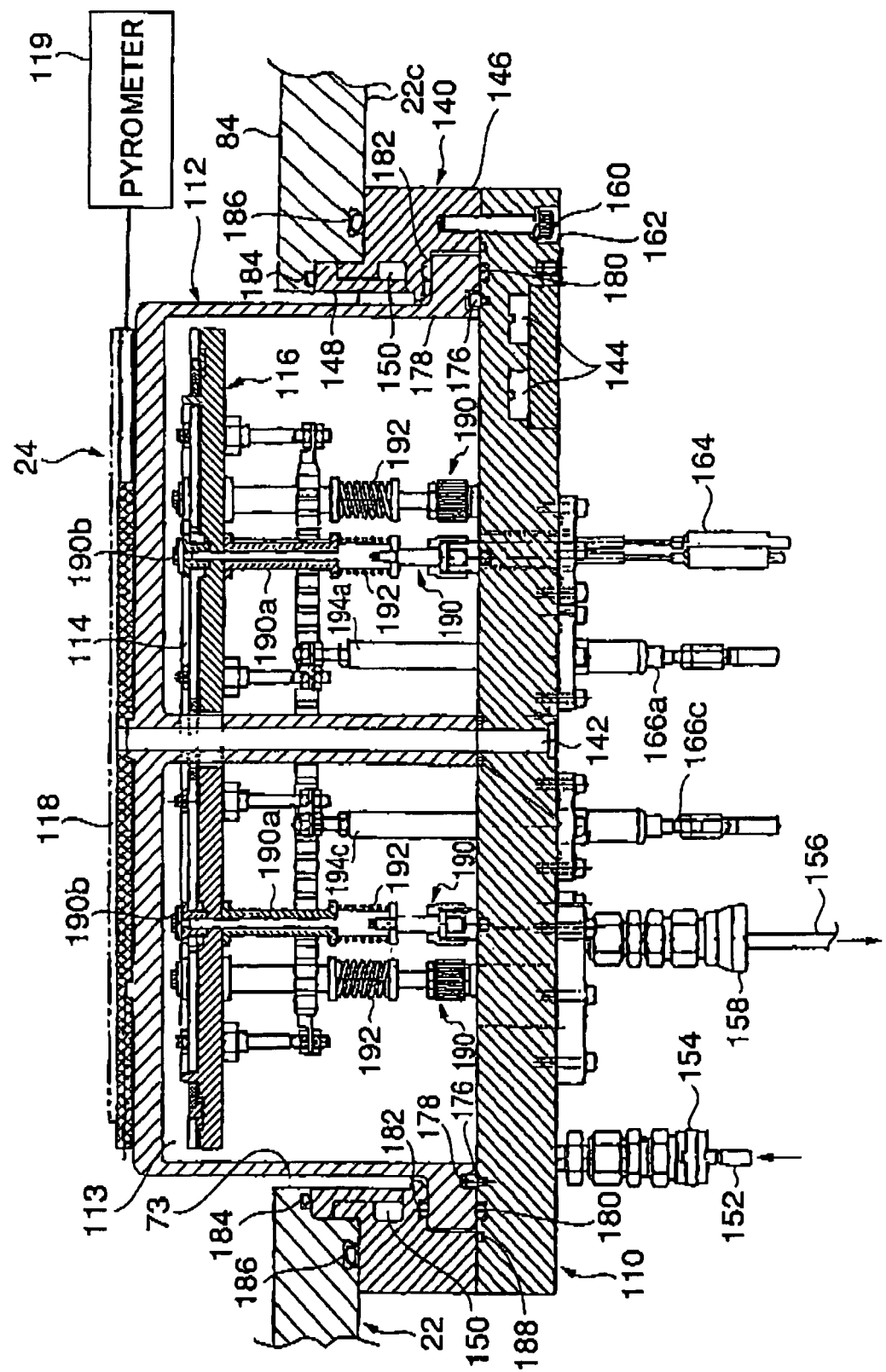
FIG. 21 is an enlarged vertical cross-sectional view of a heater portion 24.
Figure 22:
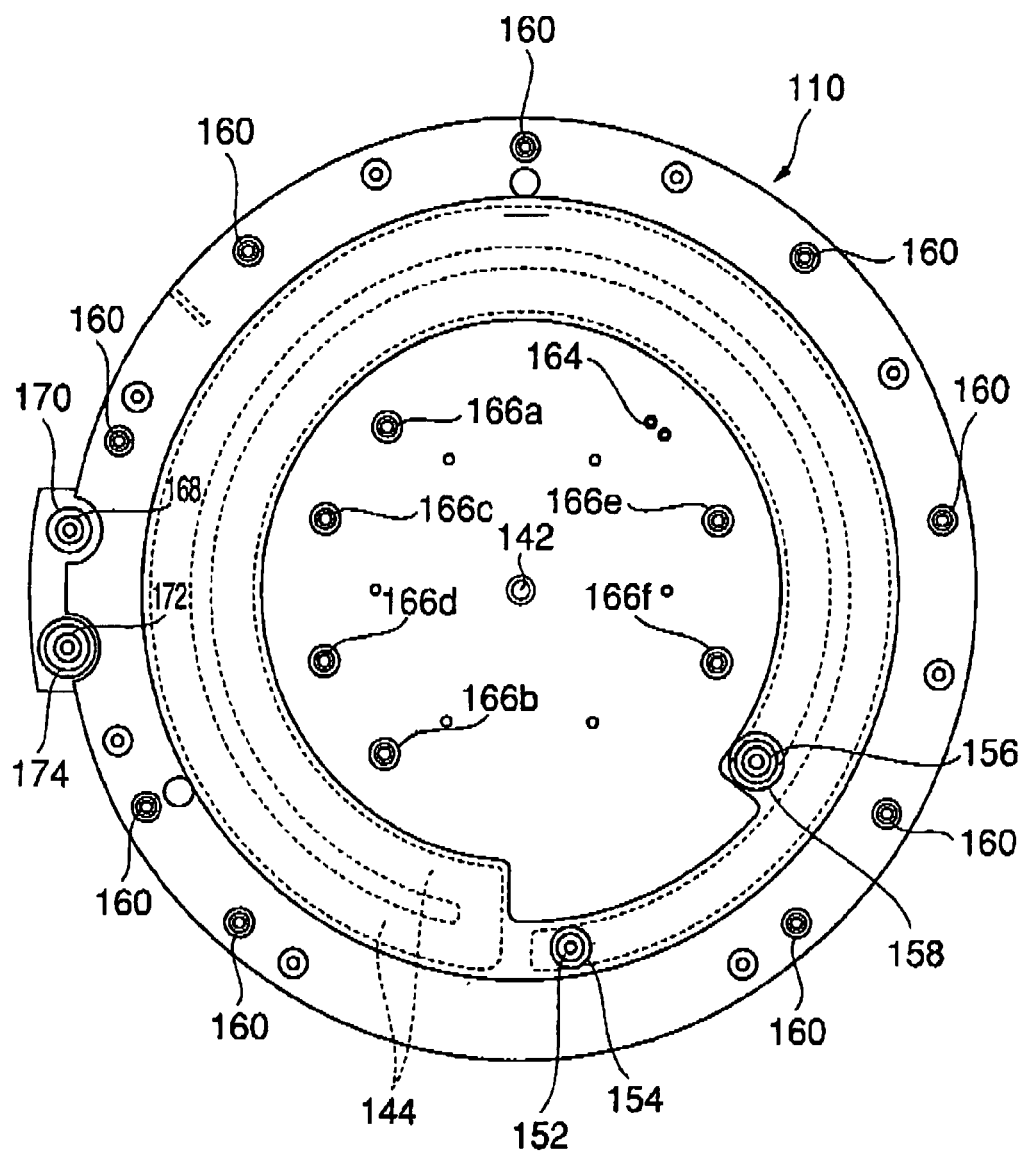
FIG. 22 is an enlarged bottom view of the heater portion 24.

FIG. 21 is an enlarged vertical cross-sectional view of the heater portion 24, FIG. 22 is an enlarged bottom view of the heater portion 24.

As is shown in FIGS. 21 and 22, the heater portion 24 includes an aluminum alloy base 110 and a quartz bell jar 112 that is mounted on the base 110. The heater portion 24 is fixed to the bottom portion 22c of the processing vessel 22 with a flange 140. In the internal space 113 of the quartz bell jar 112, the SiC heater 114, and the reflector 116 are accommodated. In this way, the SiC heater 114 and the reflector 116 are isolated from the processing space 84 of the processing vessel 22 and does not come into contact with the gas supplied within the processing space 84 so that contamination may be prevented.

The SiC susceptor 118 is mounted on the quartz bell jar 112 to face against the SiC heater 114, and a pyrometer 119 is provided to measure a temperature of the SiC susceptor 118. The pyrometer 119 is arranged to measure the temperature of the SiC susceptor 118 based on the pyroelectric effect that occurs when the SiC susceptor 118 is heated. In turn, the temperature of the substrate W is estimated at a control circuit based on a temperature signal indicating the temperature detected by the pyrometer 119, and the amount of heat generation at the SiC heater 114 is controlled based on the estimated temperature of the substrate W.

As is described below, when the processing space 84 of the processing vessel 22 is depressurized, the internal space 113 of the quartz bell jar 112 is also depressurized through operation of a depressurization system so that the pressure difference between the internal space 113 and the processing space 84 may be reduced. Accordingly, in the present embodiment, the quartz bell jar does not necessarily have to be designed to make thicker (e.g., 30 mm) that can bear the pressure difference created as a result of a depressurization process. Thereby, the quartz bell jar may be realized with reduced heat capacity so that its responsiveness to heating may be augmented.

The base 110 is formed into a disc-shape, and includes a center hole 142 through which the axis 120d of the holding member 120 is inserted, and a first channel 144 extending along the circumferential direction of the base 110 for transferring the coolant. It is noted that since the base 110 is made of an aluminum alloy, it has a high thermal expansion rate. However, by arranging the coolant to flow along the first channel 144, the base 110 may be effectively cooled to suppress its thermal expansion.

The flange 140 includes a first flange 146 that is provided between the base 110 and the bottom portion 22c of the processing vessel 22, and a second flange 148 that is engaged to the inner periphery of the first flange 146. It is noted that a second channel 150 for the coolant is formed around the inner periphery surface of the first flange 146.

The coolant supplied from the coolant supply unit 45 is arranged to flow in the first and second channels 144 and 150 so that the base 110 and the flange 140 that are heated by the heat emission of the SiC heater 114 may be cooled to prevent the thermal expansion of the bas 110 and the flange 140.

At the bottom surface of the base 110, a first flow entrance 154 and a first flow exit 158 are provided, the first flow entrance 154 being connected to a first supply line for supplying the coolant to the first channel 144, and the first flow exit 158 being connected to a discharge line 156 for discharging the coolant that has passed through the channel 144. Also, plural (e.g., around 8~12) mount holes 162 for inserting bolts 160 are provided around the outer periphery of the bottom surface of the base 110, the bolts 160 being engaged to the first flange 146.

Also, around a radial midpoint section of the bottom surface of the base 110, a heating element temperature sensor 164 for measuring the temperature of the SiC heater 114 and power source cable connection terminals (Solton terminals) 166a~166f for supplying power to the SiC heater 114 are provided. It is noted that three regions are provided at the SiC heater 114, and the power source cable connection terminals 166a~166f corresponding to a positive (+) terminal and a negative (−) terminal, respectively, are provided at each of the regions.

At the bottom surface of the flange 140, a second flow entrance 170 and a second flow exit 174 are formed, the second flow entrance being connected to a second supply line for supplying the coolant to the second channel 150, and the second flow exit 174 being connected to a discharge line 172 for discharging the coolant that has passed through the second channel 150.

Figure 23:
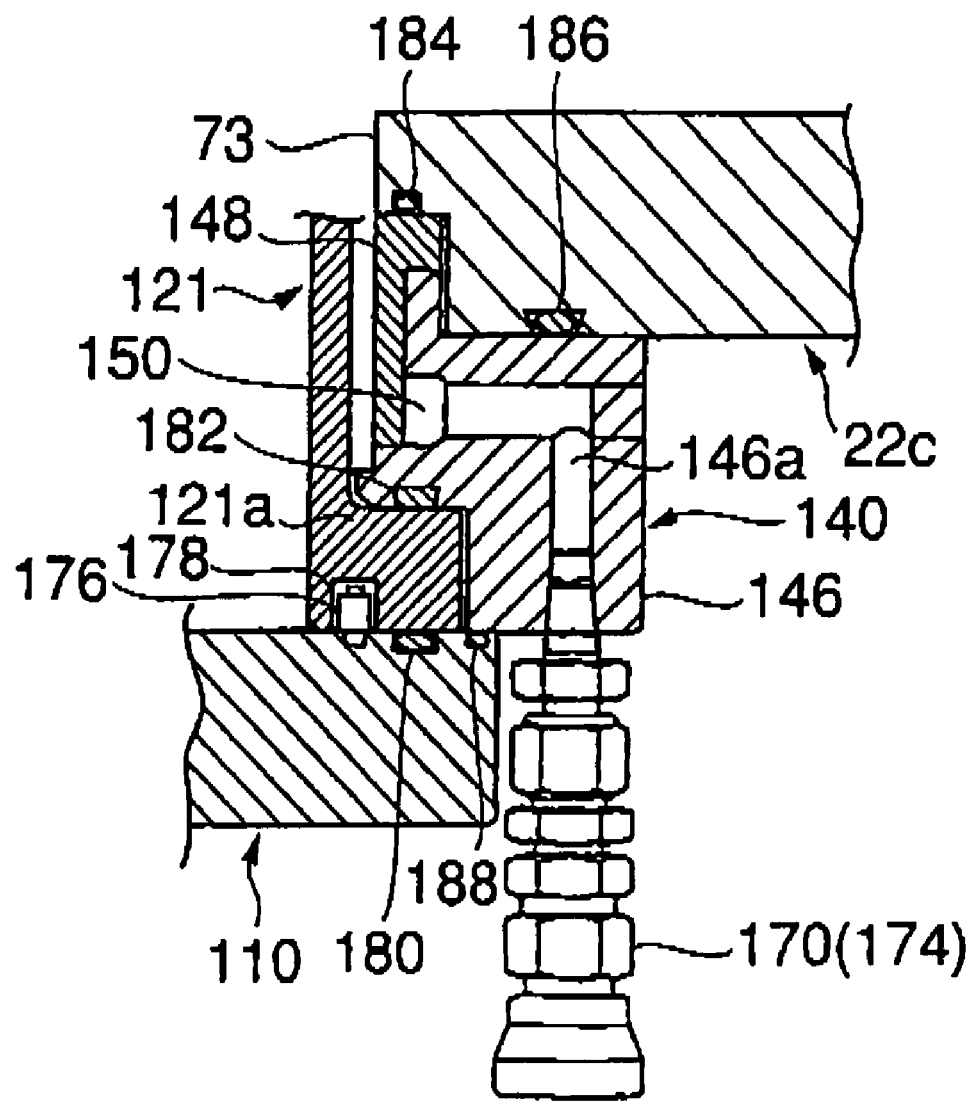
FIG. 23 is an enlarged vertical cross-sectional view of a mounting structure of a second entrance 170 and a second exit 174.
Figure 24:
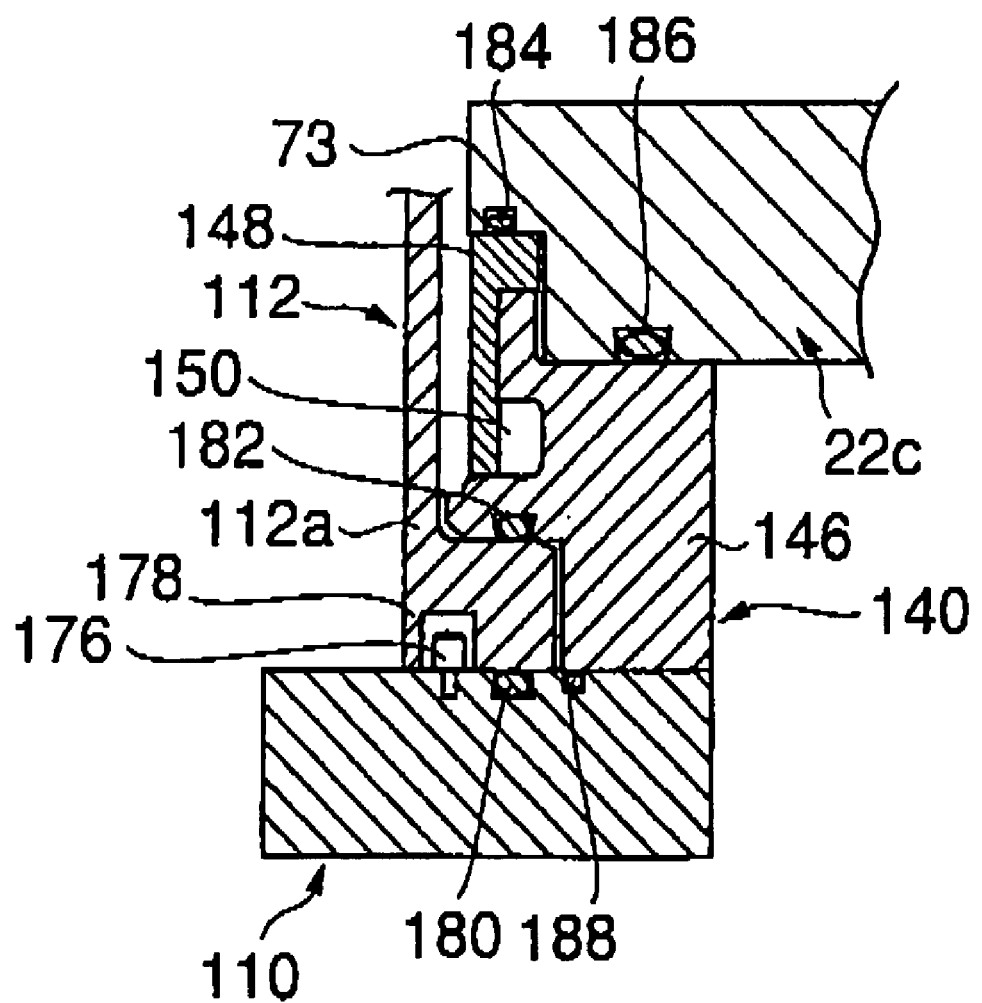
FIG. 24 is an enlarged vertical cross-sectional view of a mounting structure of a flange 140.

FIG. 23 is an enlarged vertical cross-sectional view of a mounting structure of the second flow entrance 170 and the second flow exit 174. FIG. 24 is an enlarged vertical cross-sectional view of a mounting structure of the flange 140.

As is shown in FIG. 23, an L-shaped connection hole 146a that is connected to the second flow entrance 170 is provided at the first flange 146. The second channel 150 is connected to an end portion of the connection hole 146a. The second flow exit 174 is also connected to the second channel 150 in a similar manner.

Since the channel 150 is arranged to extend along the circumferential direction of the inner side of the flange 140, by cooling the flange 140 with the coolant, the temperature of a protruding portion 112a of the quartz bell jar 112 that is held between a step portion 146a of the first flange 146 and the base 110 may also be indirectly cooled. In this way, the protruding portion 112a of the quartz bell jar 112 may be prevented from thermally expanding in the radial direction.

As is shown in FIGS. 23 and 24, plural positioning holes 178 are provided on the bottom surface of the protruding portion 112a of the quartz bell jar 112 at predetermined intervals along the circumferential direction. Pins 176 that are screwed into the base 110 are engaged to these positioning holes 178. It is noted that the diameter of the positioning holes 178 is arranged to be larger than the diameter of the pins 178 so that stress may not be applied to the protruding portion 112a when the base 110 having a high thermal expansion rate thermally expands in the radial direction. That is, a predetermined degree of thermal expansion of the base 110 with respect to the protruding portion 112a of the quartz bell jar is allowed, the predetermined degree of expansion being defined by the clearance between the pins 176 and the positioning holes 178.

Also, it is noted that the protruding portion 112a of the quartz bell jar 112 provides a clearance in a radial direction with respect to the step portion 146b of the first flange 146, and thus, thermal expansion of the base 110 may also be allowed within this extent.

The bottom surface of the protruding portion 112a of the quartz bell jar 112 is sealed by a seal member (O-ring) 180 that is provided on the surface of the base 110, and the upper surface of the protruding portion 112a of the quartz bell jar 112 is sealed by a seal member (O-ring) 182 provided at the first flange 146.

The upper surfaces of the first flange 146 and the second flange 148 are sealed by seal members (O-ring) 184 and 186, respectively, that are provided at the bottom portion 22c of the processing vessel 22. The bottom surface of the second flange 148 is sealed by a seal member (O-ring) 188 that is provided on the upper surface of the base 110.

As is described above, dual seal structures are realized between the base 110 and the flange 140, and between the flange 140 and the bottom portion 22c of the processing vessel 22, respectively. Thus, even when one of the seal members is damaged, the above seal may be maintained by the other seal members so that higher reliability may be achieved with respect to the sealing structure between the processing vessel 22 and the heater portion 24.

For example, when the quartz bell jar 112 is broken, or when a crack is formed at the protruding portion 112a, sealing within the quartz bell jar 112 may be maintained by the seal member 180 provided at the outer side of the protruding portion 112a, and the gas within the processing vessel 22 may be prevented from flowing outside.

In another example, even when the seal members 180 and/or 182 that are positioned close to the heater portion 24 are degraded, the seal between the processing vessel 22 and the base 110 may be maintained by the outer seal members 186 and 188 positioned away from the heater portion 24 so that gas leakage due to wear over time may be prevented.

As is shown in FIG. 21, the SiC heater 114 is provided on the upper surface of the reflector 116 within the internal space 113 of the quartz bell jar 112, and is maintained at a predetermined height by plural clamp mechanisms 190 that are erected from the upper surface of the base 110.

The clamp mechanism 190 includes an outer cylinder 190a that comes into contact with the bottom surface of the reflector 116, an axis 190b that penetrates through the outer cylinder 190a and comes into contact with the upper surface of the SiC heater 114, and a coil spring 192 that pushes the outer cylinder 190a against the axis 190b.

The clamp mechanism 190 is configured to hold the SiC heater 114 and the reflector 116 using the spring force of the coil spring 192. For example, even when vibration is created during transportation of the present structure, the SiC heater 114 and the reflector 116 may be held in position so that they do not come into contact with the quartz bell jar 112. Also, by providing the spring force of the coil spring 192 on a constant basis, the unscrewing of the screws due to thermal expansion may be prevented, and the SiC heater 114 and the reflector 116 may be stably and reliably held.

Also, each clamp mechanism 190 is arranged to be able to adjust the height position of the SiC heater 114 and the reflector 116 with respect to the base 110 to an arbitrary position. Accordingly, through the position adjustments realized by plural clamp mechanisms 190, the SiC heater 114 and the reflector 116 may be maintained to a flat horizontal position.

In the internal space 113 of the quartz bell jar 112, connection members 194a~194f are provided for realizing electric connection between the terminals of the SiC heater 114 and the power source cable connection terminals 166a~166f inserted through the base 110 (in FIG. 21, connection members 194a and 194c are shown).

Figure 25:
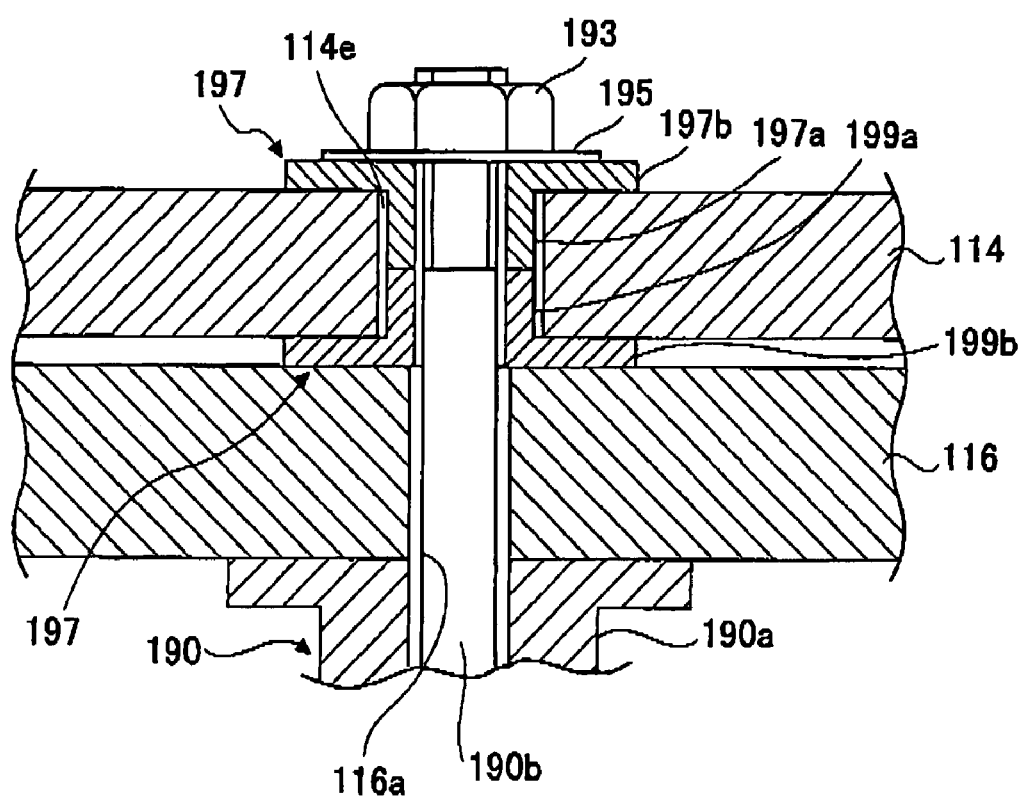
FIG. 25 is an enlarged vertical cross-sectional view of a mounting structure of an upper end portion of a clamp mechanism 190.

FIG. 25 is an enlarged vertical cross-sectional view of a mounting structure of the upper end portion of the clamp mechanism 190.

As is shown in FIG. 25, the clamp mechanism 190 holds the SiC heater 114 by tightening a nut 193 screwed into the upper end of the axis 190b, which is inserted into an insertion hole 116a of the reflector 116 and a insertion hole 114e of the SiC heater 114, and pushing L-shaped washers 197 and 199 in the axial direction via a washer 195.

It is noted that cylinder portions 197a and 199a of the L-shaped washers 197 and 199 are inserted into the insertion hole 114e, and the axis 190b of the clamp mechanism 190 is inserted inside the cylinder portions 197a and 199a. Protruding portions 197b and 199b of the L-shaped washers 197 and 199 are arranged to be in contact with the top and bottom surfaces of the SiC heater 114, respectively.

The axis 190b of the clamp mechanism 190 is biased downward by the spring force of the coil spring 192, and the outer cylinder 190a of the clamp mechanism 190 is biased upward by the spring force of the coil spring 192. In this way, the spring force of the coil spring 192 acts as a clamp force so that the reflector 116 and the SiC heater 114 may be stably held to prevent damaging from vibration upon transportation, for example.

The insertion hole 114e of the SiC heater 114 is arranged to have a larger diameter than the diameters of cylinder portions 197a and 199a of the L-shaped washers 197 and 199, and thereby, a clearance is provided. Accordingly, even when the relative positioning between the insertion hole 114e and the axis 190b is changed in response to thermal expansion occurring due to heat emission of the SiC heater 114, the insertion hole 114e may be shifter in a horizontal direction while maintaining its contact with the protruding portions 197b and 199b of the L-shaped washers 197 and 199 so that generation of stress due to thermal expansion may be prevented.

(3) In the Following, a Description of the SiC Heater 114 is given.

Figure 26:
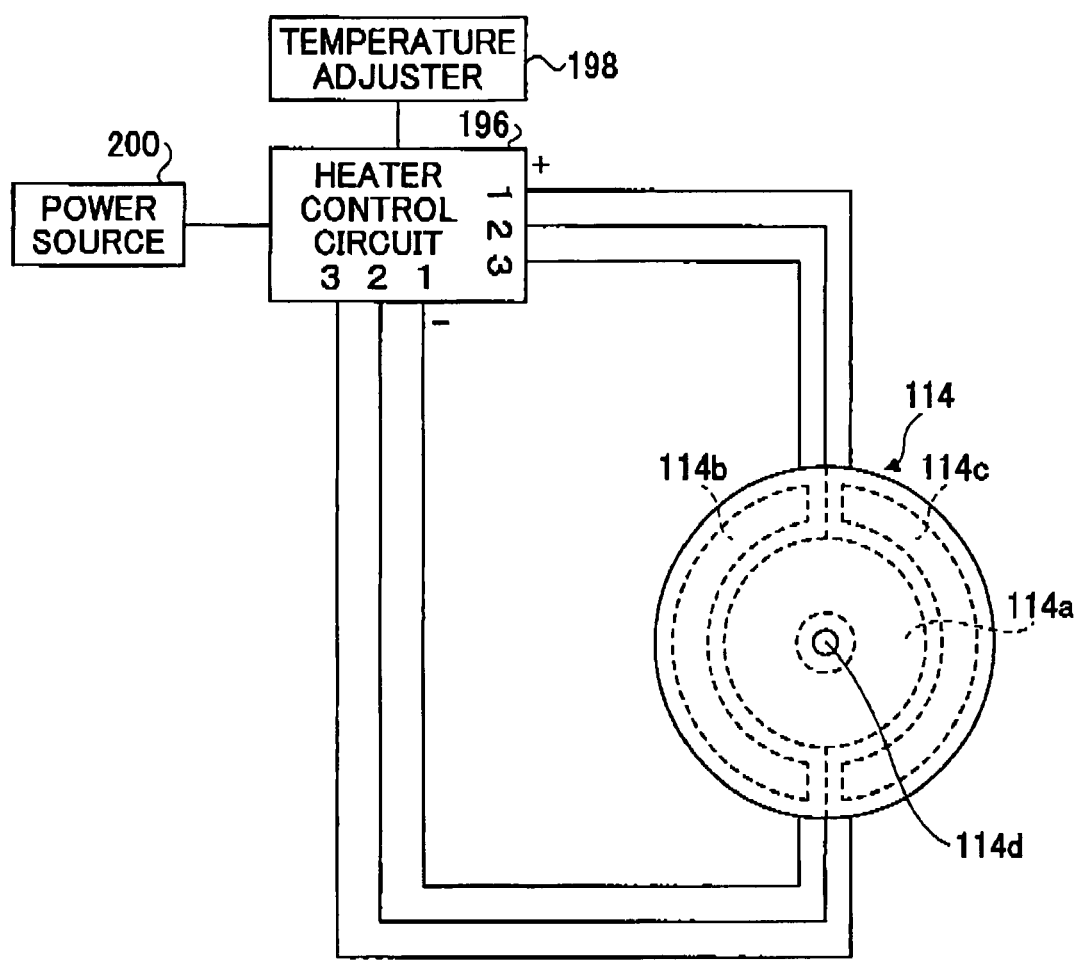
FIG. 26 is a diagram showing a SiC heater 114 and a control system of the SiC heater 114.

FIG. 26 is a diagram showing the SiC heater 114 and a control system of the SiC heater 114.

As is shown in FIG. 26, the SiC heater 114 includes a first heat generation portion 114a and second and third heat generation portions 114b and 114c that are formed into arc-shapes surrounding the outer periphery of the first heat generation portion 114a. Also, at the center of the SiC heater 114, an insertion hole 114d is provided into which the axis 120d of the holding member 120 is inserted.

The heat generation portions 114a~114c are arranged to realize parallel connection with a heater control circuit 196 so as to be controlled and adjusted to an arbitrary temperature that is set by a temperature adjuster 198. The heater control circuit 196 controls the voltage supplied to the heat generation portions 114a~114c from a power source 200 to control the amount of heat being emitted from the SiC heater 114.

It is noted that when the capacities of the heat generation portions 114a~114c differ, the load of the power source 200 increases. Accordingly, in the present embodiment, the resistance of the heat generation portions 114a~114c are set so that their respective capacities may be the same (e.g., 2 KW).

The heater control circuit 196 is configured to select a control method out of plural control methods. For example, the heater control circuit 196 may select control method I for inducing heat generation by simultaneously turning on the heat generation portions 114a~114c; control method II for inducing heat generation of either the first heat generation portion 114a at the center or the second and third heat generation portions 114b and 114c at the outer side according to the temperature distribution of the substrate W; or control method II for inducing simultaneous heat generation of the heat generation portions 114a~114c, or heat generation of either the first heat generation portion 114a or the second and third heat generation portions 114b and 114c according to the temperature change of the substrate W.

It is noted that when the substrate W is rotated along with the holding member 120 to be heated by the heat emission of the heat generation portions 114a~114c, the outer rim portion of the substrate W may warp upward due to a temperature difference between the outer portion and the center portion of the substrate W. However, in the present embodiment, the SiC heater 114 is arranged to heat the substrate W via the SiC susceptor 118 that is provided with good thermal conductivity characteristics, and thereby, heat from the SiC heater 114 may effectively heat the entire substrate W so that the temperature difference created between the outer rim portion and the center portion of the substrate W may be reduced, and the substrate W may be prevented from warping.

(4) In the Following, a Detailed Description of the Quartz Bell Jar is Given.

Figure 27A:
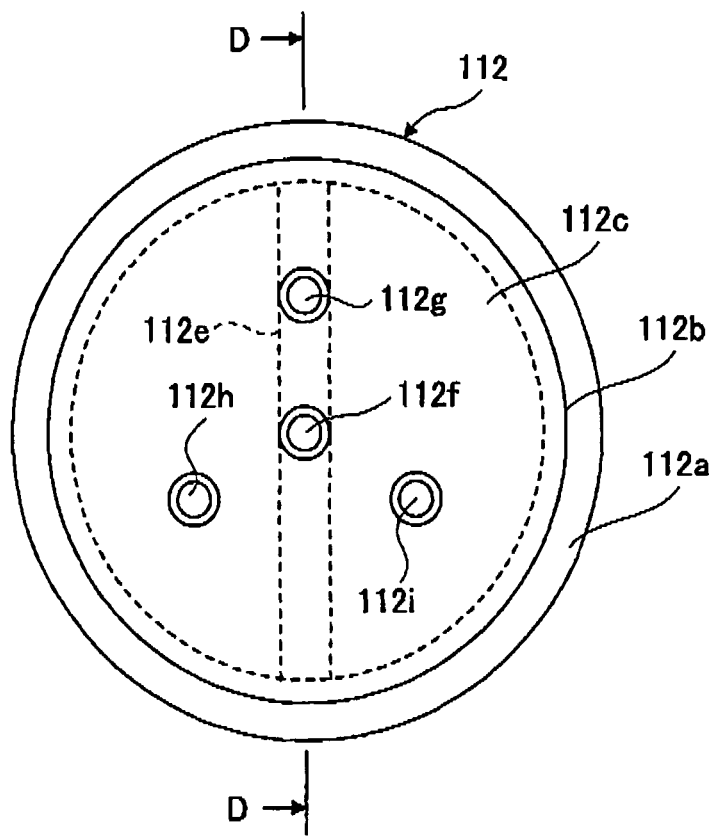
FIG. 27A is a plan view of a quartz bell jar 112.
Figure 27B:
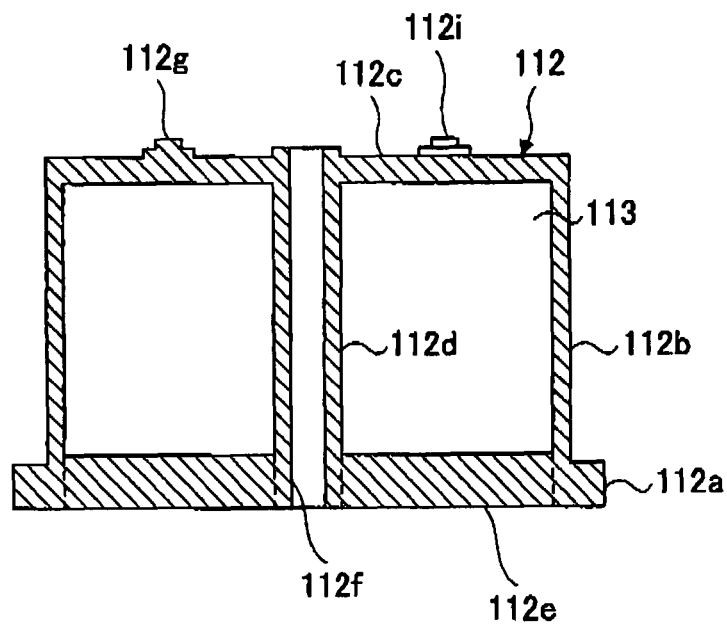
FIG. 27B is a vertical cross-sectional view of the quartz bell jar 112.
Figure 28A:
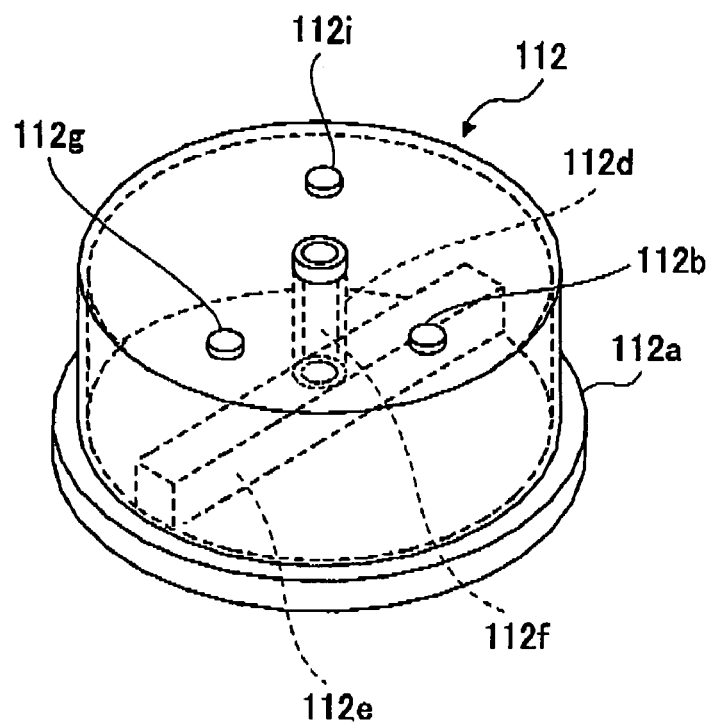
FIG. 28A is an upper side perspective view of the quartz bell jar 112.
Figure 28B:
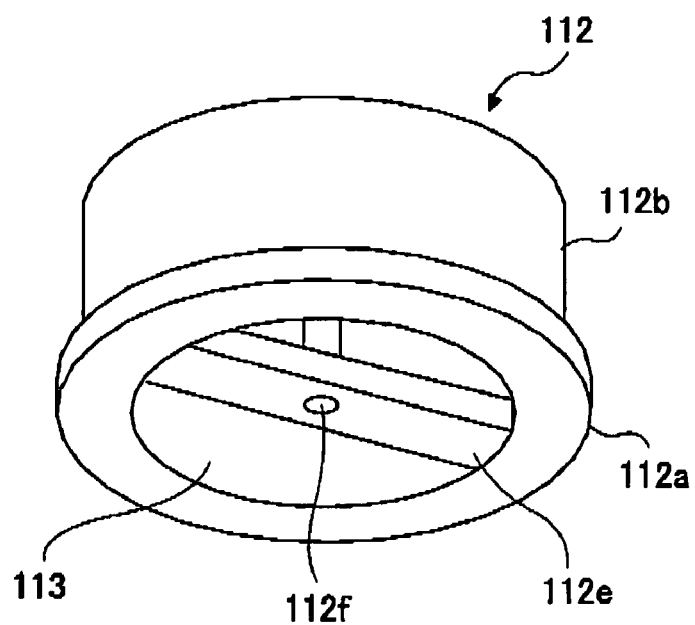
FIG. 28B is an lower side perspective view of the quartz bell jar 112.

FIG. 27A is a plan view of the quartz bell jar 112, and FIG. 27B is a vertical cross-sectional view of the quartz bell jar 112. FIG. 28A is an upper side perspective view of the quartz bell jar 112, and FIG. 28B is an lower side perspective view of the quartz bell jar 112.

As is shown in FIGS. 27A, 27B, 28A, and 28B, the quartz bell jar 112 is made of transparent quartz, and includes a protruding portion 112a, a cylinder portion 112b formed on top of the protruding portion 112a, a top plate 112c covering to top portion of the cylinder portion 112b, a hollow portion 112d that extends downward from the center of the top plate, and a support bridge portion 112e that is arranged across an opening formed at the inner portion of the protruding portion 112a.

The protruding portion 112a and the top plate 112c are arranged to be thicker than the cylinder portion 112b since a load is applied to the protruding portion 112a and the top plate 112c. The quartz bell jar 112 is strengthened in vertical (up-down) directions and radial directions by the hollow portion 112d extending vertically and the support bridge portion 112e extending horizontally that intersect within the quartz bell jar 112.

The bottom end portion of the hollow portion 112d is connected to an intermediate point of the support bridge portion 112e, and an insertion hole 112f formed within the hollow portion 112d extends through the support bridge portion 112e. It is noted that the axis 120d of the holding member 120 is inserted into the insertion hole 112f.

As is described above, the SiC heater 114 and the reflector 116 are inserted into the internal space of the quartz bell jar 112. It is noted that the SiC heater 114 and the reflector 116 are disc-shaped but may be divided into plural arc-shaped regions that are assembled within the internal space 113 after insertion thereof to avoid contact with the support bridge portion 112e.

The top plate 112c of the quartz bell jar 112 includes bosses 112g~112f for supporting the SiC susceptor 118 that protrude from three locations (at 120 degree angles with respect to each other). Accordingly, the SiC susceptor 118 supported by the bosses 112g~112f are arranged to be slightly separated from the top plate 112c. Thereby, even when the internal pressure of the processing vessel 22 changes, or the when the SiC susceptor 118 is moved downward due to temperature change, the SiC susceptor 118 may be prevented from coming into contact with the top plate 112c.

As is described below, the internal pressure of the quartz bell jar 112 is controlled such that its pressure difference with respect to the internal pressure of the processing space 84 may be no more than 50 Torr. Such a control may be realized through evacuation flow control conducted by a depressurization system. According to such an arrangement, the wall thickness of the quartz bell jar 112 may be designed to be relatively thin. For example, the thickness of the top plate 112c may be arranged to be around 6~10 mm so that the heat capacity of the quartz bell jar 112 may be reduced, the heat conductivity characteristics may be improved, and responsiveness to heating may be improved. It is noted that in the present embodiment, the quartz bell jar 112 is designed to be capable of withstanding a pressure of up to 100 Torr.

Figure 29:
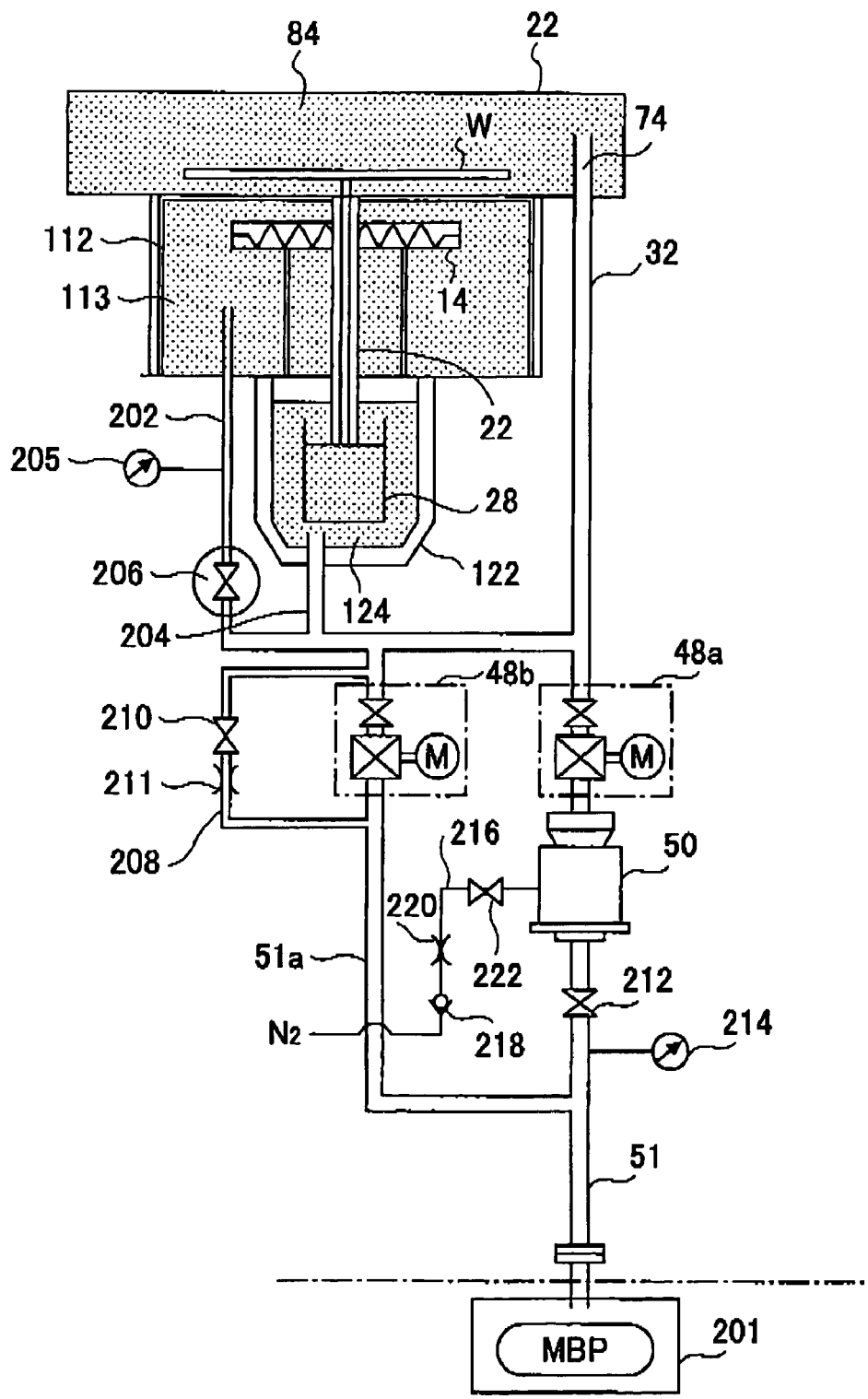
FIG. 29 is a diagram showing an evacuation system of a depressurization unit.

FIG. 29 is a diagram showing an evacuation system of the depressurization system.

As is shown in FIG. 29, the processing space 84 of the processing vessel 22 is depressurized by opening the valve 48a so that gas within the processing space 84 may be evacuated by the suction force of the turbo molecule pump 50 through the evacuation path 32 that is connected to the evacuation opening 74. Further, a pump (MBP) 201 for suctioning the evacuated gas is connected to the downstream side of the vacuum line 51 connected to the evacuation opening of the turbo molecule pump 50.

The internal space 113 of the quartz bell is jar 112 is connected to the bypass line 51a via an evacuation line 202, and the internal space 124 formed by the casing 122 of the rotational drive unit 28 is connected to the bypass line 51a via an evacuation line 204.

The evacuation line 202 is connected to a barometer 205 that measures the pressure of the internal space 113, and a valve 206 that is opened when depressurizing the internal space 113 of the quartz bell jar 112. The bypass line 51a is also connected to the valve 48b, as is described above, and a branch line 208 for bypassing the valve 48b. The branch line 208 is connected to a valve 210 that is opened at an initial stage of a depressurization process, and a variable throttle 211 for restricting the gas flow to a lower flow rate compared to that at the valve 48b.

At the evacuating side of the turbo molecule pump 50, a valve 212 and a barometer 214 for measuring the pressured at the evacuating side are provided. At a turbo line 216 connecting a turbo axis purge N2 line to the turbo molecule pump 50, a check valve 218, a throttle 220, and a valve 22 are provided.

It is noted that in the present embodiment, the valves 206, 210, 212, and 222 correspond to electromagnetic valves that open in response to a control signal from the control circuit.

When conducting a depressurization process on the processing vessel 22, the quartz bell jar 112, and the rotational drive unit 28 in the depressurization system as is described above, depressurization is not conducted at once but is rather conducted in several stages to gradually realize a vacuum state According to the present embodiment, first, the valve 206 provided at the evacuation line 202 of the quartz bell jar 112 is opened so that the internal space 113 of the quartz bell jar 112 and the processing space 84 may be connected via the evacuation path 32 to average out the pressure within the respective spaces. In this way, the pressure difference between the internal space 113 of the quartz bell jar 112 and the processing space 84 may be reduced at the initial stage of the depressurization process.

Then, the valve 210 provided at the branch line 208 is opened to realize depressurization at a gas flow rate that is restricted by the variable throttle 211. Then, the valve 48b provided at the bypass line 51a is opened to increase the evacuation flow rate.

It is noted that the pressure of the quartz bell jar 112 measured by the barometer 205 and the pressure of the processing space 84 measured by the barometers 85a~85c of the sensor unit 85 are compared, and when the difference between the two measured pressures is no more than 50 Torr, the valve 48b is opened. In this way, the pressure difference between the inside and outside of the quartz bell jar 112 is reduced so that the depressurization process may be suitably conducted while protecting the quartz bell jar 112 from undesired stress.

Then, after a predetermined time period elapses, the valve 48a is opened so as to increase the evacuation flow rate by the suction force of the turbo molecule pump 50 and depressurize the internal space of the processing vessel 22, the quartz bell jar 112, and the rotational drive unit 28 to a vacuum state.

(5) In the Following, a Detailed Description of the Holding Member 120 is Given.

Figure 30A:
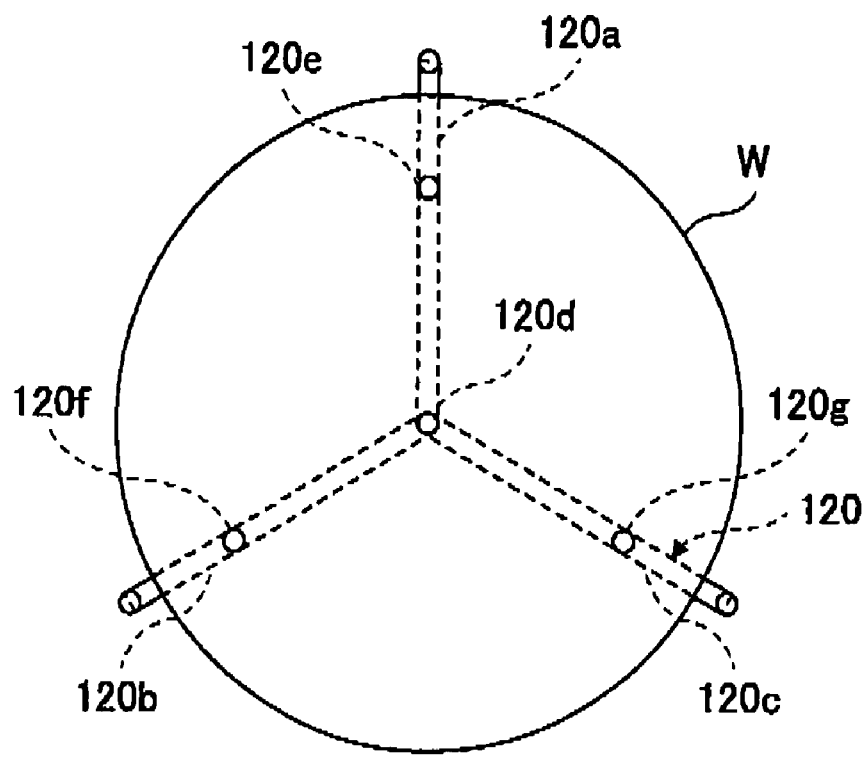
FIG. 30A is a plan view of a holding member 120.
Figure 30B:
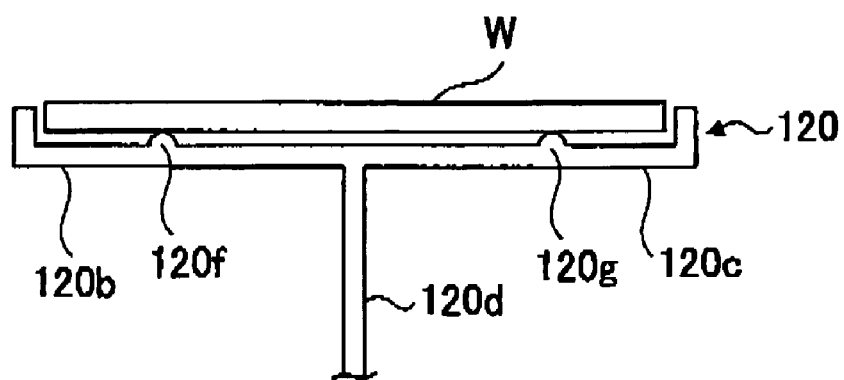
FIG. 30B is a cross-sectional view of the holding member 120.

FIG. 30A is a plan view of the holding member 120, and FIG. 30B is a cross-sectional view of the holding member 120.

As is shown in FIGS. 30A and 30B, the holding member 120 includes arm portions 120a~120c that support the substrate W, and an axis 120d to which the arm portions 120a~120c are connected. The arm portions 120a~120c are arranged to prevent contamination of the processing space 84, and are formed of transparent quartz so as to avoid blocking heat from the SiC susceptor 118. The arm portions 120a~120c extend horizontally in radial directions from the upper end of the axis 120d at 120 degree angles with respect to each other.

Also, at midpoint positions along the lengthwise directions of the arm portions 120a~120c, bosses 120e~120g are provided. The bosses 120e~120g protrude from the upper surface of the arm portions 120a~120c to come into contact with the bottom surface of the substrate W. In this way, the substrate W is supported at thee points that are in contact with the bosses 120e~120g.

As is described above, the holding member 120 is arranged to support the substrate W through point contact, and thereby, the holding member 120 may support the substrate W at a position slightly spaced apart from the SiC susceptor 118. The space (distance) between the SiC susceptor 118 and the substrate W may be arranged to be within a range of 1~20 mm, and preferably within a range of 3~10 mm.

As can be appreciated from the above descriptions, the substrate W is detached from the SiC susceptor 118, and by rotating the substrate W in such a state, the heat from the SiC suceptor 118 may be evenly irradiated onto the substrate W compared to a case in which the substrate W is directly mounted onto the SiC susceptor 118. In this way, the generation of a temperature difference between the outer rim portion and the center portion of the substrate W may be suppressed so that warping of the substrate W due to such a temperature difference may be prevented.

Also, since the substrate W is supported at a position spaced apart from the SiC susceptor 118, even when warping occurs at the substrate W due to the temperature difference, the substrate does not come into contact with the SiC susceptor 118 so that the substrate W may be restored back to its original flat horizontal state when the substrate W is stabilized to have an even temperature distribution.

The axis 120d of the holding member 120 is made of opaque quartz that is formed into a rod-shaped structure. The axis 120d is inserted into the SiC susceptor 118 and the insertion hole 112f of the quartz bell jar 112 and extends downward therefrom. According to the present embodiment, the holding member 120 that holds the substrate W within the processing space 84 is made of quartz so that it is less likely to cause contamination of the processing space 84 compared to a case in which a metal holding member is used.

(6) In the Following, a Detailed Description of the Rotational Drive Unit 28 is Described.

Figure 31:
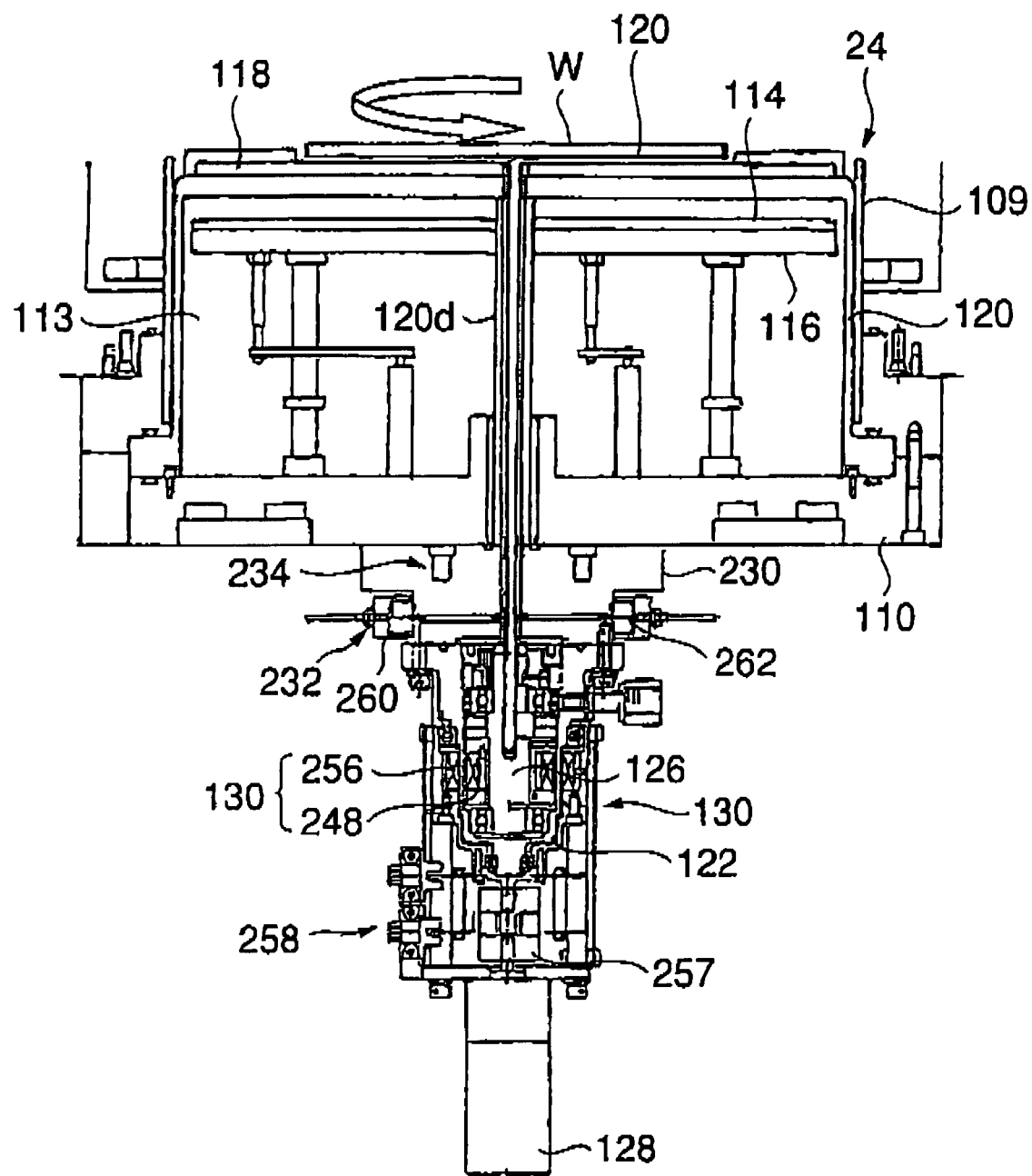
FIG. 31 is a vertical cross-sectional view of a rotational drive unit 28 that is arranged at a lower side of the heater portion 24.
Figure 32:
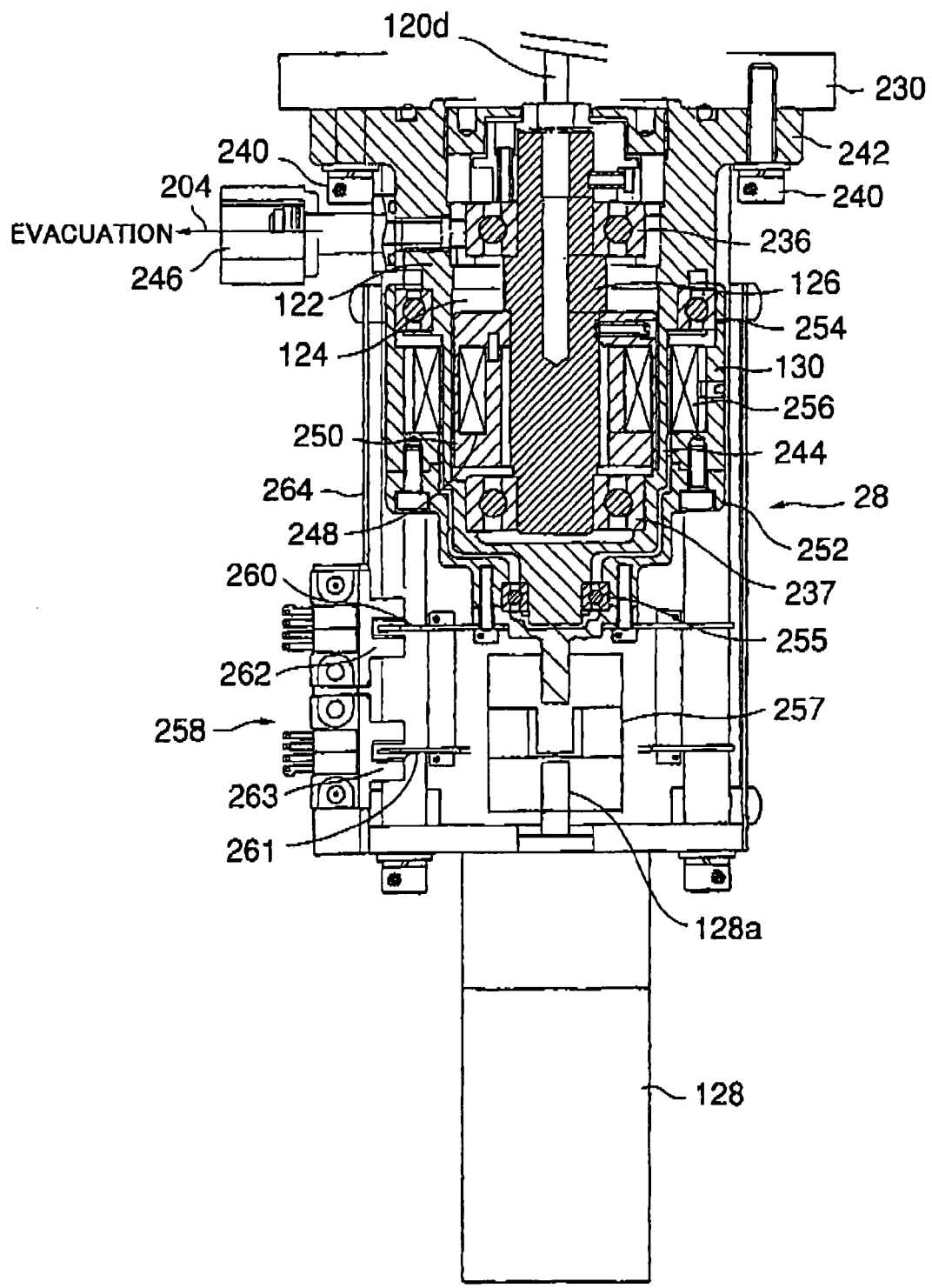
FIG. 32 is an enlarged vertical cross-sectional view of the rotational drive unit 28.

FIG. 31 is a vertical cross-sectional view of the rotational drive unit 28 that is arranged at a lower side of the heater portion 24. FIG. 32 is an enlarged vertical cross-sectional view of the rotational drive unit 28.

As is shown in FIGS. 31 and 32, a holder 230 for supporting the rotational drive unit 28 is attached to the bottom surface of the base 110 of the heater portion 24. The holder 230 includes a rotating position detection mechanism 232 and a holder cooling mechanism 234.

At the bottom side of the holder 230, a ceramic axis 126 is inserted, the ceramic axis 126 having the axis 120d of the holding member 120 inserted therein. Also, a stationary casing 122 that holds ceramic bearings 236 and 237 for supporting the ceramic axis 126 to enable its rotation is fixed to the bottom side of the holder 230 by a bolt 240.

In the casing 122, a rotating portion is formed by the ceramic axis 126 and the ceramic bearings 236 and 237, and thereby, metal contamination may be avoided.

The casing 122 includes a flange 242 into which the bolt 240 is inserted, and a partition wall 244 that is shaped into a cylinder having a bottom wall that extends downward from the flange 242. An evacuation port 246 is provided at the outer periphery of the partition wall 244, the evacuation port 246 being connected to the evacuation line 204 of the depressurization system described above. Gas contained within the internal space 124 of the casing 122 is evacuated by the depressurization system in the evacuation process as is described above. In this way, the gas within the processing space 84 may be prevented fro flowing outside along the axis 120d of the holding member 120.

Also, a driven magnet 248 of the magnet coupling 130 is accommodated within the internal space 124. The driven magnet 248 is covered by a magnet cover 250 that is engaged to the outer periphery of the ceramic axis 126. The magnet cover 250 is provided in order to prevent contamination of the internal space 124 and is arranged to block the driven magnet 248 from coming into contact with the gas contained within the internal space 124.

The magnet cover 250 corresponds to a ring-shaped cover that is made of an aluminum alloy. A smooth annular space is formed within the magnet cover 250, The joint portion of the magnet cover 250 is tightly joined through electron welding so that contamination may be effectively prevented. It is noted that in a case where soldering is conducted, metal such as silver may contaminate the internal space of the magnet cover 250.

Also, a cylinder-shaped atmosphere side rotation unit 252 is engaged to the outer periphery of the casing 122. The atmosphere side rotation unit 252 is supported by bearings 254 and 255 that enable its rotation. At the inner periphery of the atmosphere side rotation unit 252, a drive magnet 256 of the magnet coupling 130 is provided.

The atmosphere side rotation unit 252 has a lower end portion 252a that is connected to a drive axis 128d of the motor 128 via a communication member 257. In this way, the rotation drive force of the motor 128 is transmitted to the ceramic axis 126 through the magnetic force between the drive magnet 256 provided at the atmosphere side rotation unit 252 and the driven magnet 248 provided within the casing 122, which rotation force is then transmitted to the holding member 120 and the substrate W.

Also, a rotation detection unit 258 for detecting the rotation of the atmosphere side rotation unit 252 is provided at the outer side of the atmosphere side rotation unit 252. The rotation detection unit 258 includes disc-shaped slit plates 260 and 261 that are provided at the outer periphery bottom portion of the atmosphere side rotation unit 252, and photo interrupters 262 and 263 that optically detects the amount of rotation of the slit plates 260 and 261.

The photo interrupters 262 and 263 are fixed to the stationary casing 122 by a bracket 264. At the rotation detection unit 258, pulses corresponding to the rotational speed are simultaneously detected by a pair of photo interrupters 262 and 263, and thereby, comparing the detected pulses, higher rotation detection accuracy may be achieved.

Figure 33A:
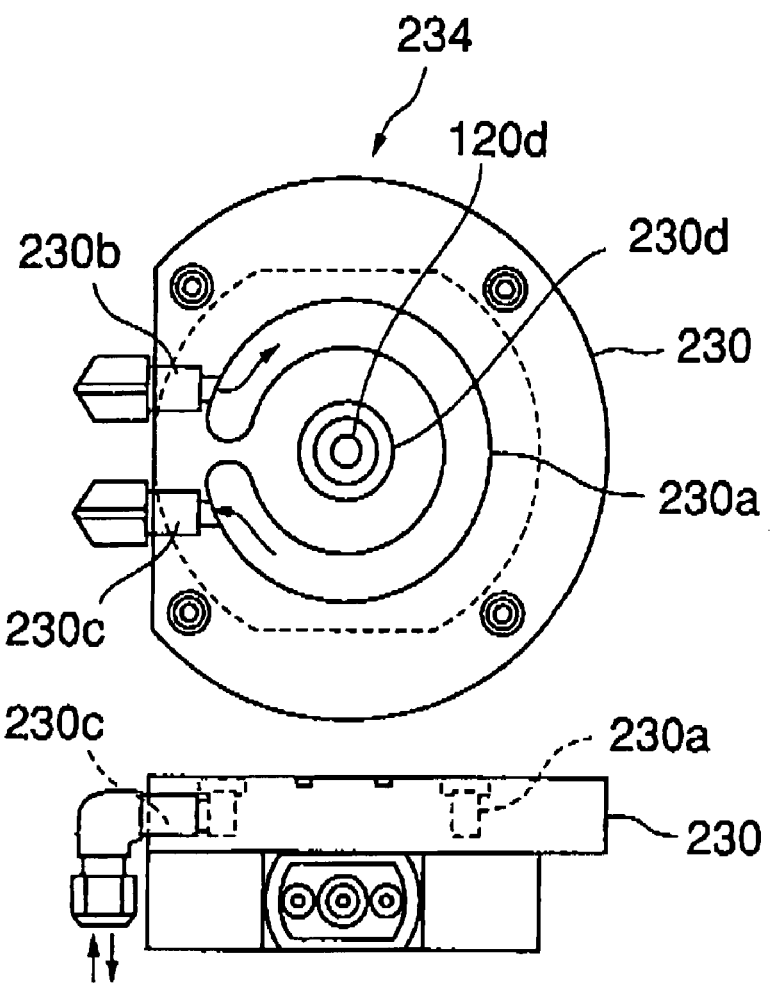
FIG. 33A is a horizontal cross-sectional view of a holder cooling mechanism 234.
Figure 33B:
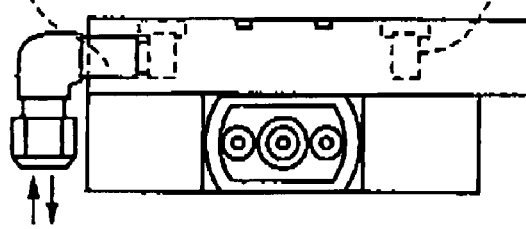
FIG. 33B is a side view of the holder cooling mechanism 234.

FIG. 33A is a horizontal cross-sectional view of the holder cooling mechanism 234. FIG. 33B is a side view of the holder cooling mechanism 234.

As is shown in FIGS. 33A and 33B, the holder cooling mechanism 234 includes a channel 230a that extends along the circumferential direction of at the inner portion of the holder 230 for transferring the coolant. At one end of the channel 230a, a coolant supply port 230b is connected, and at the other end of the channel 230a, a coolant discharge port 230c is connected.

The coolant from the coolant supply unit 46 is supplied from the coolant supply port 230b and passes through the channel 230a to then be discharged from the coolant discharge port 230c In this way, the holder 230 may be cooled.

Figure 34:
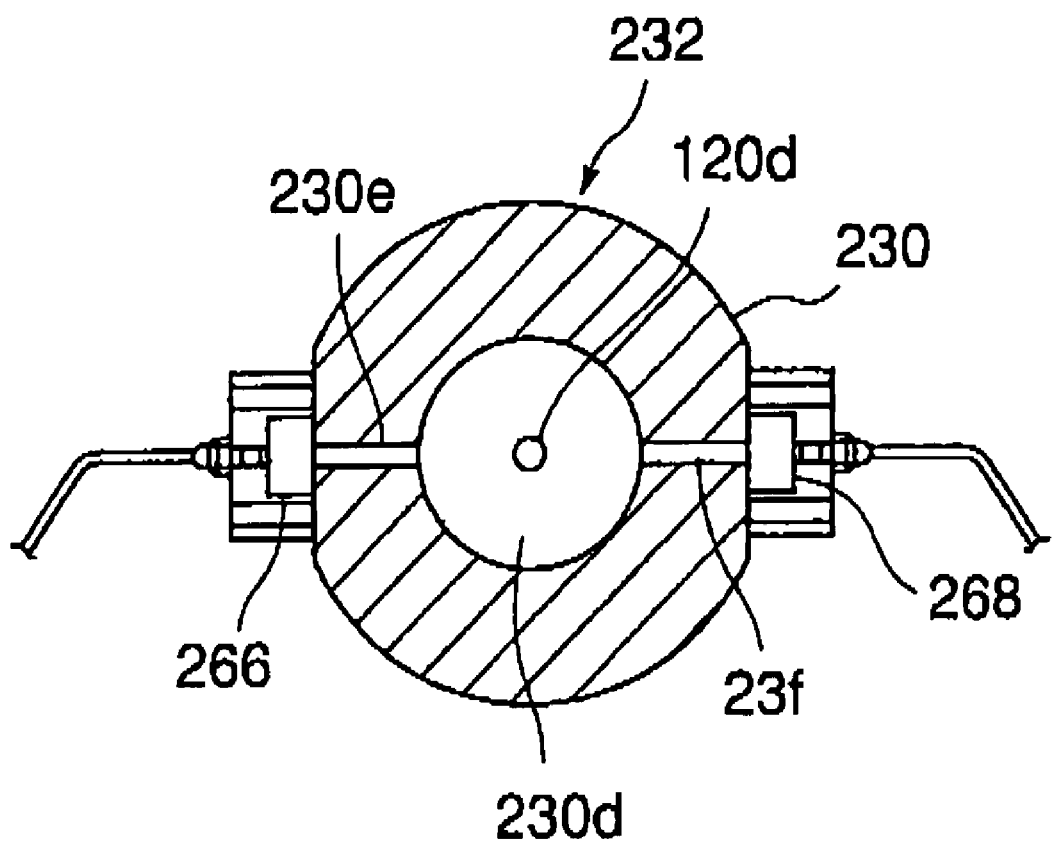
FIG. 34 is a horizontal cross-sectional view of a rotating position detection mechanism 232.

FIG. 34 is a horizontal cross-sectional view of the rotating position detection mechanism 232.

As is shown in FIG. 34, an light emitter 266 is provided at one side of the holder 230, and an optical receiver 268 that receives the light from the light emitter 266 is provided at the other side of the holder 230, A center hole 230d extending in a vertical direction is formed at the center of the holding member 230. It is noted that the axis 120d of the holding member 120 is inserted into the center hole 230. Also, through holes 230e and 230f extending in a horizontal direction are arranged to intersect the center hole 230d.

The light emitter 266 is inserted into one end of the through hole 230e and the optical receiver 268 is inserted into the other end of the through hole 230f. It is noted that the axis 120d is inserted between the through holes 230e and 230f, and thereby, the rotating position of the axis 120d may be detected based on the output change of the optical receiver 268.

(7) In the Following, Detailed Descriptions of the Structure and Function of the Rotation Position Detection Mechanism 232 is Given.

Figure 35A:
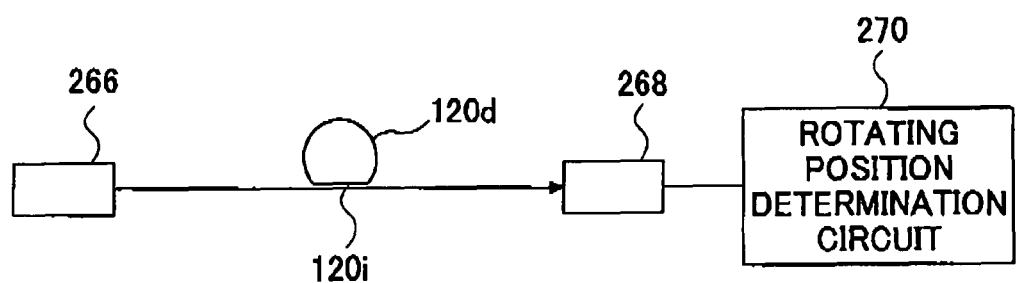
FIG. 35A is a diagram showing a state of non-detection at the rotating position detection mechanism 232.
Figure 35B:
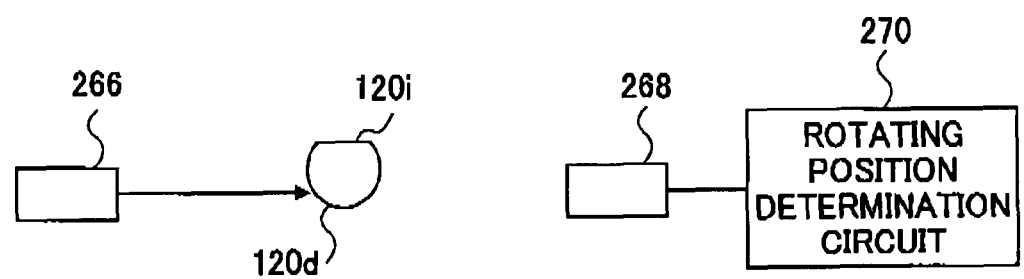
FIG. 35B is a diagram showing a state of detection at the rotating position detection mechanism 232.

FIG. 35A is a diagram showing a state of non-detection at the rotating position detection mechanism 232, and FIG. 35B is a diagram showing a state of detection at the rotating position detection mechanism 232.

As is shown in FIG. 35A, a portion of the outer periphery of the axis 120d of the holding member 120 is chamfered in a tangential direction when the axis 120d of the holding member 120 rotates so that the chamfered portion 120i is positioned at the midpoint between the light emitter 266 and the optical receiver 268, the chamfered portion 12i may be parallel to the light being emitted by the light emitter 266.

In this case, the light from the light emitter 266 passes the chamfered portion 120i to be irradiated to the optical receiver 268. In this way, an output signal S of the optical receiver 268 may be switched on so that the signal may be supplied to a rotating position detection determination circuit 270.

As is shown in FIG. 35B, when the axis 120d of the holding member 120 is rotated so that the chamfered portion 120i moves away from the midpoint position, the light from the light emitter 266 is blocked by the axis s so that the output signal S to the rotating position determination circuit 270 is turned off.

FIG. 36A is a diagram showing a waveform of the output signal S of the optical receiver 268 of the rotating position detection mechanism 232. FIG. 36B is a diagram showing a waveform of a pulse signal P output from the rotating position determination circuit 270.

As is shown in FIG. 36A, the amount of light received from the light emitter 266 (i.e., output signal S) changes in along a parabolic orbit. The rotating position determination circuit 270 is arranged to set a threshold value H for the output signal S, and output a pulse P when the output signal S is greater than or equal to the threshold value H.

The pulse P is output as a detection signal indicating that the rotating position of the holding member 120 has been determined. In other words, the rotating position determination circuit 270 determines that the arm portions 120a~120c of the holding member 120 are in a position at which interference with the contact pins 138a~138c of the lifting arm 132 as well as interference with the robot hand of the carrier robot 98 may be avoided, and outputs the detection signal (pulse P) upon making such a determination.

(8) In the Following, a Rotating Position Control Process is Described That is Executed by the Control Circuit Based on the Detection Signal (Pulse P) Output from the Rotating Position Determination Circuit 270.

Figure 37:
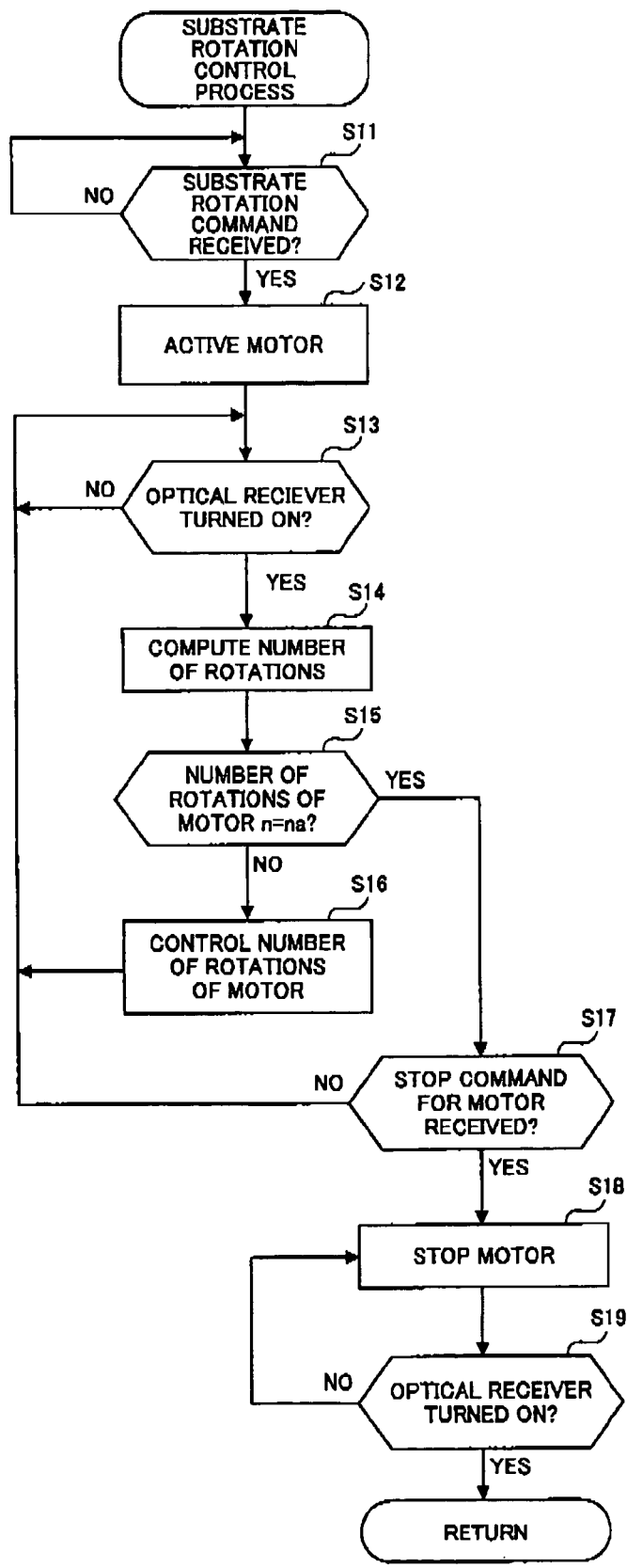
FIG. 37 is a flowchart illustrating a rotating position control process executed by a control circuit.

FIG. 37 is a flowchart illustrating a rotating position control process executed by the control circuit.

As is shown in FIG. 37, when the control circuit receives a control signal directing the rotation of the substrate W in step S11, the process proceeds to step S12 in which step the motor 128 is activated. Then, the process proceeds to step S13 in which step it is determined whether the signal of the optical receiver 268 is turned on. When it is determined that the signal of the optical receiver 268 is turned on in step S13, the process proceeds to step S14 in which step the number of rotations of the holding member 120 and the substrate W is computed based on the period of the detection signal (pulse P).

Then, the process proceeds to step S15 in which step it is determined whether the number of rotations n of the holding member 120 and the substrate W has reached a predetermined number of rotations na. When it is determined in step S15 that the number of rotations n of the holding member 120 and the substrate W has not reached the predetermined number na, the process goes back to step S13 to determine whether the number of rotations of the motor 128 has increased.

When it is determined in step S15 that n=na, this means that the number of rotations n of the holding member 120 and the substrate W has reached the predetermined rotation number na, and thereby the process proceeds to step S17 in which step it is determined whether a control signal for stopping the operation of the motor is received. When it is determined in step S17 that the control signal for stopping the motor 128 is not received, the process goes back to step 513. When it is determined that the control signal for stopping the motor 128 is received, the process proceeds to step S18 in which step the motor 128 is stopped. Then, in step S19, it is determined whether the signal of the optical receiver 268 is turned on. The process step of S19 is repeated until it is determined that the signal of the optical receiver 268 is turned on.

In this way, the holding member 120 and the substrate W may be stopped at a suitable position at which the arm portions 120a~120c of the holding member 120 may not interfere with the contact pins 138a~138c of the lifter arm 132 nor the robot hand of the carrier robot 98.

It is noted that in the rotating position control process of the present example, the number of rotations is determined based on the period of the output signal from the optical receiver 268. However, the present invention is not limited to such an example, and in an alternative example, the number of rotations may be determined by multiplying the signal output from the photo interrupters 262 and 263.

(9) In the Following, Detailed Descriptions of the Windows 75 and 76 Formed at the Side Surface of the Processing Vessel 22 are Given.

Figure 38:
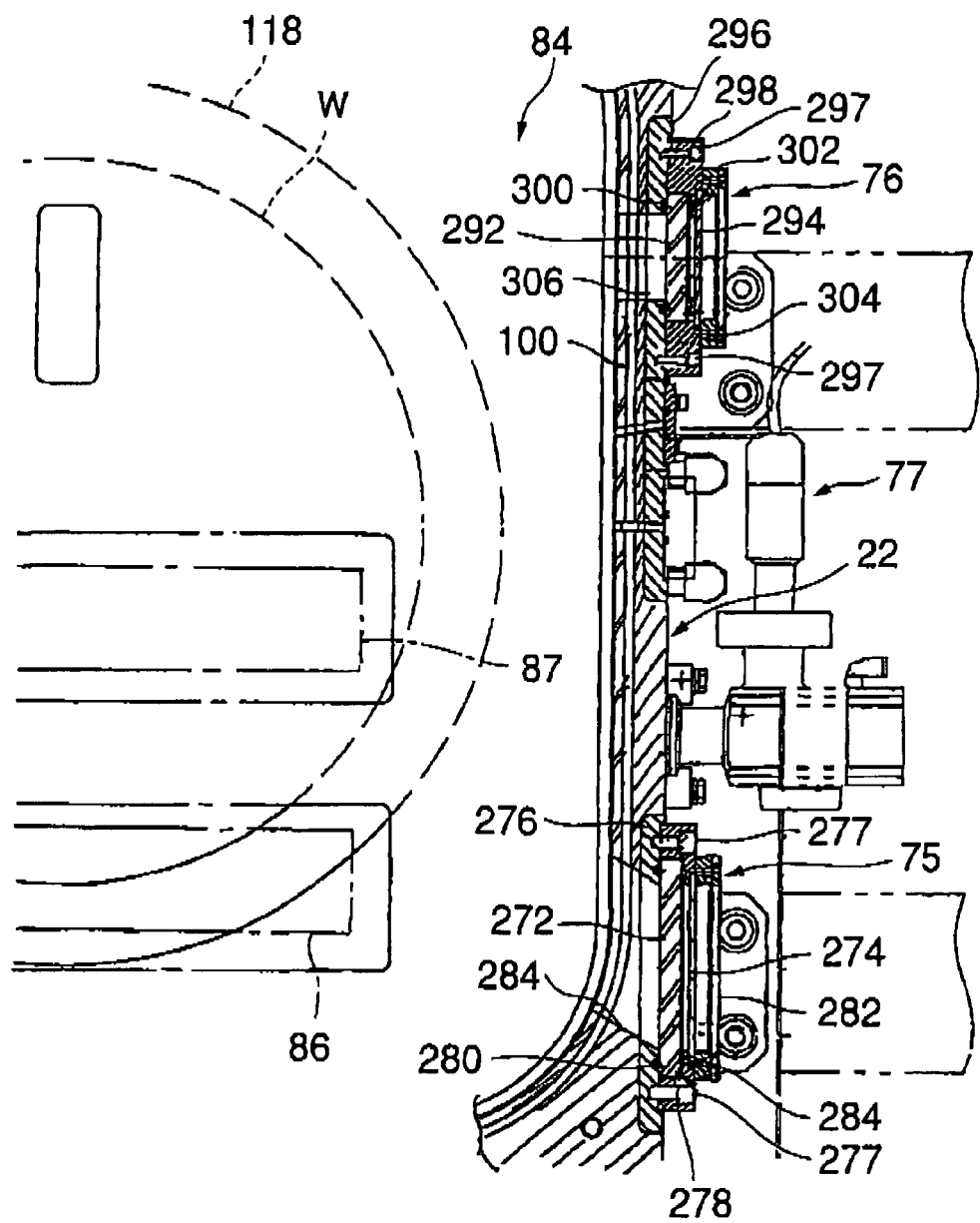
FIG. 38 is a horizontal cross-sectional view of mounting portions of windows 75 and 76.
Figure 39:
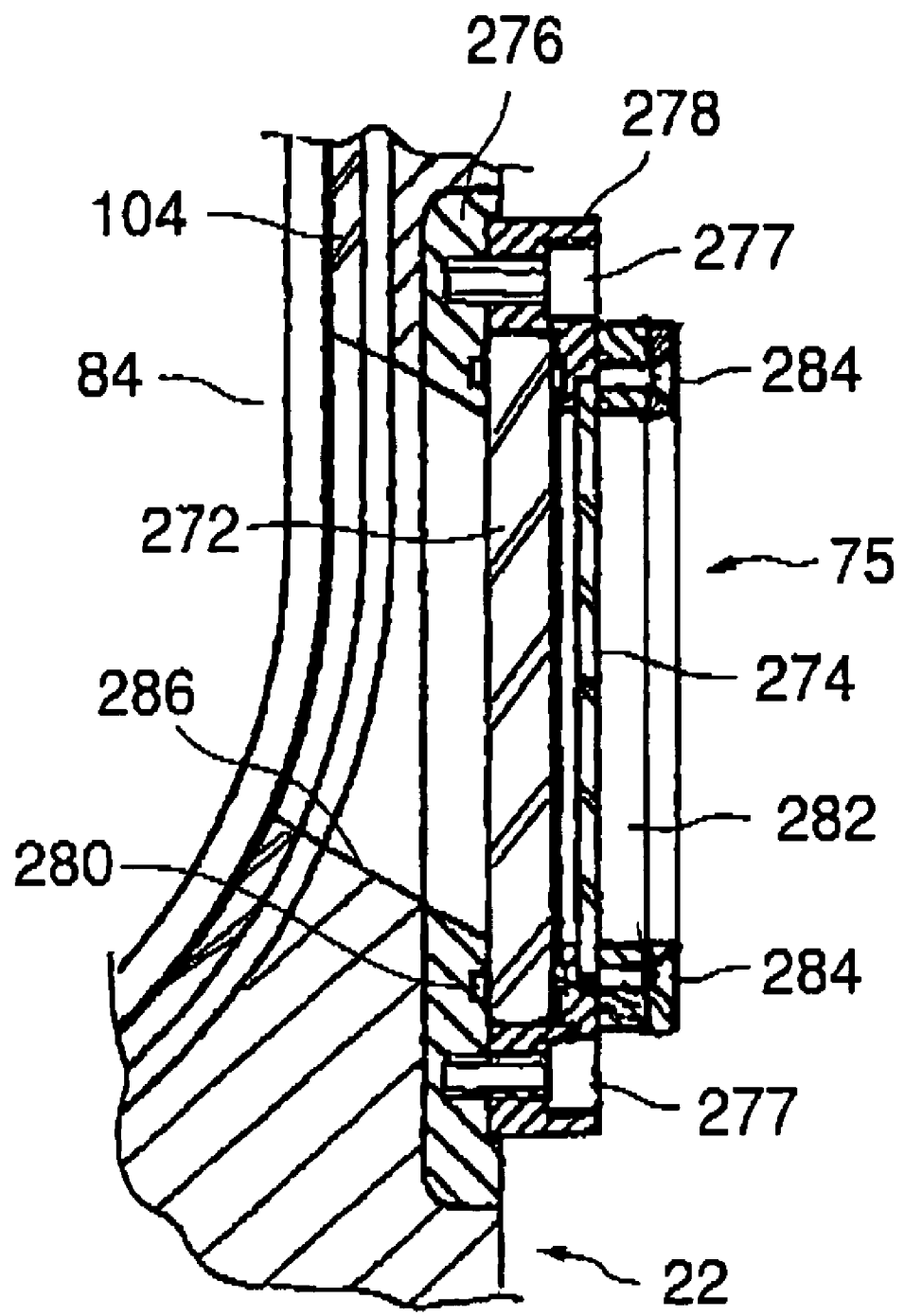
FIG. 39 is an enlarged horizontal cross-sectional view of the window 75.
Figure 40:
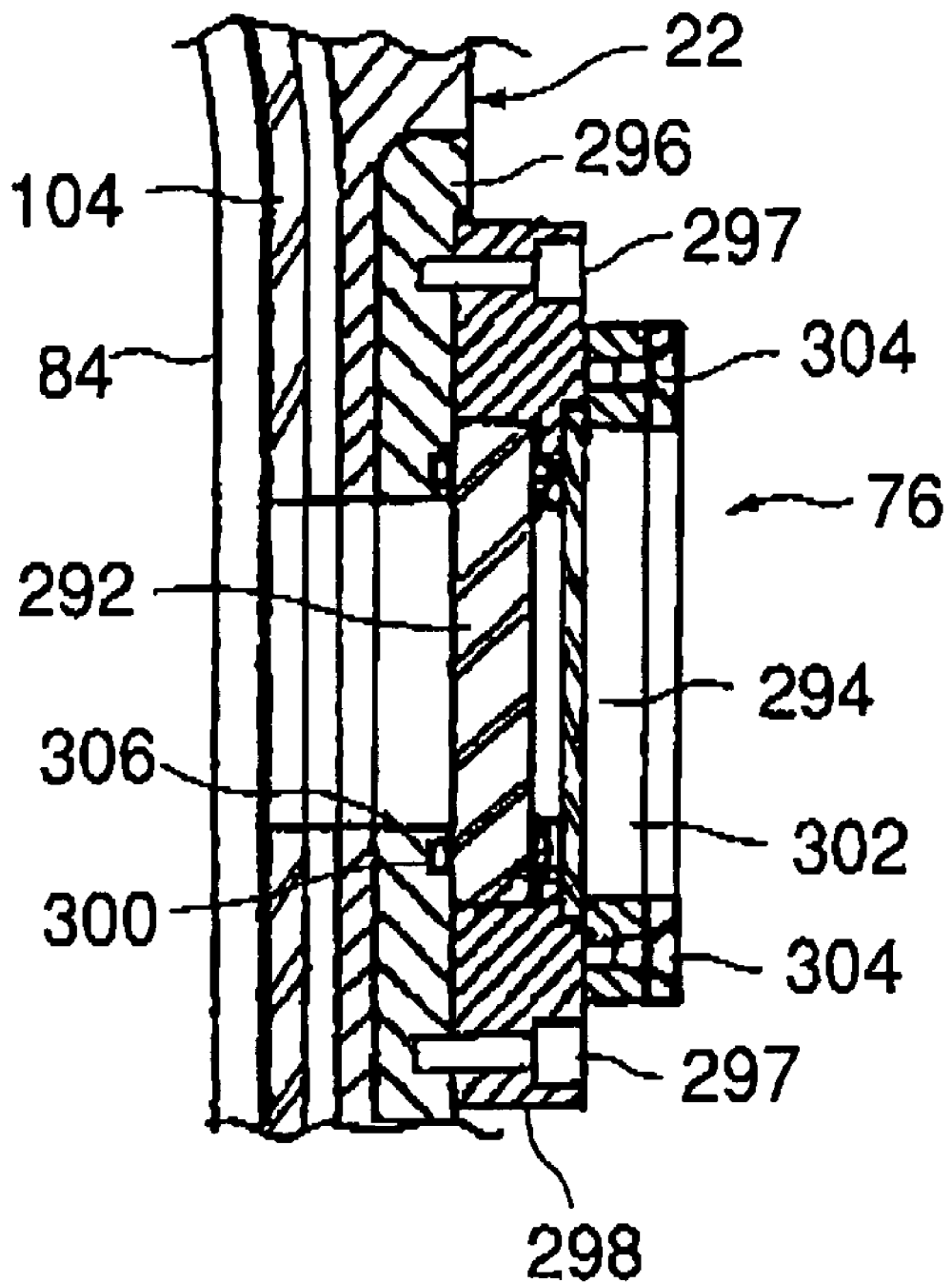
FIG. 40 is an enlarged horizontal cross-sectional view of the window 76.

FIG. 38 is a horizontal cross-sectional view of mounting portions of windows 75 and 76. FIG. 39 is an enlarged horizontal cross-sectional view of the window 75. FIG. 40 is an enlarged horizontal cross-sectional view of the window 76.

As is shown in FIGS. 38 and 39, effective sealing characteristics are achieved at the first window 75, taking into consideration the fact that gas is supplied to the processing space 84 formed within the processing vessel 22 and is depressurized into a vacuum state.

The window 75 is configured into a dual structure including transparent quartz 272 and UV protection glass 274. The transparent quartz 272 is held in contact with a window mounting part 276, and is fixed in place by attaching a first window frame 278 to the window mounting part 276 with a screw 277. At the outer surface of the window mounting part 276, a seal member (O-ring) 280 is provided in order to realize a hermetic seal with the transparent quartz 272. The UV protective glass 274 is held in contact with the outer surface of the first window frame 278, and fixed thereto by attaching a screw 284 to a second window frame 282.

The window 75 is designed so that the ultraviolet light irradiated from the ultraviolet light source (UV lamp) 86 and 87 is blocked by the UV protective glass 274 to prevent the ultraviolet light from penetrating out of the processing space 84. Also, owing to the sealing effect provided by the seal member 280, gas is prevented from leaking out of the processing space 84.

It is noted that an opening 286 is formed at the side of the processing vessel 22 in a diagonal direction to be directed to the center of the substrate W that is held by the holding member 120. The window 75 is shifted away from the center of the side wall of the processing vessel 22 and formed into an oval shape extending in a horizontal direction so that the state of the substrate W may be observed from the outside.

Also the second window 76 has a configuration similar to that of the first 75 as is described above. That is, the second window 76 has a dual structure including transparent quartz 292 and UV protective glass 294 that blocks ultraviolet light. The transparent quartz 292 is held in contact with a window mounting part 296 and a first window frame 298 is fixed to the window mounting part 296 by a screw 297. A seal member (O-ring) 300 is provided on the outer surface of the window mounting part 296 to realize a hermetic seal with the transparent quartz 292. Also, the UV protective glass 294 is held in contact with the outer surface of the first window frame 298, and a second window frame 302 is fixed thereto with a screw 304.

The second window 76 is designed such that ultraviolet light irradiated from the ultraviolet light source (UV lamp) 86 and 87 may be blocked by the UV protective glass 294 to prevent the ultraviolet light from penetrating out of the processing space 84, and owing to the sealing effect of the seal member 300, gas supplied to the processing space 84 is prevented from leaking outside.

It is noted that in the present embodiment, a pair of windows 75 and 76 are provided at a side surface of the processing vessel 22. However, the present invention is not limited to such an embodiment, and for example, more than two windows may be provided, or the windows may be provided at a location other than the side surface of the processing vessel 22.

(10) In the Following, Descriptions of a Quartz Liner 100, and Cases 102, 104, 106, and 108 Making up the Quartz Liner 100 are Given.

As is shown in FIGS. 9 and 10, the quartz liner 100 includes a bottom portion case 102, a side portion case 104, a top portion case 106, and a cylinder case 108. The cases 102, 104, 106, and 108 are made of opaque quartz and are provided in order to protect the processing vessel 22 made of aluminum alloy from gas and ultraviolet light as well as to prevent metal contamination of the processing space 84 by the processing vessel 22.

FIG. 41A is a plan view of the bottom portion case 102, and FIG. 41B is a side view of the bottom portion case 102.

As is shown in FIGS. 41A and 41B, the bottom portion case 102 corresponds to a flat plate that is formed into a shape corresponding to the profile of the inner wall of the processing vessel 22. At the center of the bottom portion case 102, a circular opening 310 is formed facing against the SiC susceptor 118 and the substrate W The dimension of the circular opening 310 is arranged such that the cylinder case 108 may be inserted through this circular opening 310, and at the inner perimeter of the circular opening 310, recessed portions 310a~310c for inserting the ends of the arm portions 120a~120c of the holding member 120 are formed at 120 degree angles with respect to each other.

It is noted that the recessed portions 310a~310c are positioned such that the arm portions 120a~120c inserted thereto may not interfere with the contact pins 138a~138c of the lifter arm 132 nor the robot hand of the carrier robot 98.

The bottom portion case 102 includes a rectangular opening 312 positioned to face against the evacuation opening 74. Also, on the bottom surface of the bottom portion case 102, positioning protrusions 314a and 314b are provided at asymmetric positions with respect to each other.

Further, at the inner perimeter of the circular opening 310 a recessed portion 310d is formed that engages with a protrusion of the cylinder base 108 that is described below. At the peripheral rim portion of the bottom case 102, a stepped portion 315 is formed that engage with the side portion case 104.

FIG. 42A is a plan view of the side portion case 104, FIG. 42B is an elevation view of the side portion case 104, FIG. 42C is a rear view of the side portion case 104, FIG. 42D is a left side view of the side portion case 104, and FIG. 42E is a right side view of the side portion case 104.

As is shown in FIGS. 42A~42E, the external configuration of the side portion case 104 is arranged to correspond to the internal profile of the processing vessel 22; that is, the side portion case 104 is shaped into a substantially rectangular frame structure with its four corners formed into R-shapes, inside which structure the processing space 84 is formed.

Also, the side portion case 104 includes a front side 104a that has a narrow rectangular slit 316 formed thereon, the slit 316 extending in a horizontal direction to face against the plural injection openings 93a of the gas injection nozzle unit 93. The front side 104a of side portion case 104 also has a U-shaped opening 317 positioned to face against the connection hole connecting to the remote plasma part 27, It is noted that in the present embodiment, the slit 316 and the opening 317 are arranged to be connected to each other. However, the present invention is not limited to such as arrangement, and the slit 316 and the opening 317 may also be independently formed.

Also, the side portion case 104 includes a rear side 104b that has a recessed portion 318 for allowing the robot hand of the carrier robot 98 to pass through, the recessed portion 318 being arranged to face against the carrier opening 94.

Also, the side portion case 104 includes a left side 104c that has a circular hole 319 arranged to face against the sensor unit 85, and a right side 104d that has holes 320~322 arranged to face against the windows 75 and 76, and the sensor unit 77.

FIG. 43A is a bottom view of the top portion case 106, and FIG. 43B is a side view of the top portion case 106.

As is shown in FIGS. 43A and 43B, the top portion case 106 corresponds to a flat plate of which external profile matches the internal profile of the processing vessel 22. The top portion case 106 includes rectangular openings 324 and 325 that are positioned to face against the ultraviolet light sources (UV lamps) 86 and 87. At the peripheral rim portion of the top portion case 106, a stepped portion 326 is formed that engages with the side portion case 104.

Also, the top portion case 106 includes circular holes 327~329 corresponding to the shape of the lid member 82, and a rectangular hole 330.

Figure 44A:
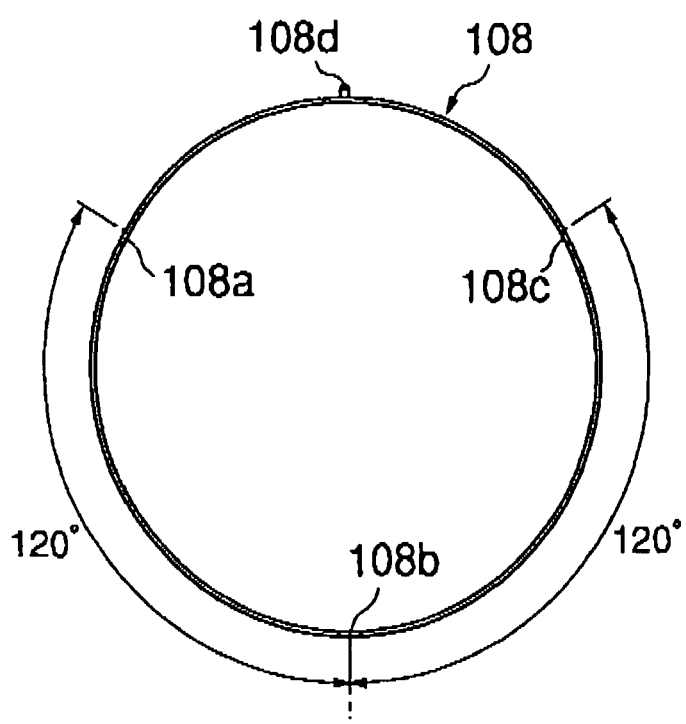
FIG. 44A is a plan view of a cylindrical case 108.
Figure 44B:
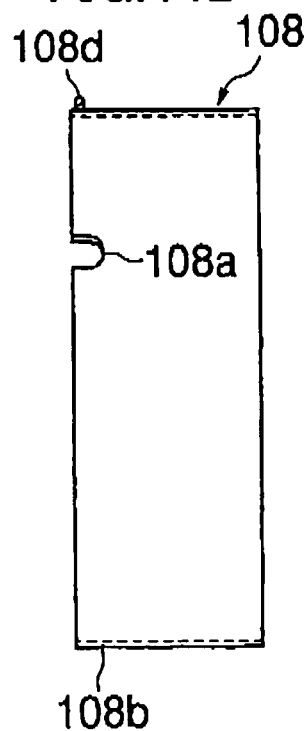
FIG. 44B is a cross-sectional view of the cylindrical case 108.
Figure 44C:
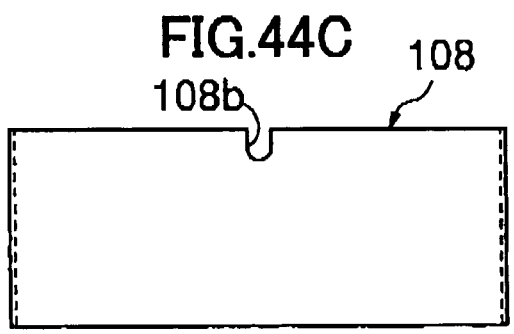
FIG. 44C is a side view of the cylindrical case 108.

FIG. 44A is a plan view of the cylindrical case 108, FIG. 44B is a cross-sectional view of the cylindrical case 108, and FIG. 44C is a side view of the cylindrical case 108.

As is shown in FIGS. 44A~44C, the cylinder case 108 is formed into a cylinder structure that covers the outer periphery of the quartz bell jar 112. At the top end rim portion of the cylinder case 108, recessed portions 108a~108c for inserting the contact pins 138a~138c of the lifter arm 132 are provided. Also, at the top end of the outer periphery of the cylinder case 108, a positioning protrusion 108d is formed that engages with the recessed portion 310d of the bottom portion case 102.

(11) In the Following, a Seal Structure for the Lifter Mechanism 30 is Described.

Figure 45:
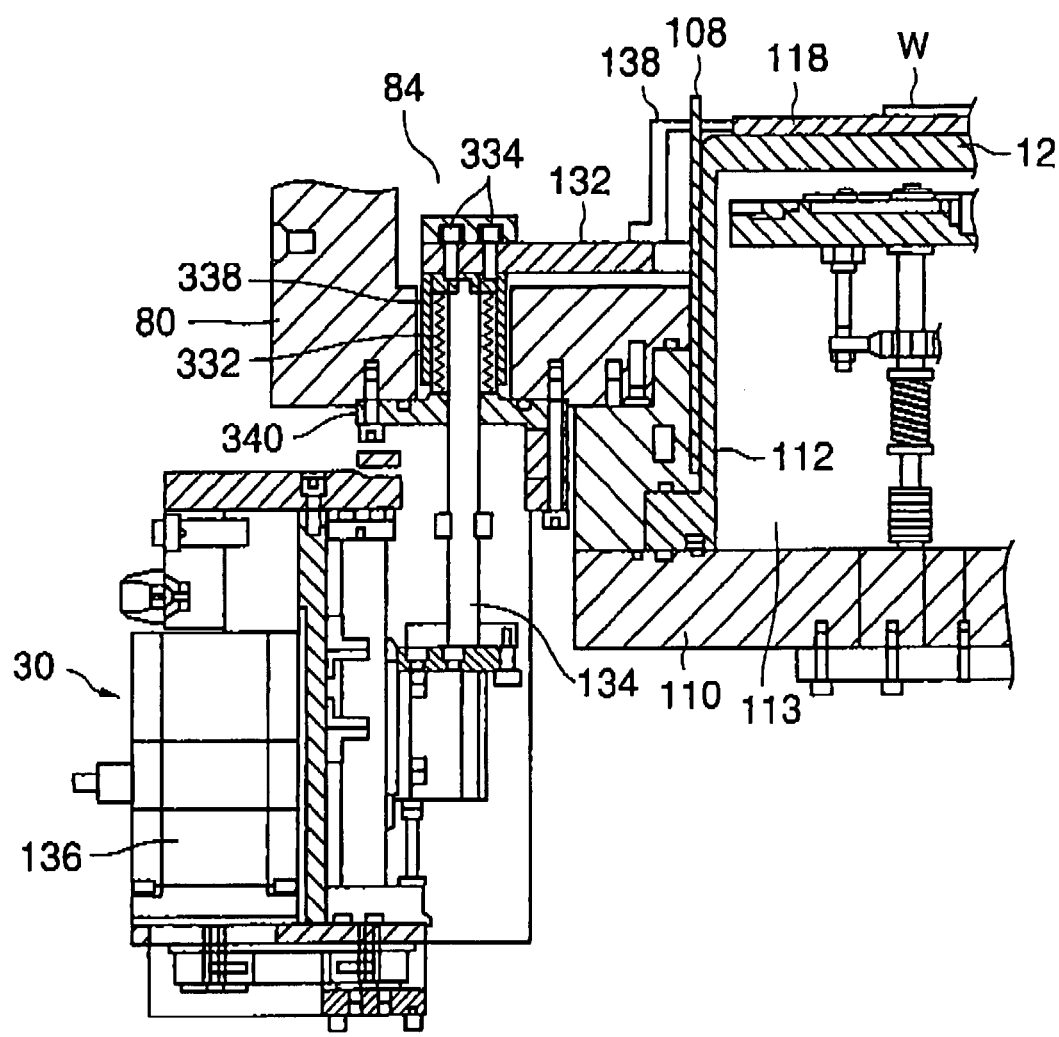
FIG. 45 is an enlarged vertical cross-sectional view of a lifter mechanism 30.
Figure 46:
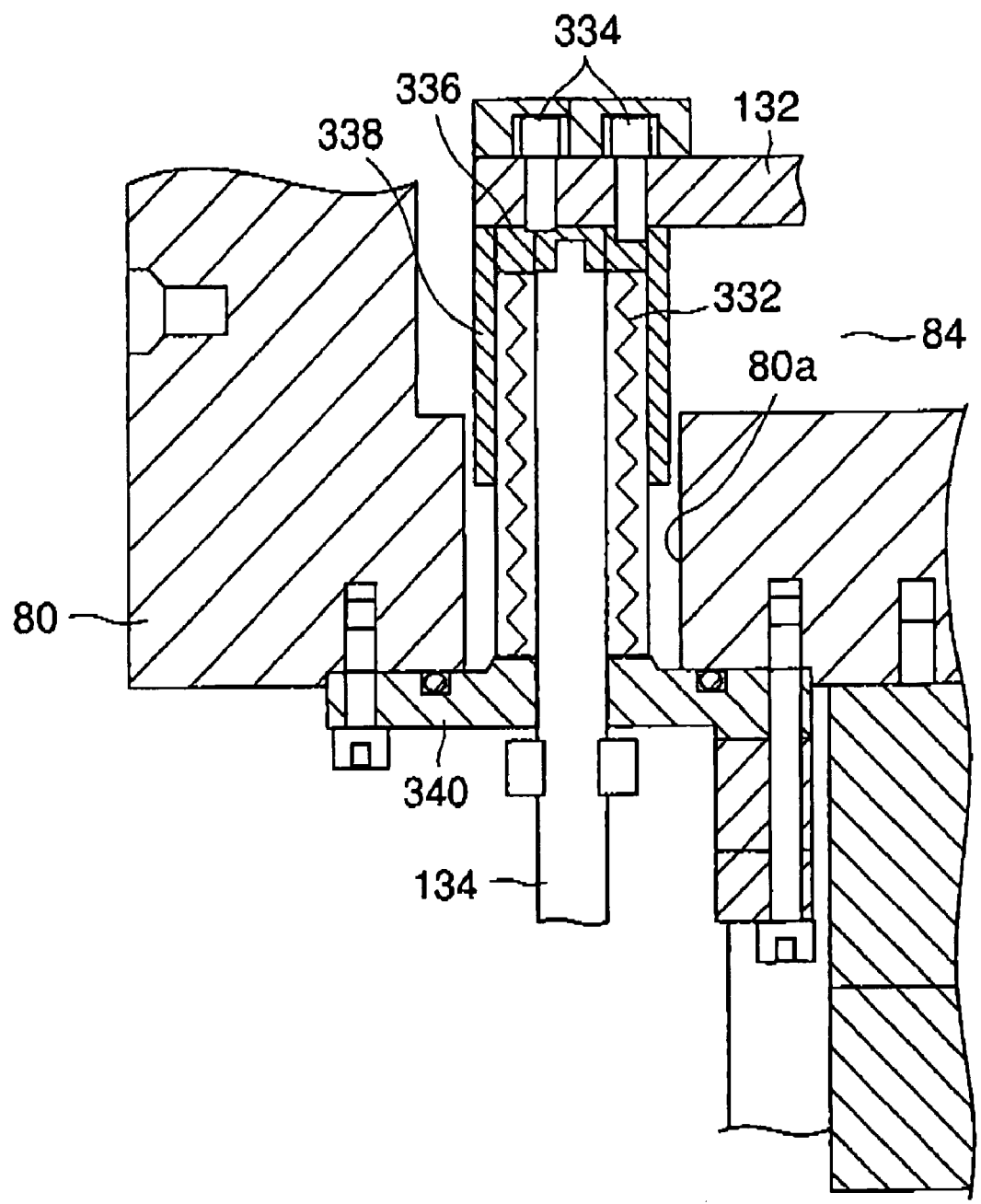
FIG. 46 is an enlarged vertical cross-sectional view of a seal structure of the lifter mechanism 30.

FIG. 45 is an enlarged vertical cross-sectional view of the lifter mechanism 30. FIG. 46 is an enlarged vertical cross-sectional view of the seal structure of the lifter mechanism 30.

As is shown in FIGS. 45 and 46, the lifter mechanism 30 raises and lowers the lifter axis 134 using the drive unit 136 to raise or lower the lifter arm 132 inserted into the chamber 80. The external periphery of the lifter axis 134, which is inserted into a thorough hole 80a of the chamber 80, is covered by a cornice-shaped bellows 332 so that contamination within the chamber 80 may be prevented.

The bellows 332 is arranged to expand and contract at the cornice-shaped portion, and may be formed of Inconel or Hastelloy, for example. Also, the thorough hole 80a is closed by a lid member 340 through which the lifter axis 134 is inserted.

Also, at the top end of the lifter axis 134, a connecting member 336 is provided that is attached to the lifter arm 132 by bolts 334, and the connecting member 336 is engaged with a ceramic cover 338 to be fixed in place. The ceramic cover 338 extends lower than the connecting member 336, and covers the outer periphery of the bellows 332 to prevent its exposure within the chamber 80.

According to the present embodiment, when the lifter arm 132 is raised into the processing space 84, the bellows 332 stretches upward while being covered by the ceramic cover 338. In this way, the bellows 332 may be protected from direct exposure to the gas and heat within the processing space 84 by the cylinder cover 338 that is movably inserted in the through hole 80a to thereby prevent degradation of the bellows by the gas and heat in the processing space 84.

(12) In the Following, an Ultraviolet Radical Oxidation Process and a Remote Plasma Radical Nitridation Process That are Conducted on the Substrate W Using the Substrate Processing Apparatus 20 of FIG. 2 are Described.

Ultraviolet Radical Oxidation (UV—$O_2$) Processing

Figure 47A:
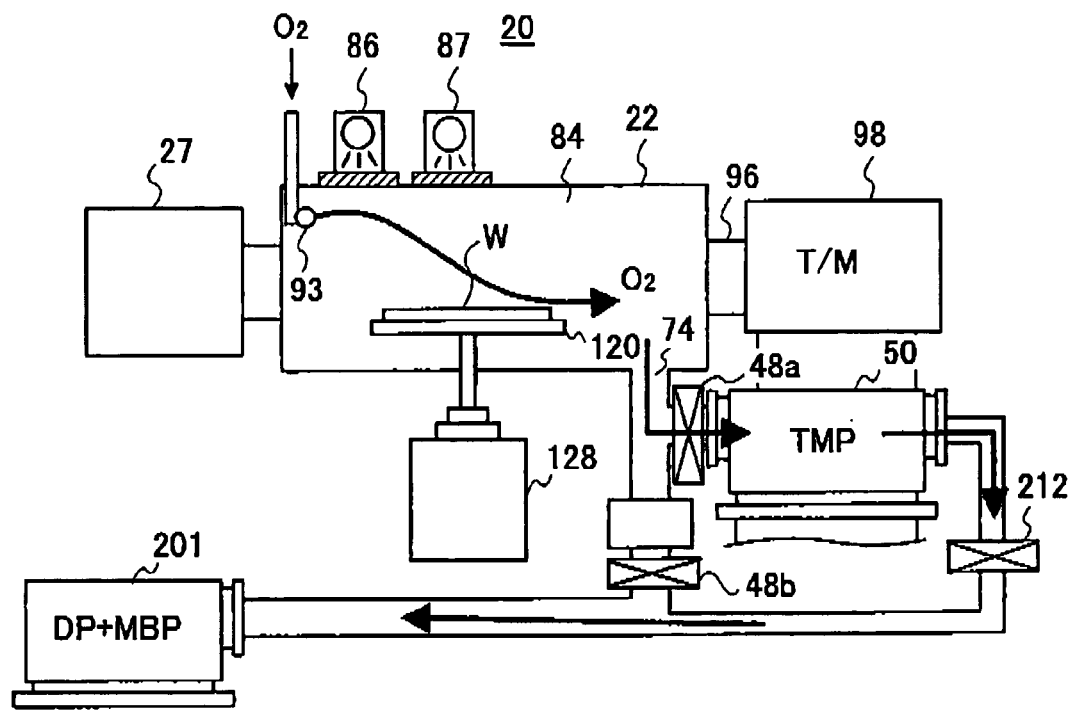
FIG. 47A is a side view of the substrate processing apparatus 20 of FIG. 2 conducting a radical oxidation process on a substrate W.
Figure 47B:
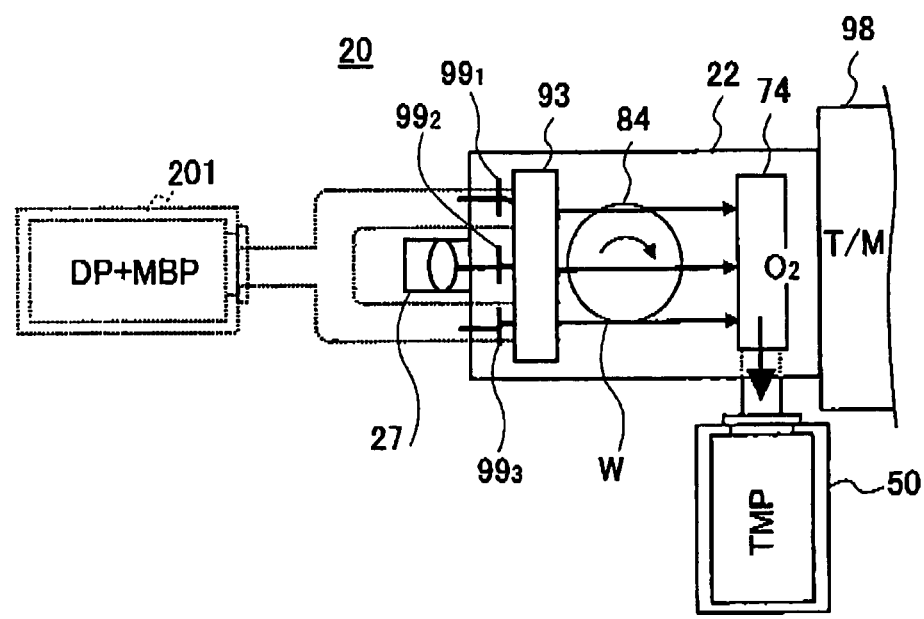
FIG. 47B is a diagram showing the structure of FIG. 47B in plan view.

FIG. 47A is a diagram showing the radical oxidation process of the substrate W by using the substrate processing apparatus 20 of FIG. 2 respectively in a side view and a plan view. FIG. 47B shows the construction of FIG. 47A in a plan view.

Referring to FIG. 47A, an oxygen gas is supplied to the processing space 84 from the process gas supplying nozzle 93 and the oxygen gas thus supplied is evacuated, after flowing along the surface of the substrate W, via the evacuation port 74, turbo molecular pump 50 and the pump 201. By using the turbo molecular pump 50, the base pressure in the processing space 84 is set to the level of $1 \times 10^{-3}$-$10^{-6}$ Torr, which is needed for the oxidation of the substrate by oxygen radicals.

Simultaneously to this, the ultraviolet source 86, 87 preferably the one that produces ultraviolet radiation of 172 nm wavelength, is activated, and oxygen radicals are formed in the oxygen gas flow thus formed. The oxygen radicals thus formed cause oxidation of the substrate surface as they are caused to flow along the rotating substrate W. Thus, as a result of the oxidation of the substrate W by the ultraviolet-activated oxygen radicals (referred to hereinafter as UV—$O_2$ processing), a very thin oxide film having a thickness of 1 nm or less, particularly the thickness of about 0.4 nm corresponding to the thickness of 2-3 atomic layers, is formed on a surface of a silicon substrate stably and with excellent reproducibility.

Referring to FIG. 47B, it can be seen that the ultraviolet source 86, 87 is a tubular light source extending in the direction crossing the direction of the oxygen gas flow. Further, it can be seen that the turbo molecular pump 50 evacuates the processing space 84 via the evacuation port 74. Further, it should be noted that the evacuation path, designated in FIG. 47B by a dotted line and extending directly from the evacuation port 74 to the pump 50, is closed by closing the valve 48b.

Figure 48:
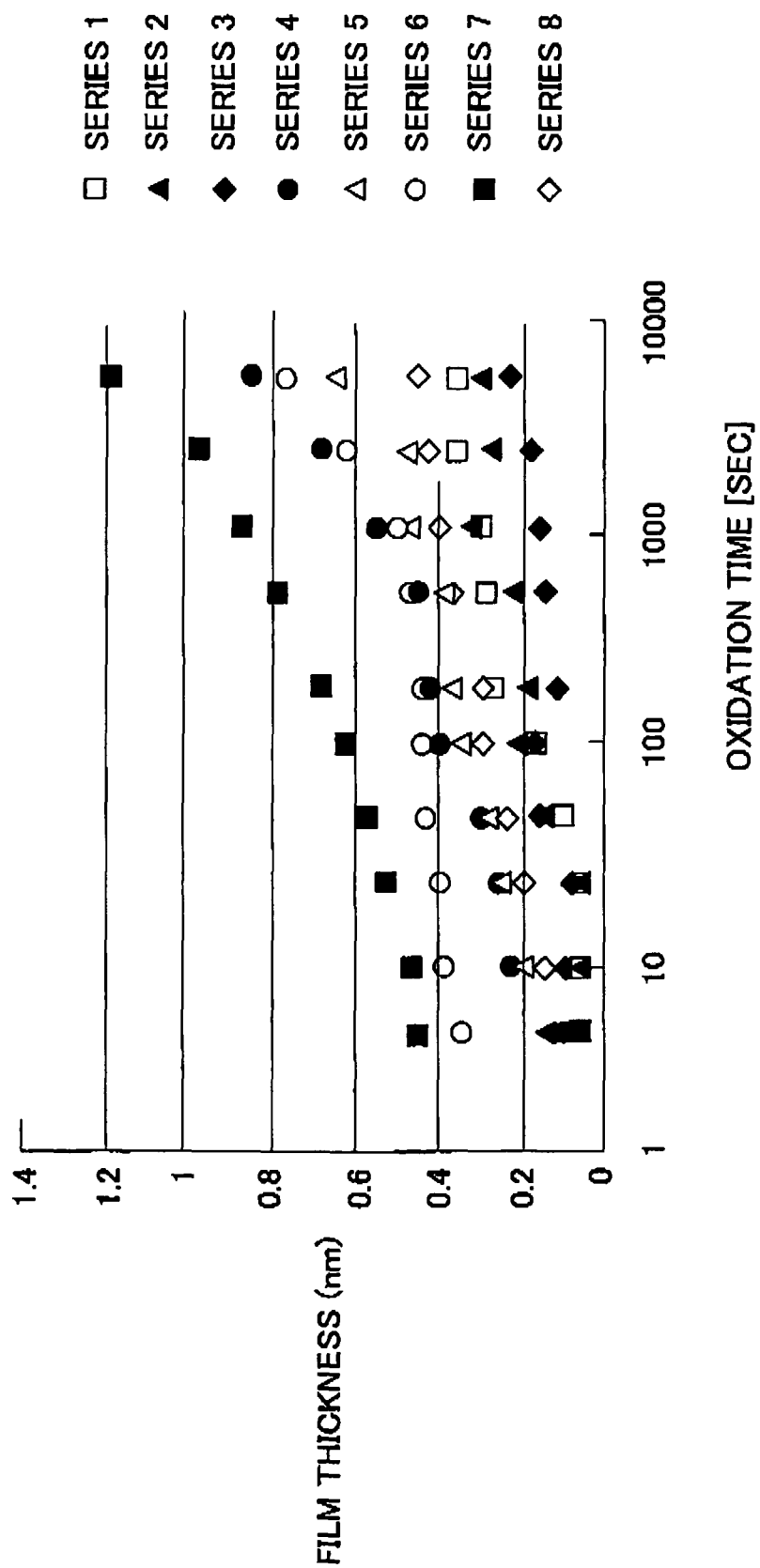
FIG. 48 is a diagram showing an oxidation process of a substrate conducted by using the substrate processing apparatus 20.

FIG. 48 shows the relationship between the film thickness and oxidation time for the case a silicon oxide film is formed on a surface of a silicon substrate in the process of FIGS. 47A and 47B by using the substrate processing apparatus 20 of FIG. 2 by setting the substrate temperature at 450° C. and changing the ultraviolet radiation power and the oxygen gas flow rate or oxygen partial pressure variously. In the experiment of FIG. 48, it should be noted that any native oxide film on the silicon substrate surface is removed prior to the radical oxidation process. In some cases, the substrate surface is planarized by removing residual carbon from the substrate surface by using nitrogen radicals excited by ultraviolet radiation, followed by a high temperature annealing process conducted at about 950° C. in an Ar ambient. An excimer lamp having a wavelength of 172 nm is used for the ultraviolet source 86, 87.

Referring to FIG. 48, the data of Series 1 represents the relationship between the oxidation time and oxide film thickness for the case the ultraviolet radiation power is set to 5% of a reference power (50 mW/cm$^2$) at the window surface of the ultraviolet radiation source 24B and the process pressure is set to 665 mPa (5 mTorr) and further the oxygen gas flow rate is set to 30 SCCM. On the other hand, the data of Series 2 represents the relationship between the oxidation time and oxide film thickness for the case the ultraviolet radiation power is set to zero, the process pressure is set to 133 Pa (1 Torr) and the oxygen gas flow rate is set to 3 SLM. The data of Series 3 represents the relationship between the oxidation time and oxide film thickness for the case the ultraviolet radiation power is set to zero, the process pressure is set to 2.66 Pa (20 mTorr) and the oxygen gas flow rate is set to 150 SCCM, while the data of Series 4 represents the relationship between the oxidation time and oxide film thickness for the case the ultraviolet radiation power is set to 100% of the reference power, the process pressure is set to 2.66 Pa (20 mTorr) and further the oxygen gas flow rate is set to 150 SCCM. The data of Series 5 represents the relationship between the oxidation time and oxide film thickness for the case the ultraviolet radiation power is set to 20% of the reference power, the process pressure is set to 2.66 Pa (20 mTorr) and the oxygen gas flow rate is set to 150 SCCM, while the data of Series 6 represents the relationship between the oxidation time and oxide film thickness for the case the ultraviolet radiation power is set to 20% of the reference power, the process pressure is set to about 67 Pa (0.5 Torr) and further the oxygen gas flow rate is set to 0.5 SLM. Further, the data of Series 7 represents the relationship between the oxidation time and oxide film thickness for the case the ultraviolet radiation power is set to 20% of the reference power, the process pressure is set to 665 Pa (5 Torr) and the oxygen gas flow rate is set to 2 SLM, while the data of Series B represents the relationship between the oxidation time and oxide film thickness for the case the ultraviolet radiation power is set to 5% of the reference power, the process pressure is set to 2.66 Pa (20 mTorr) and the oxygen gas flow rate is set to 150 SCCM.

In the experiment of FIG. 48, the thickness of the oxide film is obtained by an XPS analysis, in view of the fact that there is no standard process of obtaining the thickness of such an extremely thin oxide film having a film thickness less than 1 nm.

Figure 49:
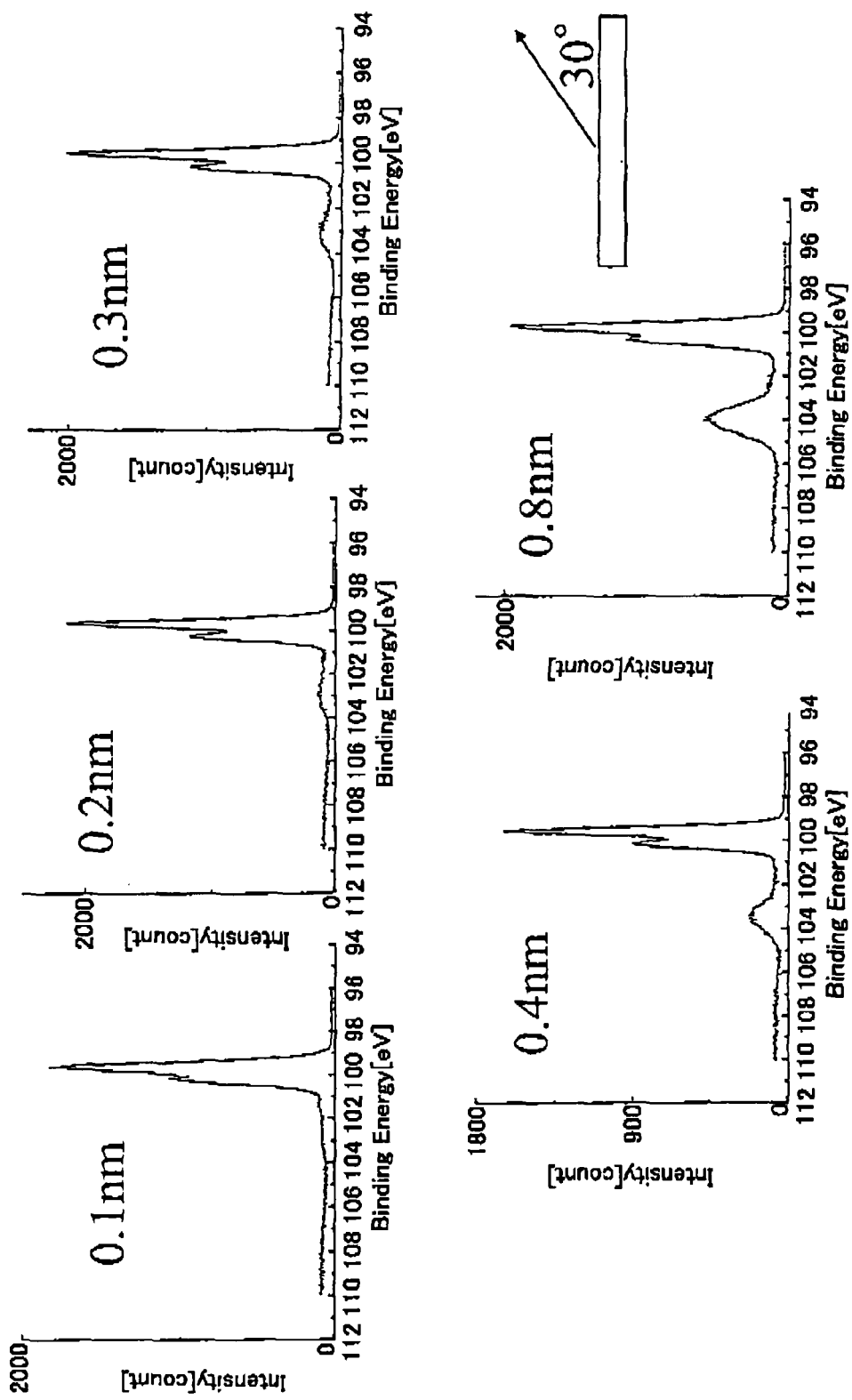
FIG. 49 is a diagram explaining the procedure of measuring the film thickness by an XPS analysis as used in the present invention.
Figure 50:
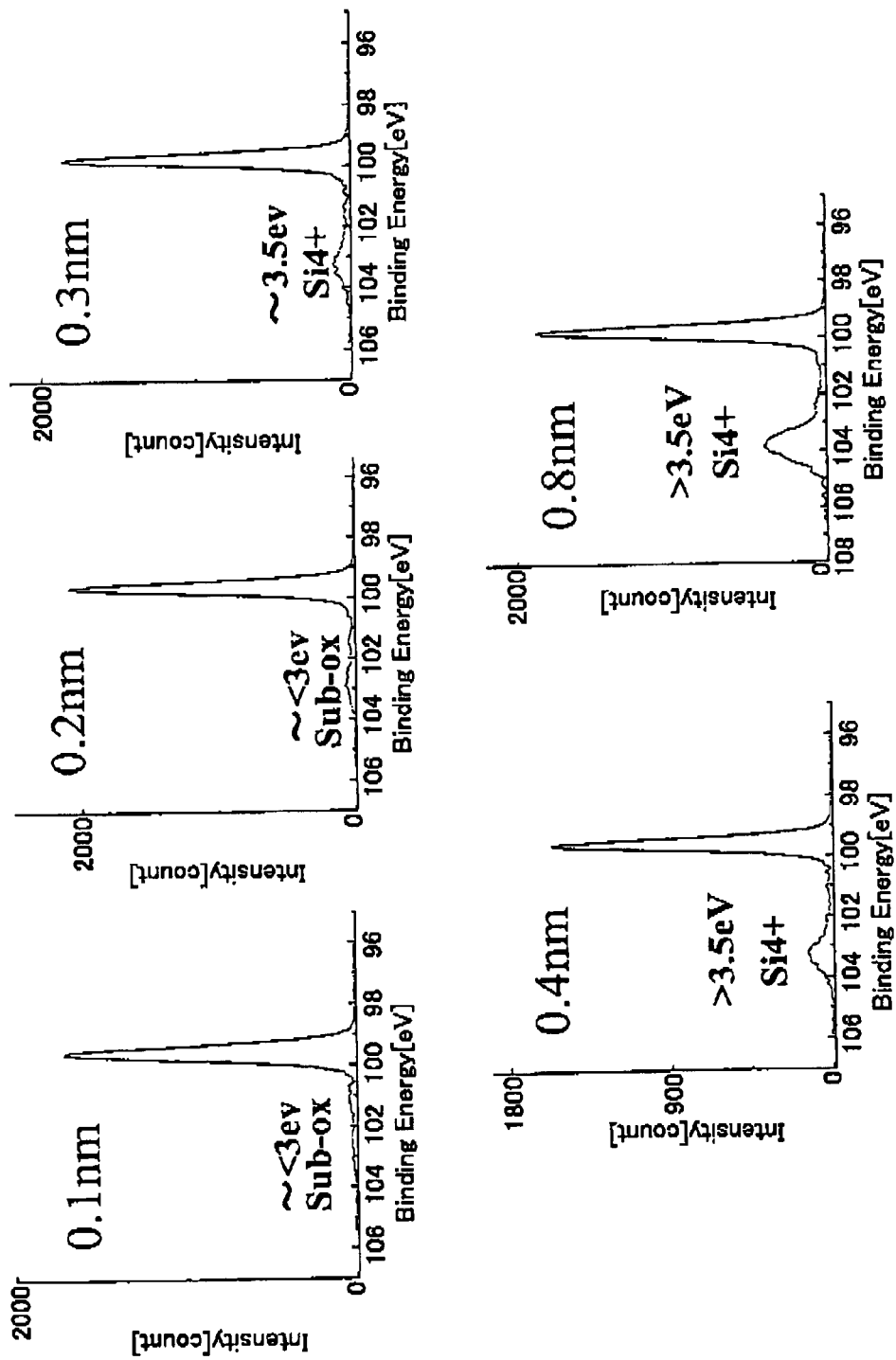
FIG. 50 is another diagram explaining the procedure of measuring the film thickness by an XPS analysis as used in the present invention.

In view of the situation noted above, the inventor of the present invention obtained a film thickness d of an oxide film by first obtaining a $Si_{2p}^{3/2}$ XPS spectrum shown in FIG. 50 by applying, to an observed XPS spectrum of $Si_{2p}$ orbital shown in FIG. 49, a background correction and separation correction for separating the ³⁄₂ spin state and the ½ spin state, and then obtaining the film thickness d from the $Si_{2p}^{3/2}$ XPS spectrum thus obtained by using Equation (1) and associated coefficients below according to the teaching of Lu et al (Z. H. Lu, et al., Appl, Phys. Lett. 71(1997), pp. 2764), $$d=\lambda \sin \alpha \cdot ln[I^{x+}/(\beta I^{0+})+1] \quad (1)$$

$\lambda=2.96$ $\beta=0.75$

Figure 55A:
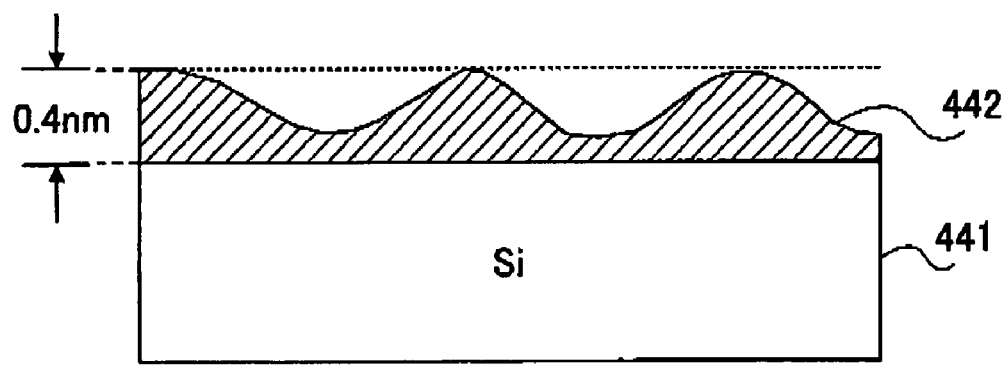
FIG. 55A is a diagram showing a first part of a process of oxide film formation taking place in the substrate processing apparatus 20.

In Eq. (1), it should be noted that α represents the detection angle of the XPS spectrum of FIG. 55 and is set to 30° in the illustrated example. Further, $I^{x+}$ in Eq. (1) represents an integral spectrum intensity ($I^{1+}+I^{2+}+I^{3+}+I^{4+}$) of the oxide film and corresponds to the peak observed in the energy region of 102-104 eV of FIG. 50. On the other hand, $I^{0+}$ corresponds to the integral spectral peak intensity corresponding to the energy region around 100 eV, wherein this spectral peak is caused by the silicon substrate.

Figure 51:
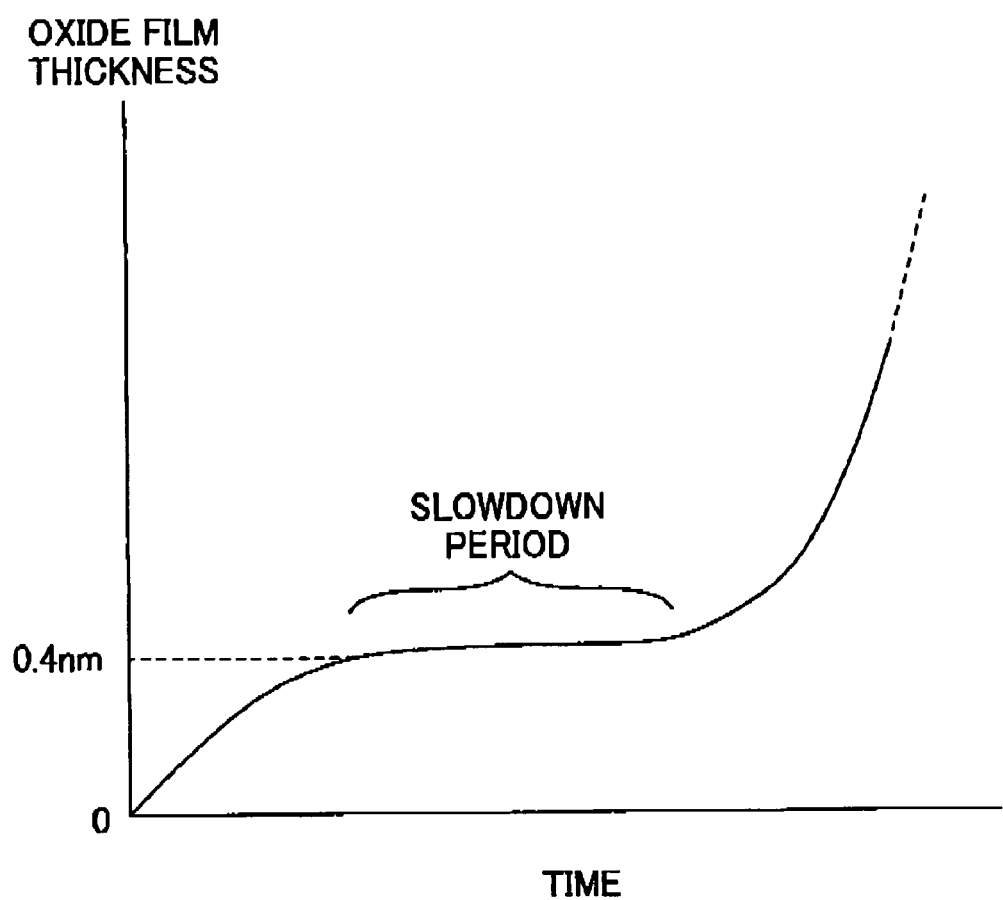
FIG. 51 is a diagram schematically showing the phenomenon of delay of oxide film growth observed when forming an oxide film by the substrate processing apparatus 20.

Referring to FIG. 48 again, it will be noted that the oxide film thickness increases gradually from the initial thickness of 0 nm with the oxidation time for the case the ultraviolet radiation power, and hence the oxygen radical density formed by the ultraviolet radiation, is set small (Series 1, 2, 3, and 8). In the case of Series 4, 5, 6 and 7, in which the ultraviolet radiation power is set to 20% or more of the reference power, on the other hand, it can be seen that there appears a slowdown of oxide film growth after the start of the growth and when the oxide film has reached a thickness of about 0.4 nm as represented in FIG. 51. The growth of the oxide film is restarted only after a certain time has elapsed in the slowdown state.

The relationship of FIG. 48 or 51 means that there is a possibility of forming an extremely thin oxide film of the thickness of about 0.4 nm stably in the oxidation process of a silicon substrate surface. Further, the fact that the slowdown state continues for some time as represented in FIG. 48 indicates that the oxide film thus formed has a uniform thickness. Thus, according to the present invention, it is possible to form an oxide film having a thickness of about 0.4 nm on a silicon substrate with uniform thickness.

Figure 52A:
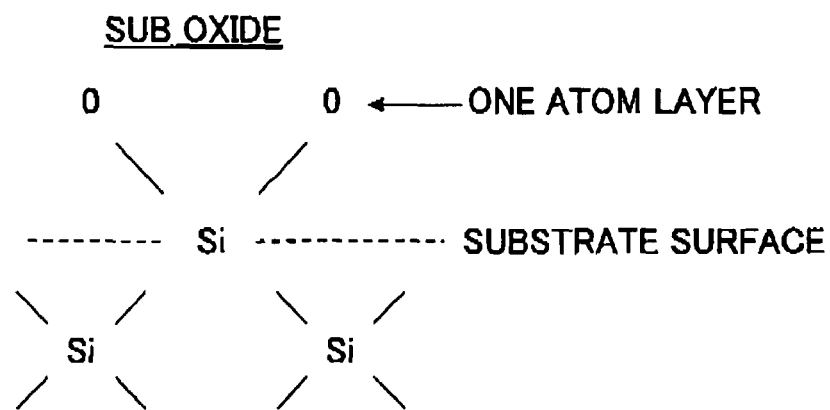
FIG. 52A is a diagram showing a first part of an oxide film formation process on a surface of a silicon substrate.
Figure 52B:
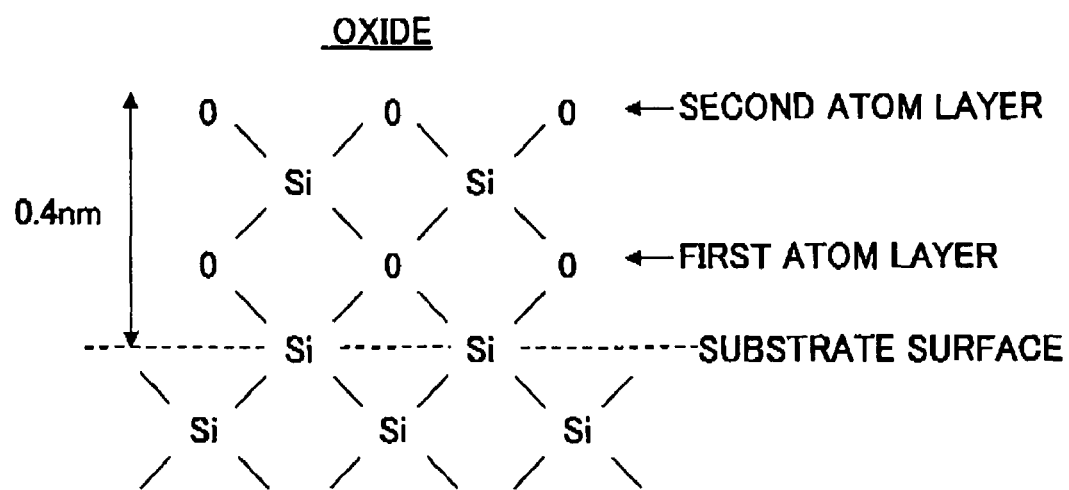
FIG. 52B is a diagram showing a second part of an oxide film formation process on a surface of a silicon substrate.

FIGS. 52A and 52B schematically depicts the manner of oxide film formation on such a silicon substrate. In these drawings, it should be noted that the structure formed on a (100) silicon substrate is very much simplified.

Referring to FIG. 52A, it can be seen that two oxygen atoms are bonded to a single silicon atom at the surface of the silicon substrate, and thus, there is formed a single oxygen atomic layer. In this representative state, each silicon atom on the substrate surface are coordinated by two silicon atoms inside the substrate and two oxygen atoms at the substrate surface, and there is formed a sub-oxide.

In the state of FIG. 52B, on the other hand, each silicon atom at the uppermost part of the silicon substrate is coordinated with four oxygen atoms and takes the stable state of $Si^{4+}$. It is is believed that this is the reason the oxidation proceeds fast in the state of FIG. 52A and slows down when the state of FIG. 52B has appeared. The thickness of the oxide film for the state of FIG. 52B is about 0.4 nm, while this value is in good agreement with the oxide film thickness observed for the slowdown state in FIG. 48.

In the XPS spectrum of FIG. 50, it should be noted that the weak peak observed in the energy range of 101-104 eV for the case the oxide film thickness is 0.1 or 0.2 nm corresponds to the sub-oxide of FIG. 52A. On the other hand, the peak appearing in this energy range for the case the oxide thickness has exceeded 0.3 nm is thought as being caused by Si4+ and indicating the formation of an oxide film exceeding the thickness of 1 atomic layer.

Such a slowdown of oxide film growth at the thickness of 0.4 nm is thought as not being limited to the UV—$O_2$ radical oxidation process explained with reference to FIGS. 47A and 47B. Rather, this phenomenon would be observed also in any oxide film formation process as long as it is capable of forming extremely thin oxide films with high precision.

By continuing the oxidation process further from the state of FIG. 52B, the thickness of the oxide film starts to increase again.

Figure 53:
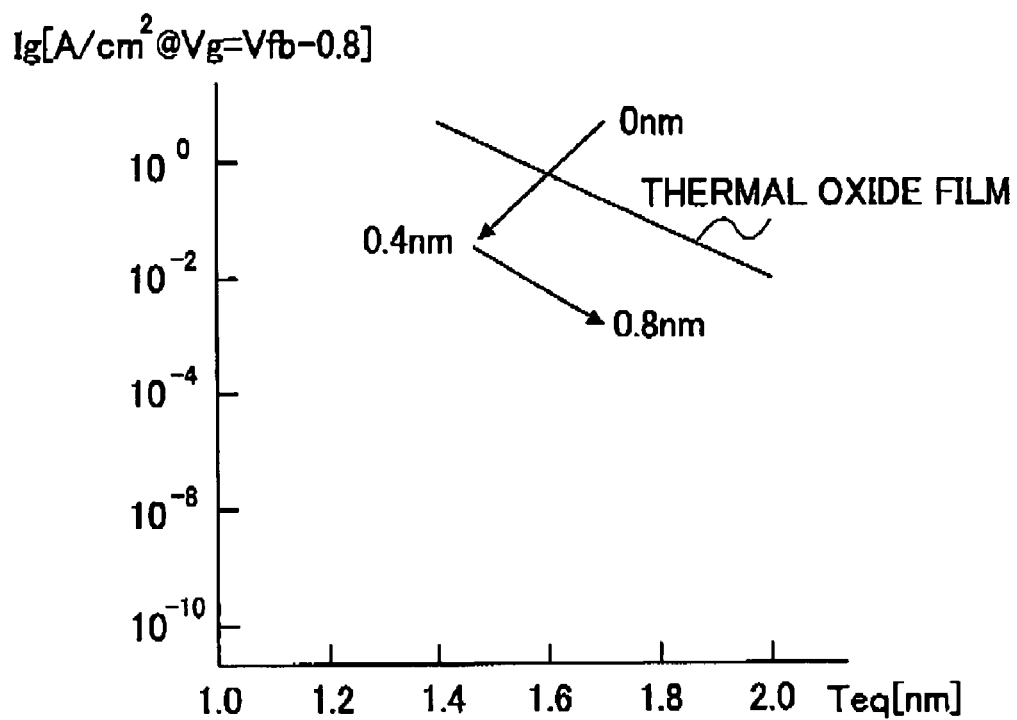
FIG. 53 is a diagram showing the leakage current characteristics of an oxide film obtained in the first embodiment of the present invention.

FIG. 53 shows the relationship between a thermal-oxide equivalent thickness Teq and leakage current Ig for a laminated structure in which a ZrSiOx film having a thickness of 0.4 nm and an electrode film are formed on an oxide film formed by the UV—$O_2$ oxidation process of FIGS. 47A and 47B (reference should be made to FIG. 34B to be explained later) by using the substrate processing apparatus 20. It should be noted that the leakage current characteristics of FIG. 53 are measured in the state a voltage of Vfb-0.8V is applied across the electrode film and the silicon substrate, wherein Vfb is a flat-band voltage used for the reference. For the sake of comparison, FIG. 33 also shows the leakage current characteristics of a thermal oxide film. Further, the illustrated equivalent thickness is for the structure including both the oxide film and the ZrSiOx film.

Referring to FIG. 53, it can be seen that the leakage current density exceeds the leakage current density of the thermal oxide film in the case the oxide film is omitted and hence the film thickness of the oxide film is 0 nm. Further, it can be seen that the thermal-oxide film equivalent thickness Teq also takes a large value of about 1.7 nm.

Figure 54A:
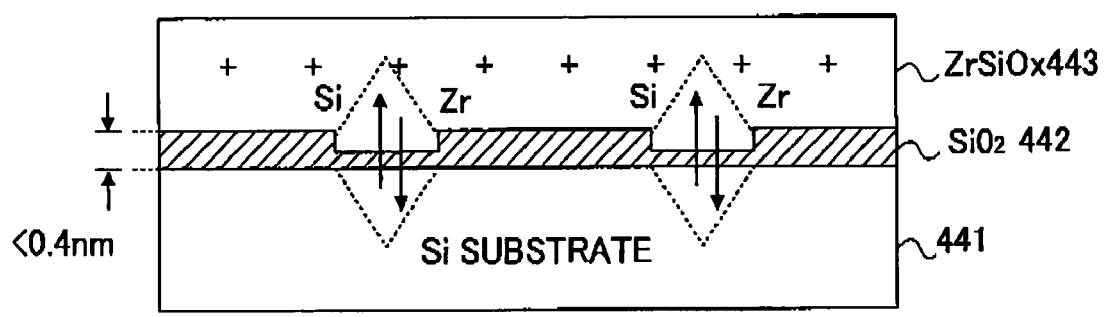
FIG. 54A is a diagram explaining the cause of the leakage current characteristics of FIG. 53.
Figure 54B:
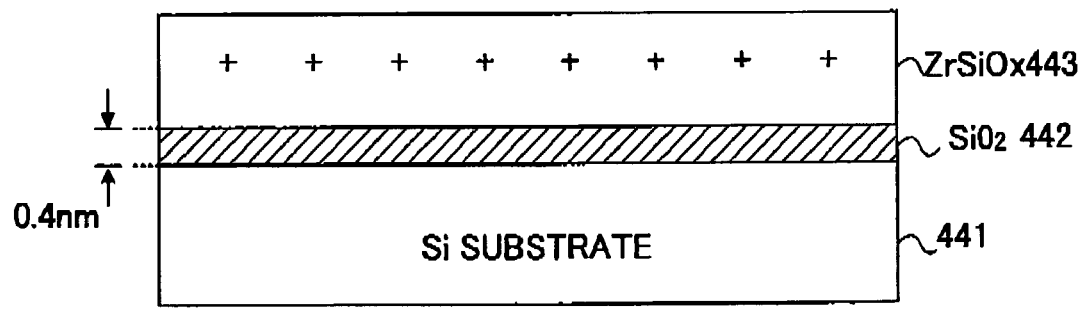
FIG. 54B is a diagram explaining the cause of the leakage current characteristics of FIG. 53.

Contrary to this, it can be seen that the thermal-oxide equivalent thickness Teq starts to decrease when the thickness of the oxide film is increased from 0 nm to 0.4 nm. In such a state, the oxide film is interposed between the silicon substrate and the ZrSiOx film, and thus, there should be caused an increase of physical thickness. The observed decrease of the equivalent thickness Teq is therefore contrary to this increase of physical thickness. This observation suggests the situation that, in the case the ZrSiOx film is formed directly on the silicon substrate, there occurs extensive diffusion of Zr into the silicon substrate or Si into the ZrSiOx film as represented in FIG. 54A, leading to formation of a thick interface layer between the silicon substrate and the ZrSiOx film. By interposing the oxide film of 0.4 nm thickness as represented in FIG. 54B, it is believed that the formation of such an interface layer is effectively suppressed and the decrease of the equivalent film thickness is achieved as a result. With this, the leakage current is reduced with increasing thickness of the oxide film. It should be noted that FIGS. 54A and 54B shows a schematic cross-section of the specimen thus formed and shows the structure in which an oxide film 442 is formed on a silicon substrate 441 and a ZrSiOx film 443 is formed on the oxide film 442.

When the thickness of the oxide film has exceeded 0.4 nm, on the other hand, the value of the thermal-oxide equivalent thickness starts to increase again. In this region in which the thickness of the oxide film has exceeded 0.4 nm, it can be seen that the value of the leakage current is decreased with increase of the thickness, suggesting that the increase of the equivalent thickness is caused as a result of increase of the physical thickness of the oxide film.

Thus, it can be seen that the oxide film thickness of about 0.4 nm, in which there is caused slowdown of oxide film growth as observed in FIG. 48, corresponds to the minimum of the equivalent thickness of the system formed of the oxide film and high-K dielectric film, and that the diffusion of metal element such as Zr into the silicon substrate is effectively blocked by the stable oxide film shown in FIG. 54B. Further, it can be seen that the effect of blocking the metal element diffusion is not enhanced significantly even when the thickness of the oxide film is increased further.

It should be noted that the value of the leakage current for the case of using the oxide film of the foregoing 0.4 nm thickness is smaller than the leakage current of a thermal oxide film having a corresponding thickness by the order of two. Thus, by using an insulation film having such a structure for the gate insulation film of a MOS transistor, it becomes possible to minimize the gate leakage current.

Figure 55B:
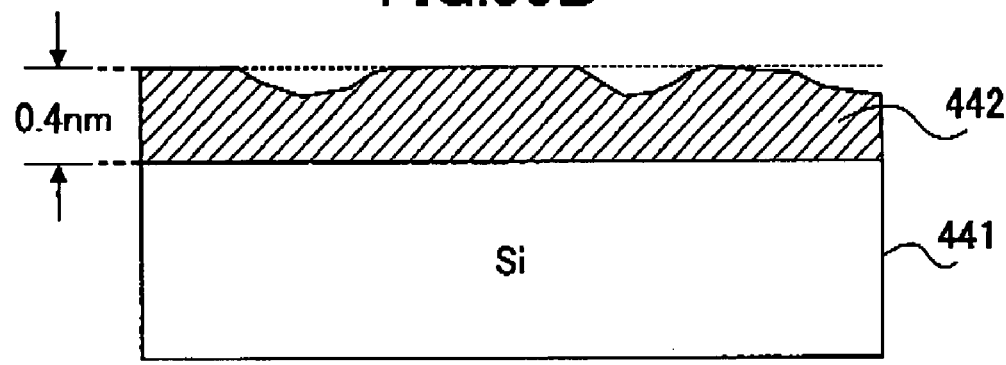
FIG. 55B is a diagram showing a second part of a process of oxide film formation taking place in the substrate processing apparatus 20.
Figure 55C:
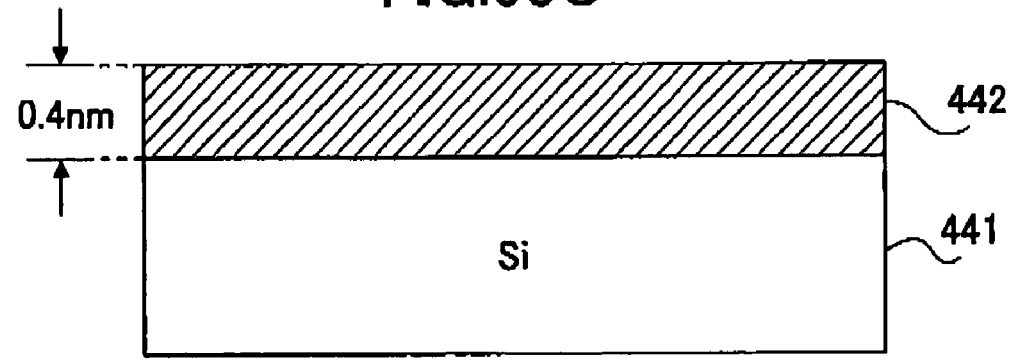
FIG. 55C is a diagram showing a third part of a process of oxide film formation taking place in the substrate processing apparatus 20.

As a result of slowdown of the oxide film growth at the thickness of 0.4 nm explained with reference to FIG. 48 or FIG. 51, there occurs a slowdown of film thickness at the time of oxide film growth at the thickness of about 0.4 nm as represented in FIG. 55B even in the case there exists a change of film thickness or undulation in the initial oxide film 442 formed on the silicon substrate 441. Thus, by continuing the oxide film growth during the slowdown period, it becomes possible to obtain an extremely flat oxide film 442 of uniform film thickness as represented in FIG. 55C.

As explained before, there is no standard measuring method of film thickness for such an extremely thin oxide film at the moment. Thus, a different value may be obtained for the film thickness of the oxide film 442 of FIG. 55C when a different measuring method is used. However, because of the reason explained before, it is determined that the slowdown of oxide film growth occurs at the thickness of two atomic layers. Thus, it is thought that the preferable thickness of the oxide film 442 is about two atomic layers. It should be noted that this preferable thickness includes also the case in which the oxide film 442 includes a region of 3 atomic layers in a part thereof such that the thickness of two atomic layers is maintained for the entirety of the oxide film 442. Thus, it is concluded that the preferable thickness of the oxide film 442 is in the range of 2-3 atomic layers.

Remote Plasma Radical Nitridation (RF—$N_2$) Processing

Figure 56:
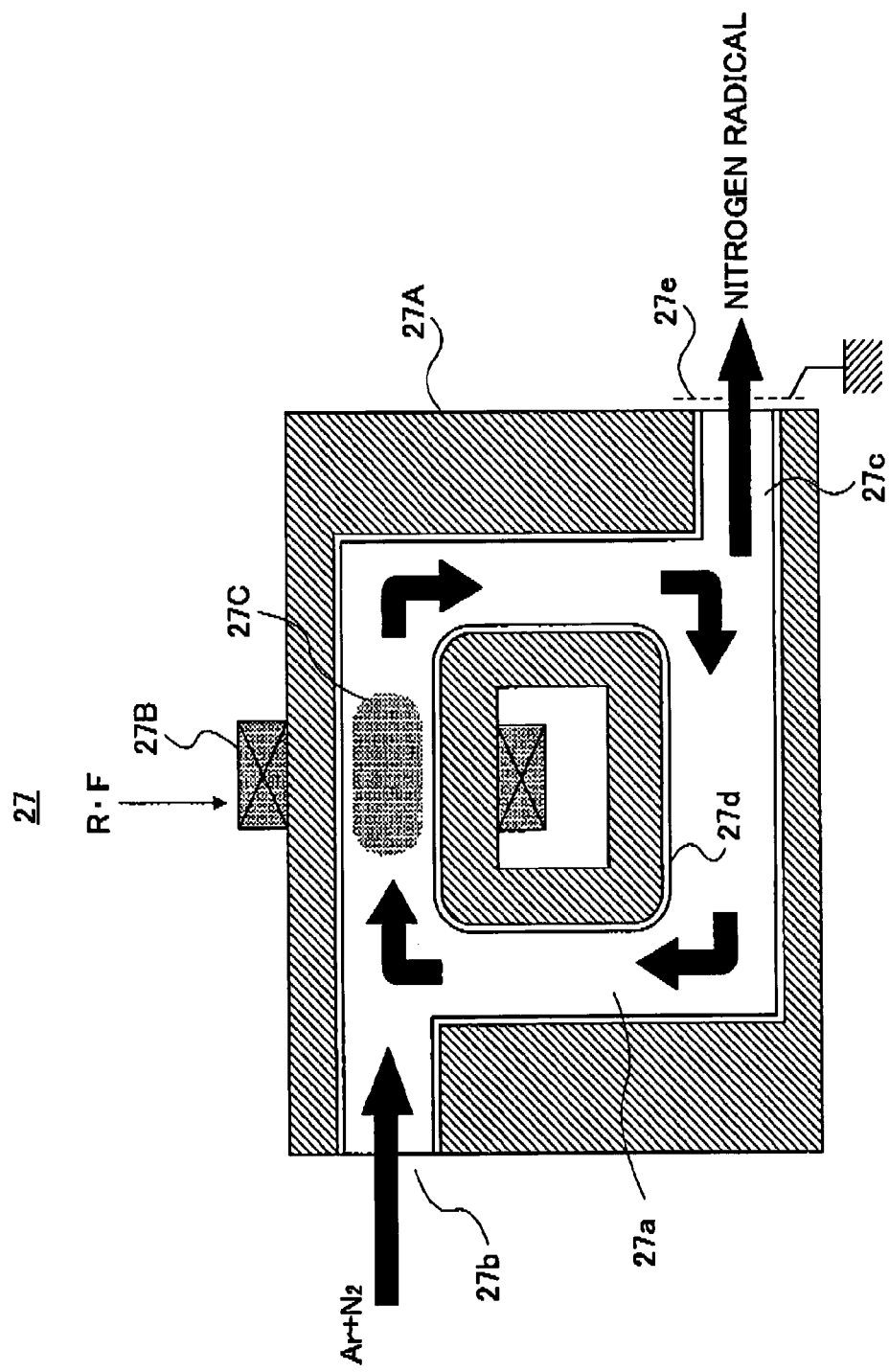
FIG. 56 is a diagram showing the construction of a remote plasma source used in the substrate processing apparatus 20.

FIG. 56 shows the construction of a remote plasma part 27 used in the substrate processing apparatus 20.

Referring to FIG. 56, the remote plasma part 27 includes a block 27A typically formed of aluminum in which a gas circulating passage 27a is formed together with a gas inlet 27b and a gas outlet 76c communicating therewith. Further, there is formed a ferrite core 27B on a part of the block 27A.

Further, there is provided a fluorocarbon resin coating 27d on the inner surfaces of the gas circulating passage 27a, gas inlet 27b and the gas outlet 27c, and plasma 27C is formed in the gas circulating passage 27a by supplying a high-frequency (RF) power 400 kHz perpendicular to the coil wound around the ferrite core 27B.

With the excitation of the plasma 27C, nitrogen radicals and also nitrogen ions are formed in the gas circulating passage 27a, wherein the nitrogen ions thus formed have a strong tendency of proceeding straight and are annihilated as they are circulated along the circulating passage 27a and the gas outlet 27c ejects nitrogen radicals N2* primarily. In the construction of FIG. 56, charged particles such as nitrogen ions are eliminated in the construction of FIG. 56 by providing an ion filter 27e at the gas outlet 27c in the state that the ion filter 27e is connected to the ground. Thereby, only the nitrogen radicals are supplied to the processing space 84. Even in the case the ion filter 27e is not grounded, the ion filter 27e functions as a diffusion plate and it becomes possible to eliminate charged particles such as nitrogen ions sufficiently. In the case of conducting a process that requires a large amount of $N_2$ radicals, it is possible to eliminate the ion filter 27e so as to prevent annihilation of the $N_2$ radicals caused by collision at the ion filter 27e.

Figure 57:
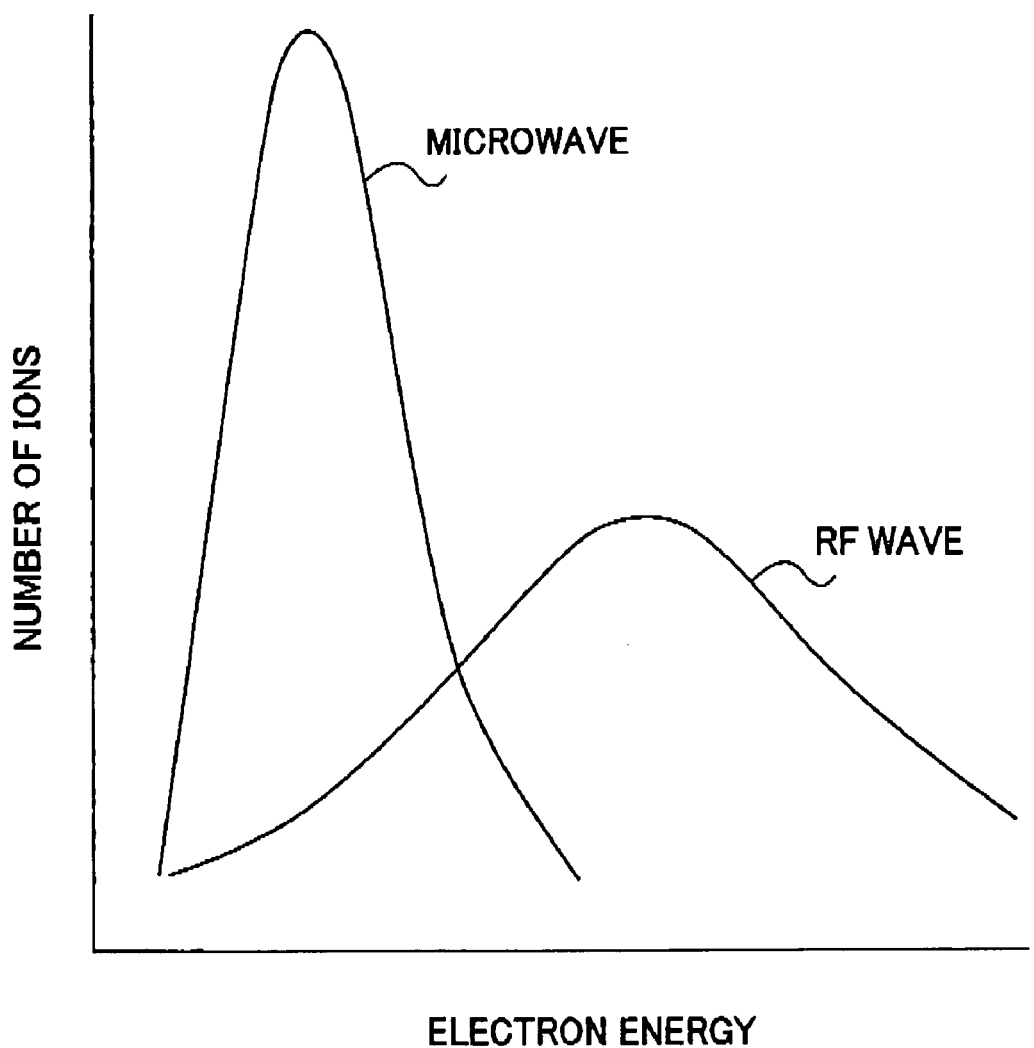
FIG. 57 is a is a diagram comparing the characteristics of RF remote plasma and microwave plasma.
Figure 58:
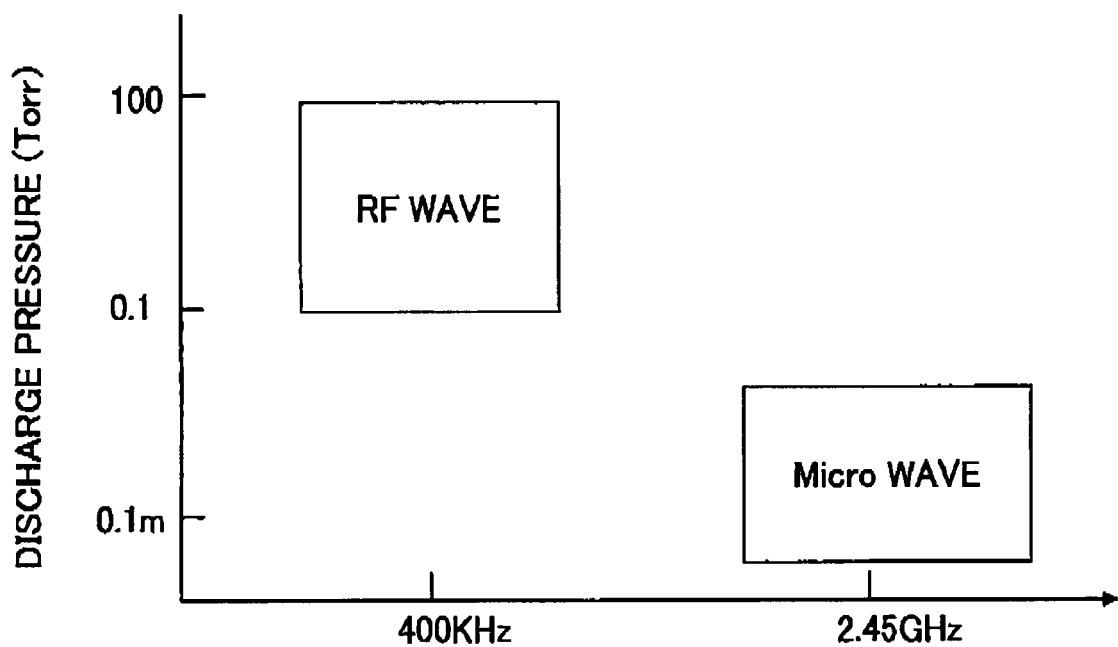
FIG. 58 is another diagram comparing the characteristics of RF remote plasma and microwave plasma.

FIG. 57 shows the relationship between the number of ions and the electron energy formed by the remote plasma part 27 in comparison with the case of using a microwave plasma source.

Referring to FIG. 57, ionization of nitrogen molecules is facilitated in the case the plasma is excited by a microwave power, and as a result, there are formed a very large amount of nitrogen ions. In the case the plasma is excited by a high-frequency (RF) power of 500 kHz or less, on the other hand, the number of the nitrogen ions formed by the plasma is reduced significantly. In the case the plasma processing is conducted by using a microwave, a high vacuum environment of $1.33 \times 10^{-3}$-$1.33 \times 10^{-6}$ Pa ($10^{-1}$-$10^{-4}$ Torr) is needed, while in the case the plasma processing is conducted by using a high-frequency plasma, it is possible to conduct the process at a relatively high pressure of 13.3 Pa -1.33 kPa (0.1-10 Torr).

Table 1 below compares the ionization energy conversion efficiency, pressure range capable of causing electric discharge, plasma power consumption and process gas flow rate between the case of exciting plasma by a microwave and the case of exciting plasma by a high-frequency (RF) power.

TABLE 1

| | ionization energy conversion efficiency | pressure range causing electric discharge | plasma power consumption | process gas flow rate |
|---|---|---|---|---|
| microwave | $1.00 \times 10^{-2}$ | 0.1 m-0.1 Torr | 1-500 W | 0-100 SCCM |
| RF-wave | $1.00 \times 10^{-7}$ | 0.1-100 Torr | 1-10 kW | 0.1-10 SLM |

Referring to Table 1, it can be seen that the ionization energy conversion efficiency is reduced to about $1 \times 10^{-7}$ in the case of the RF-excited plasma as compared with respect to the value of about $1 \times 10^{-2}$ for the case of the microwave-excited plasma. Further, it can be seen that the pressure range causing the electric discharge is about 0.1-100 Torr (13.3 Pa-13.3 kPa) for the case of the RF-excited plasma, while in the case of the microwave-excited plasma, the pressure range is about 0.1 mTorr-0.1 Torr (13.3 Pa-13.3 kPa). Associated with this, the plasma power consumption is increased in the case of the RF-excited plasma as compared with the case of the microwave-excited plasma and that the process gas flow rate for the case of the RF-plasma processing becomes much larger than the process gas flow rate for the case of the microwave plasma.

In the substrate processing apparatus 20, it should be noted that the nitridation processing of the oxide film is conducted not by nitrogen ions but by the nitrogen radicals $N_2$*. Thus, it is preferable that the number of the excited nitrogen ions is suppresses as small as possible. This is also preferable in the viewpoint of minimizing damages caused in the substrate. In the substrate processing apparatus 20, the number of the excited nitrogen radicals is small and is highly suitable for nitriding the extremely thin base oxide film formed underneath the high-K dielectric gate insulation film with the thickness of only 2-3 atomic layers. Hereinafter, such a nitridation processing of oxide film conducted by the nitrogen radicals exited by the high-frequency plasma is called RF-$N_2$ processing.

Figure 59A:
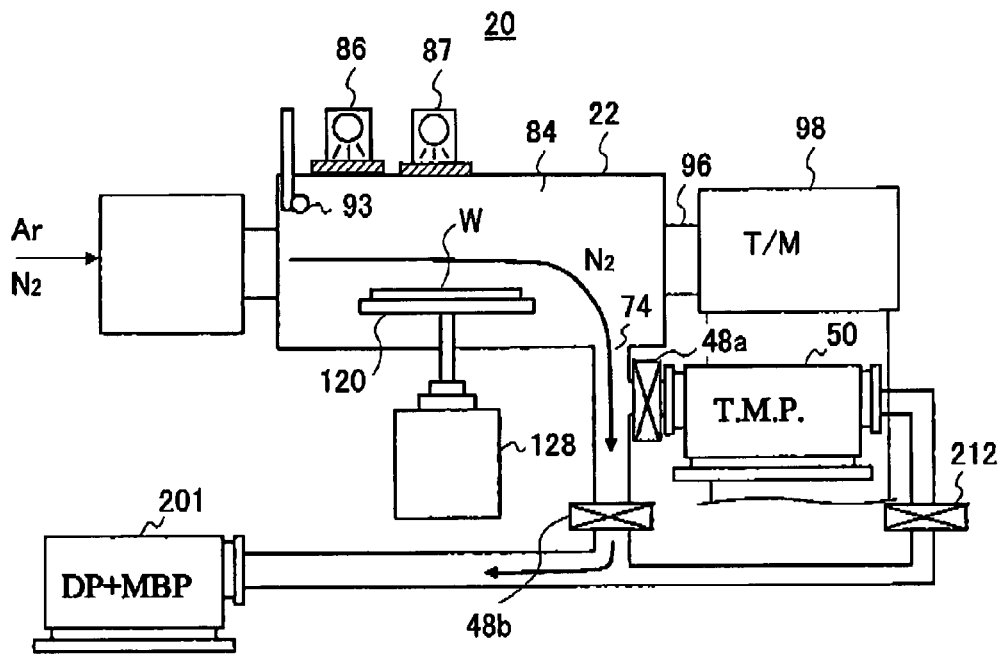
FIG. 59A is a diagram showing the nitridation process of an oxide film conducted by the substrate processing apparatus 20 in side view.
Figure 59B:
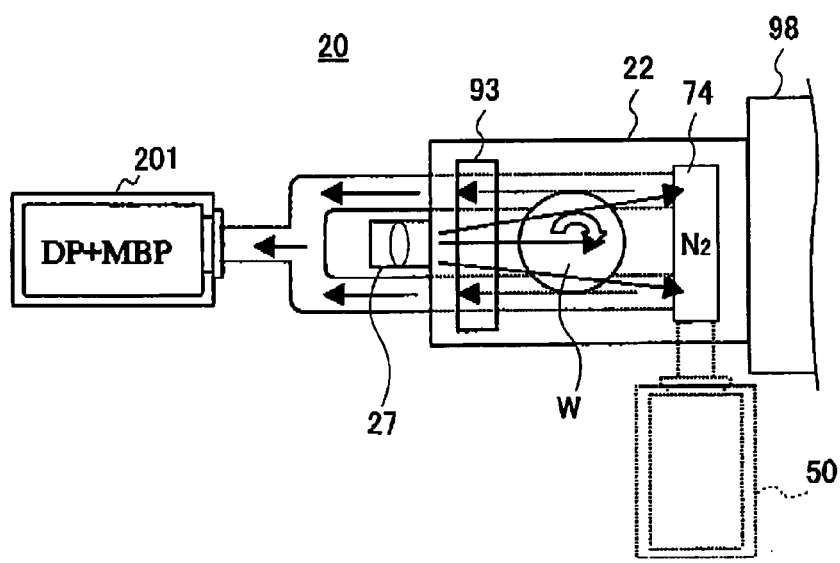
FIG. 59B is a diagram showing the nitridation process of an oxide film conducted by the substrate processing apparatus 20 in plan view.

FIGS. 59A and 59B show the radical nitridation (RF—$N_2$) processing conducted by the substrate processing apparatus 20 respectively in a side view and a plan view.

Referring to FIGS. 59A and 59B, the remote plasma part 27 is supplied with an Ar gas and a nitrogen gas and nitrogen radicals are formed as a result of excitation of plasma with the high frequency power of several hundred kilohertz frequency. The nitrogen radicals thus formed are caused to flow along the surface of the substrate w and are evacuated via the evacuation port 74 and the pump 201. As a result, the processing space 84 is held at a process pressure in the range of 1.33 Pa-1.33 kPa (0.01-10 Torr) suitable for the radical nitridation of the substrate W. The nitrogen radicals thus formed cause nitridation in the surface of the substrate W as they are caused to flow along the surface of the substrate W.

In the nitridation process of FIGS. 59A and 59B, it should be noted that there is conducted a purging process in advance to the nitridation process by opening the valves 48a and 212 and closing the valve 48a. Thereby, the pressure in the processing space 21B is reduced to the level of $1.33\times10^{-1}$-$1.33\times10^{-4}$ Pa, and any residual oxygen or water in the processing space is purged. In the nitridation processing that follows, on the other hand, the valves 48a and 212 are closed, and thus, the turbo molecular pump 50 is not included in the evacuation path of the processing space 84.

Thus, by using the substrate processing apparatus 20, it becomes possible to form an extremely thin oxide film on the surface of the substrate W and further nitriding the surface of the oxide film thus formed.

Figure 60A:
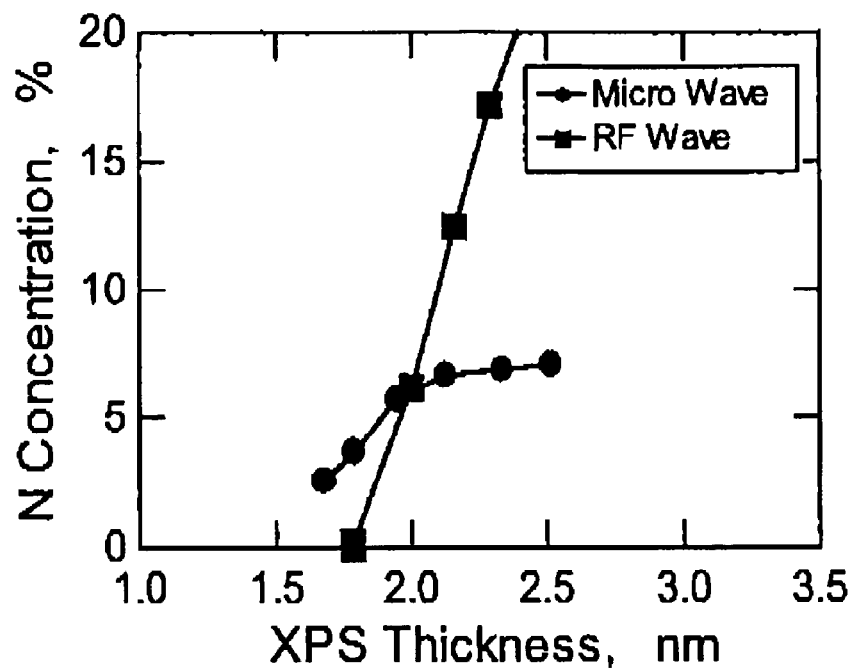
FIG. 60A is a diagram showing the nitrogen concentration in an oxide film that is formed at a thickness of 2.0 nm on a Si substrate through thermal annealing by the substrate processing apparatus 20 and nitrided by using the RF remote plasma unit 27 under the conditions set forth in Table 2.
Figure 60B:
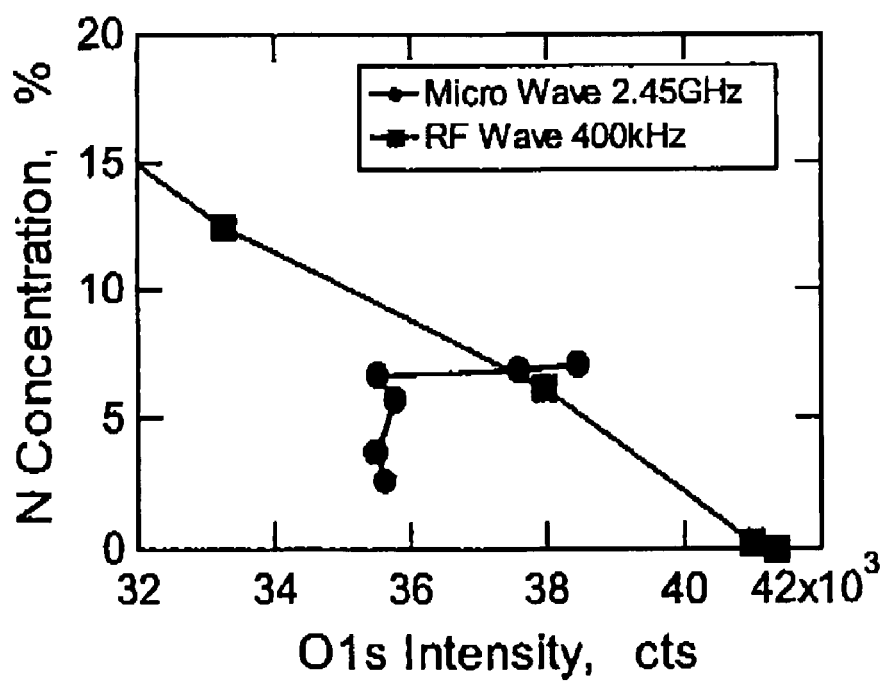
FIG. 60B is a diagram showing the relationship between nitrogen concentration and oxygen concentration within the oxide film.

FIG. 60A shows the nitrogen concentration profile in an oxide film for the case the oxide film formed on a silicon substrate by a thermal oxidation process with a thickness of 2.0 nm is subjected to an RF—$N_2$ processing in the substrate processing apparatus 20 by using the RF remote plasma part 27 under the condition represented in Table 2. Further, FIG. 60B shows the relationship between the nitrogen concentration profile and the oxygen concentration profile in the same oxide film.

TABLE 2

|  | nitrogen flow rate | Ar flow rate | plasma power | pressure | temperature |
| --- | --- | --- | --- | --- | --- |
| microwave | 15 SCCM | — | 120 W | 8.6 mTorr | 500° C. |
| RF wave | 50 SCCM | 2 SLM | 2 kW | 1 Torr | 700° C. |

Referring to Table 2, the RF—$N_2$ processing is conducted in the substrate processing apparatus 20 under the pressure of 1 Torr (133 Pa) while supplying nitrogen with a flow rate of 50 SCCM and Ar with a flow rate of 2 SLM, wherein it should be noted that the internal pressure of the processing space 84 is reduced once to the level of about $10^{-6}$ Torr ($1.33\times10^{-4}$ Pa) before the commencement of the nitridation process such that oxygen or water remaining in the processing space 84 is purged sufficiently. Because of this, any residual oxygen in the processing space 84 is diluted with Ar or nitrogen in the nitridation process (RF—$N_2$ process), which is conducted at the pressure of about 1 Torr. Thereby, the concentration of residual oxygen, and hence the thermodynamic activity of the residual oxygen, is very small at the time of the foregoing nitridation processing.

In the case of the nitridation processing conducted by the microwave plasma, on the other hand, the process pressure at the time of the nitridation process is generally the same as the purging pressure, and thus, residual oxygen maintains a large thermodynamic activity in the plasma ambient.

Referring to FIG. 60A, it can be seen that the concentration of nitrogen incorporated into the oxide film is limited in the case the nitridation processing is conducted by the microwave plasma and that no substantial nitridation takes place in the oxide film. In the case of the nitridation processing that uses the RF-excited plasma as in the case of the present embodiment, it can be seen that the nitrogen concentration level changes linearly with depth in the oxide film and that a concentration level of near 20% is achieved at the surface part of the oxide film.

FIG. 61 shows the principle of the measurement of FIG. 60A conducted by the XPS (X-ray photo spectrometry) analysis.

Referring to FIG. 61, an X-ray is radiated to the specimen in which the oxide film 412 is formed on the silicon substrate 411 with a predetermined angle, and detectors DET1 and DET2 are used to detect the spectrum of the excited X-rays with various angles. Thereby, it should be noted that the detector DET1 set to a deep detection angle of 90 degrees detects the excited X-ray that has traveled through the oxide film 412 with minimum path length. Thus, the X-ray spectrum detected by the detector DET1 contains information about the deep part of the oxide film 412 with relatively large proportion. On the other hand, detector DET2 set to a shallow detection angle detects the X-ray traveled over a long distance in the oxide film 12. Thus, the detector DET2 mainly detects the information about surface part of the oxide film 412.

FIG. 60B shows the relationship between the nitrogen concentration and oxygen concentration in the oxide film. In FIG. 60B, it should be noted that the oxygen concentration is represented by the X-ray intensity corresponding to the O1s orbital.

Referring to FIG. 60B, it can be seen that there occurs decrease of oxygen concentration with increase of nitrogen concentration in the case the nitridation processing is conducted by the RF—$N_2$ processing that uses the RF-remote plasma, indicating that there occurs substitution of oxygen atoms with the nitrogen atoms in the oxide film. In the case the nitridation is conducted by the microwave plasma processing, on the other hand, no such substituting relationship is observed and no relationship of oxygen concentration decreasing with increasing nitrogen concentration is observed. In FIG. 60, it is also noted that there is an increase of oxygen concentration for the case in which nitrogen is incorporated with 5-6% by the microwave nitridation processing. This indicates that there occurs increase of thickness of the oxide film with nitridation. Such an increase of the oxygen concentration associated with the microwave nitridation processing is believed to be caused as a result of the high activity of oxygen or water remaining in the processing space, which in turn is caused as a result of use of high vacuum environment for the nitridation processing and absence of dilution of residual oxygen or water with Ar gas or nitrogen gas, unlike the case of the high-frequency remote radical nitridation processing.

Figure 62:
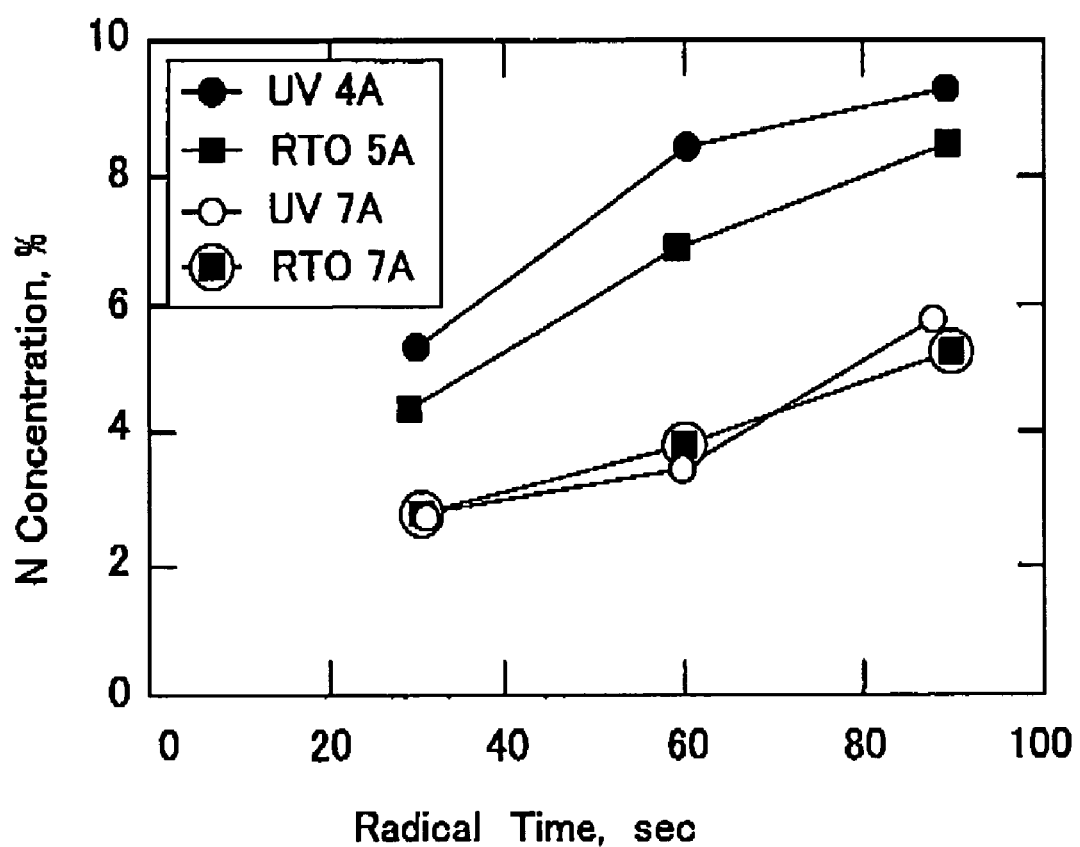
FIG. 62 is a diagram showing the relationship between the nitridation time and the nitrogen concentration in an oxide film in a case where the oxide film is nitrided by the remote plasma.
Figure 63:
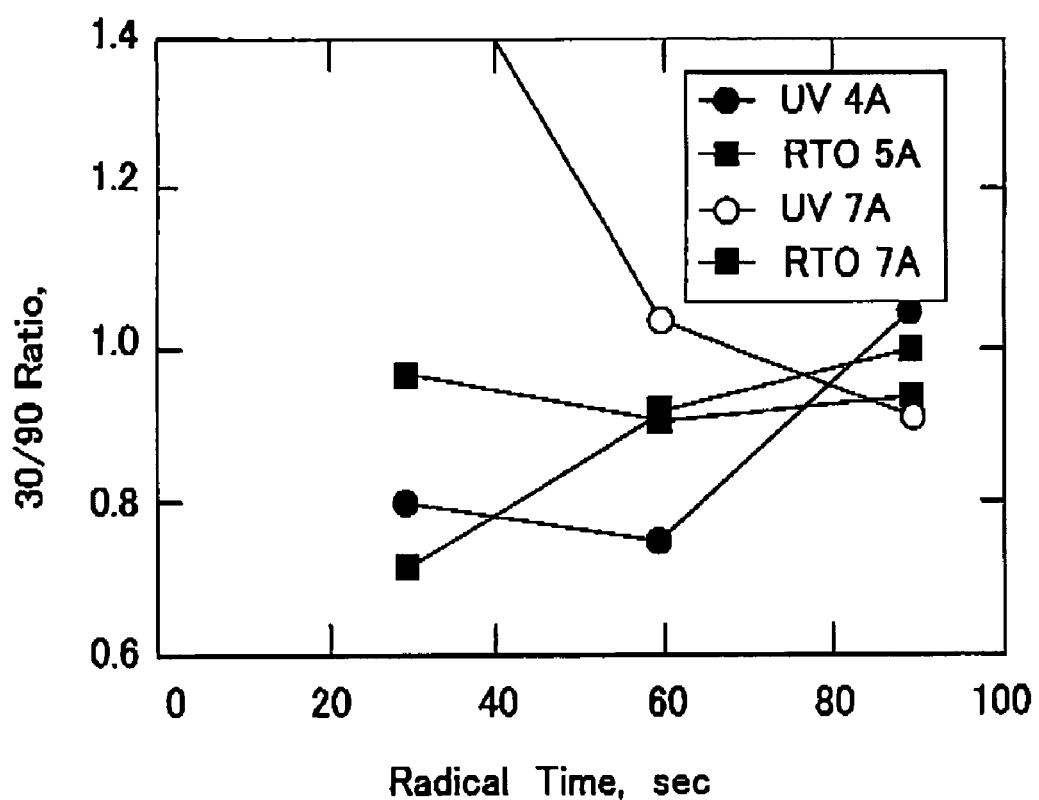
FIG. 63 is a diagram showing the relationship between the duration of nitridation and the distribution of nitrogen in an oxide film.

FIG. 62 shows the relationship between the nitridation time and the nitrogen concentration in the film for the case an oxide film is formed by the substrate processing apparatus 20 to the thickness of 4 Å (0.4 nm) and 7 Å (0.7 nm) and nitridation is conducted further to the oxide film by the RF—$N_2$ processing of FIGS. 59A and 59B while using the remote plasma part 27. Further, FIG. 63 shows the segregation of nitrogen to the surface of the oxide film caused as a result of the nitridation processing of FIG. 62. It should be noted that FIGS. 62 and 63 also show the case in which the oxide film is formed by a rapid thermal oxidation processing to the thickness of 5 Å (0.5 nm) and 7 Å (0.7 nm).

Referring to FIG. 62, it can be seen that the nitrogen concentration in the film increases with the nitridation time in any of the oxide films, while it is also noted that, because of the small oxide thickness such as 0.4 nm corresponding to the two atomic layer thickness for the case of the oxide film formed by the UV—$O_2$ oxidation processing, or for the case of the thermal oxide film having a thickness of 0.5 nm near the foregoing thickness of 0.4 nm, a higher nitrogen concentration is achieved as compared with oxide films formed at the same condition.

FIG. 63 shows the result of detection of nitrogen concentration for the case the detectors DET1 and DET2 of FIG. 62 are set to 30 degrees and 90 degrees respectively.

As can be seen from FIG. 63, the vertical axis represents the X-ray spectral intensity from the nitrogen atoms segregated to the film surface obtained with the detection angle of 30 degrees divided by the X-ray spectral intensity of the nitrogen atoms distributed throughout the entire film. The vertical axis of FIG. 63 is defined as nitrogen segregation ratio. In the case the value of the nitrogen segregation ratio is 1 or more, there is caused segregation of nitrogen to the film surface.

Figure 1:
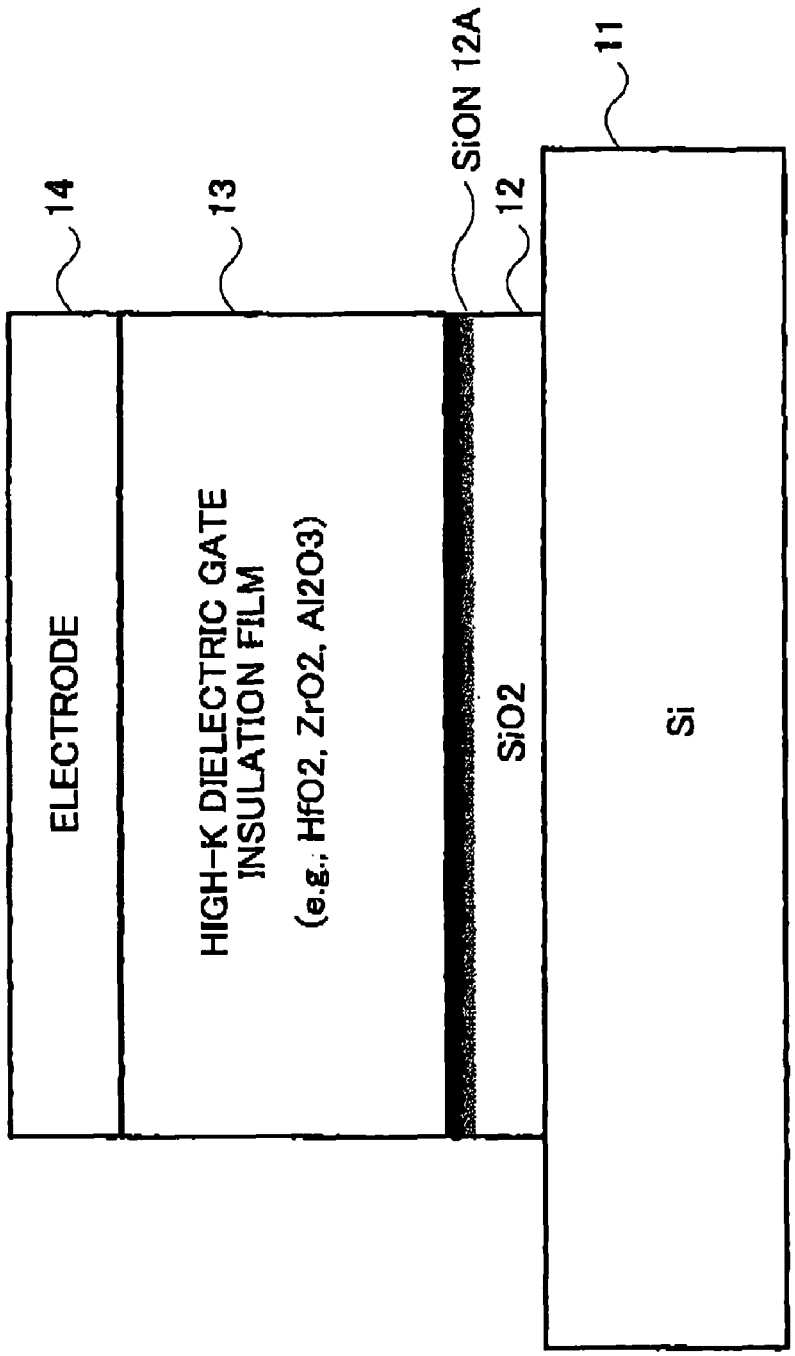
FIG. 1 is a diagram showing the construction of a semiconductor device having a high-K dielectric gate insulation film.

Referring to FIG. 63, it can be seen that the nitrogen segregation ratio becomes one or more in the case the oxide film is formed by the UV—$O_2$ processing to the thickness of 7 Å, and the nitrogen atoms are segregated at first to the film surface and a situation similar to the oxynitride film 12A of FIG. 1 is realized. After the RF—$N_2$ processing for 90 seconds, on the other hand, the nitrogen atoms are distributed generally uniformly in the film. In other films, too, it can be seen that the distribution of the nitrogen atoms in the film becomes generally uniform as a result of the RF—$N_2$ processing for 90 seconds.

Figure 64:
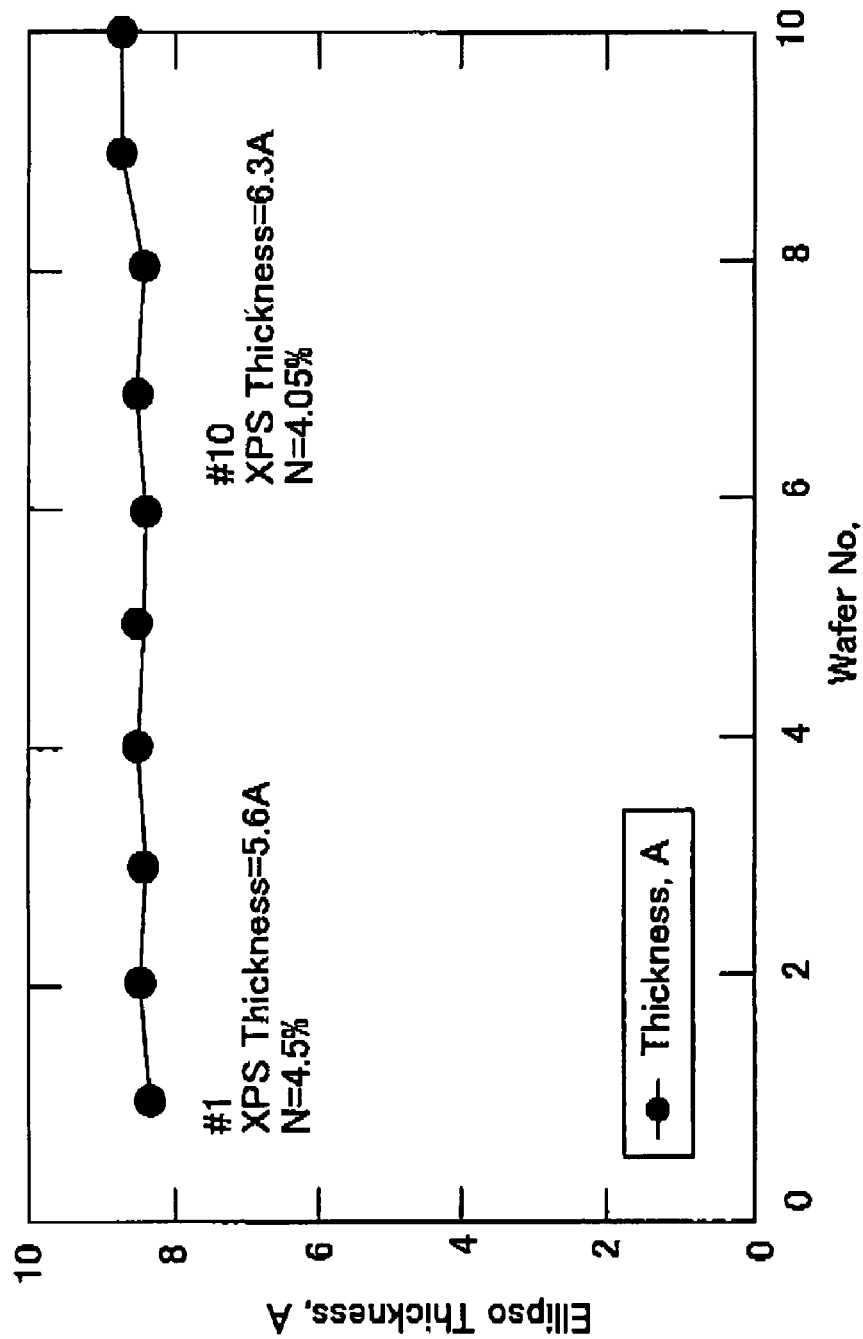
FIG. 64 is a diagram showing the wafer-by-wafer film thickness variation of an oxynitride film formed by a nitridation process of an oxide film.

In the experiment of FIG. 64, the UV—$O_2$ processing and the RF—$N_2$ processing are applied in the substrate processing apparatus 20 repeatedly with respect to ten wafers (wafer #1-wafer #10).

FIG. 64 shows the wafer-to-wafer variation of the film thickness of the oxynitride film thus obtained, wherein the result of FIG. 64 is obtained for the case in which the UV—$O_2$ processing is conducted in the substrate processing apparatus 20 by driving the ultraviolet source 86, 87 such that an oxide film is formed to have the thickness of 0.4 nm as measured by the xPS analysis and in which the RF—$N_2$ processing is conducted to the oxide film thus formed by driving the remote plasma part 27 such that the oxide film is converted to an oxynitride film containing nitrogen atoms with about 4%.

Referring to FIG. 64, the vertical axis represents the film thickness obtained for the oxynitride film thus obtained by ellipsometry, wherein it can be seen that the film thickness is uniform and has a value of about 8 Å (0.8 nm).

Figure 65:
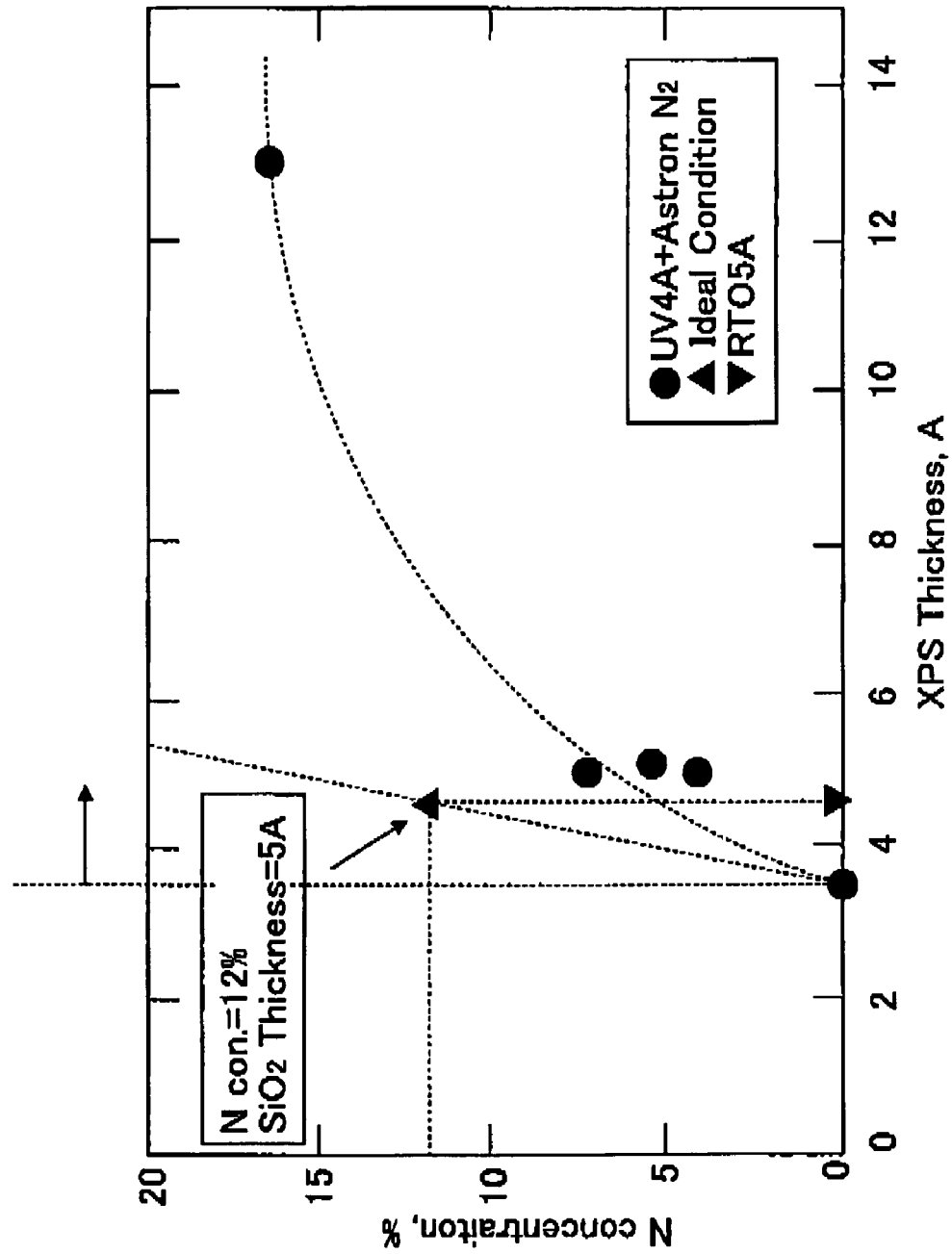
FIG. 65 is a diagram showing the increase of film thickness of an oxide film associated with the nitridation process according to an embodiment of the present invention.

FIG. 65 shows the result of examination with regard to the increase of film thickness for the case an oxide film is formed on a silicon substrate in the substrate processing apparatus 20 with the thickness of 0.4 nm by the UV—$O_2$ processing while using the ultraviolet source 86, 87 and further an RF—$N_2$ processing is applied to the oxide film thus formed while using the remote plasma part 27.

Referring to FIG. 65, it can be seen that the oxide film has increased the thickness thereof from the initial thickness (the thickness in the state before the RF—$N_2$ processing) of 0.38 nm to about 0.5 nm in the state nitrogen atoms are introduced by the RF—$N_2$ processing with the concentration of 4-7%. In the case the nitrogen atoms are introduced to the level of about 15% by the RF—$N_2$ processing, on the other hand, it can be seen that the film thickness increases to about 1.3 nm. In this case, it is believed that the nitrogen atoms thus introduced into the oxide film form a nitride film by causing penetration into the silicon substrate after passing through the oxide film.

In FIG. 65, the relationship between the nitrogen concentration and film thickness is represented also for an ideal model structure in which only one layer of nitrogen atoms are introduced into the oxide film of 0.4 nm thickness by ▲.

Referring to FIG. 65, it can be seen that the film thickness after introduction of the nitrogen atoms becomes about 0.5 nm in this ideal model structure. Thereby, the increase of the film thickness for this model case becomes about 0.1 nm, and the nitrogen concentration becomes about 12%. Using this model as a reference, it is concluded that the increase of film thickness is preferably suppressed to the value of 0.1-0.2 nm close to the foregoing value in the case the substrate processing apparatus 20 of FIG. 3 is used for the nitridation of the oxide film. In this state, it is evaluated that the maximum amount of the nitrogen atoms incorporated in to the film would be about 12% in the maximum.

In the explanation above, the substrate processing apparatus 20 was explained with regard to the formation of very thin base oxide film. However, the present invention is not limited to such a specific embodiment and the present invention can be applied to the process of forming a high-quality oxide film, nitride film or oxynitride film on a silicon substrate or a silicon layer with a desired thickness.

Further, the present invention is not limited to the embodiments explained heretofore, but various variations and modifications may be made without departing from the scope of the invention.

The invention claimed is:

1. A semiconductor substrate processing apparatus comprising:
   a processing vessel that defines a processing space therein;
   a transparent case made of quartz and disposed in the processing vessel, the transparent case including a cylinder portion and a top plate covering a top part of the cylinder portion;
   a heating element, contained inside the transparent case, to generate heat inside the transparent case for heating a substrate introduced into the processing space to a predetermined temperature;
   a heater plate mounted on an upper external surface of the top plate of the transparent case, to transmit the heat generated inside the transparent case to the substrate;
   a substrate holding member having an axis penetrating the top plate of the transparent case and the heater plate and projecting from an upper surface of the heater plate, the axis having a plurality of arm portions to hold the substrate at a position spaced from and opposite to the upper surface of the heater plate located below the substrate; and
   a rotational drive part configured to rotatively drive the axis of the substrate holding member.

2. The substrate processing apparatus as claimed in claim 1, further comprising:
   a depressurizing part for depressurizing an internal space of the processing vessel and an internal space of the transparent case at a same time.

3. The substrate processing apparatus as claimed in claim 1, further comprising:
a heat reflecting member provided below the heating element for upwardly reflecting heat from the heating element.

4. The substrate processing apparatus as claimed in claim 3, wherein the heat reflecting member is formed of an opaque quartz.

5. The substrate processing apparatus as claimed in claim 3, wherein the heat reflecting member is clamped below the heating element in an opposing state.

6. The substrate processing apparatus as claimed in claim 1, further comprising:
a gas injection part for injecting a gas from one side of the processing vessel to the substrate held by the holding member; and
an evacuation port provided at another side of the processing vessel for evacuating the gas passed through the substrate.

7. The substrate processing apparatus as claimed in claim 1, further comprising:
an ultraviolet source for irradiating ultraviolet rays to the processing space.

8. The substrate processing apparatus as claimed in claim 7, wherein the ultraviolet source is arranged to irradiate ultraviolet rays to an area half of the processing space.

9. The substrate processing apparatus as claimed in claim 1, wherein the transparent case includes a support bridge portion extending across the inside of the cylinder portion.

10. The substrate processing apparatus as claimed in claim 1, wherein the holding member includes:
a plurality of arm portions configured to support the substrate, and
an axis having one end supporting the plural arm portions and another end inserted into the transparent case.

11. The substrate processing apparatus as claimed in claim 10, wherein the axis of the holding member is formed of an opaque quartz.

12. The substrate processing apparatus as claimed in claim 1, wherein the holding member includes a plurality of arm portions configured to support the substrate and an axis configured to support the plural arm portions, wherein the plural arm portions are formed of a transparent quartz and extend horizontally in radial directions from an upper end of the axis.

13. The substrate processing apparatus as claimed in claim 12, wherein the axis of the holding member is formed of an opaque quartz.

14. The substrate apparatus as claimed in claim 1, wherein the heater plate is separated from the top plate by a plurality of bosses.

* * * * *